US012581795B2

(12) United States Patent
Zhang et al.

(10) Patent No.: US 12,581,795 B2
(45) Date of Patent: Mar. 17, 2026

(54) DISPLAY DEVICE AND METHOD FOR MANUFACTURING SAME

(71) Applicant: SHARP KABUSHIKI KAISHA, Sakai City (JP)

(72) Inventors: Bai Zhang, Sakai City (JP); Koji Yasukawa, Sakai City (JP)

(73) Assignee: SHARP KABUSHIKI KAISHA, Sakai City (JP)

(*) Notice: Subject to any disclaimer, the term of this patent is extended or adjusted under 35 U.S.C. 154(b) by 307 days.

(21) Appl. No.: 18/032,546

(22) PCT Filed: Oct. 21, 2020

(86) PCT No.: PCT/JP2020/039488
§ 371 (c)(1),
(2) Date: Apr. 18, 2023

(87) PCT Pub. No.: WO2022/085097
PCT Pub. Date: Apr. 28, 2022

(65) Prior Publication Data

US 2023/0389392 A1 Nov. 30, 2023

(51) Int. Cl.
*H10K 50/17* (2023.01)
*H10K 50/18* (2023.01)
(Continued)

(52) U.S. Cl.
CPC ........... *H10K 50/17* (2023.02); *H10K 50/171* (2023.02); *H10K 50/18* (2023.02); *H10K 50/181* (2023.02);
(Continued)

(58) Field of Classification Search
CPC ...... H10K 50/17; H10K 50/171; H10K 50/18; H10K 50/181; H10K 59/12;
(Continued)

(56) References Cited

U.S. PATENT DOCUMENTS

2014/0091285 A1 4/2014 Shin et al.
2015/0303243 A1 10/2015 Shin et al.
(Continued)

FOREIGN PATENT DOCUMENTS

CN 111081904 A 4/2020
CN 111384264 A 7/2020
(Continued)

OTHER PUBLICATIONS

Sung Huh et al., "UV/Ozone-Oxidized Large-Scale Graphene Platform with Large Chemical Enhancement in Surface-Enhanced Raman Scattering", vol. 5, No. 12, 9799-9806, 2011, Published online Nov. 9, 2011.
(Continued)

*Primary Examiner* — Mohammad A Rahman
(74) *Attorney, Agent, or Firm* — ScienBiziP, P.C.

(57) ABSTRACT

A display device includes a hole injection layer common to a plurality of light-emitting elements between a light-emitting layer and an anode electrode under the light-emitting layer in the light-emitting element of each pixel. The hole injection layer includes a hole injection section configured to transport positive holes to the light-emitting layer, and a neighboring pixel hole blocking section formed in a portion between the light-emitting elements of adjacent pixels and configured to block transportation of positive holes between the light-emitting elements of the adjacent pixels.

16 Claims, 24 Drawing Sheets

(51) Int. Cl.
*H10K 59/00* (2023.01)
*H10K 59/12* (2023.01)
*H10K 85/20* (2023.01)

(52) U.S. Cl.
CPC ......... *H10K 59/12* (2023.02); *H10K 59/1201* (2023.02); *H10K 59/771* (2023.02); *H10K 85/20* (2023.02)

(58) Field of Classification Search
CPC .. H10K 59/1201; H10K 59/771; H10K 85/20; H10K 59/352; G09F 9/30; H05B 33/10; H05B 33/22
See application file for complete search history.

(56) References Cited

U.S. PATENT DOCUMENTS

| | | | | |
|---|---|---|---|---|
| 2017/0062821 | A1 | 3/2017 | Tour et al. | |
| 2019/0237514 | A1* | 8/2019 | Tsukamoto ............ | H10K 50/11 |
| 2020/0112026 | A1 | 4/2020 | Tour et al. | |
| 2021/0184183 | A1 | 6/2021 | Wang | |

FOREIGN PATENT DOCUMENTS

| | | | | |
|---|---|---|---|---|
| JP | 2003142277 | A | | 5/2003 |
| JP | 2014-072186 | A | * | 4/2014 |
| JP | 2017514783 | A | | 6/2017 |
| JP | 2018101761 | A | | 6/2018 |

OTHER PUBLICATIONS

Chun Kiang Chua et al., "Introducing dichlorocarbene in graphene", Cite this: Chem. Commun., 2012, 48, 5376-5378, www.rsc.org/chemcomm, Accepted Apr. 3, 2012.

Kiaoyan Zhang et al., "Synthesis and characterization of a graphene-C60 hybrid material", Carbon 47 (2008) 313-347, Available online Oct. 17, 2008.

Nikolaos Karousis et al., "Porphyrin counter anion in imidazolium-modified graphene-oxide", Carbon 48 (2010) 854-860, Available online Oct. 29, 2009.

Sasha Stankovich et al., "Synthesis and exfoliation of isocyanate-treated graphene oxide nanoplatelets", Carbon 44 (2006) 3342-3347, Available online Aug. 4, 2006.

Sasha Stankovich et al., "Synthesis of graphene-based nanosheets via chemical reduction of exfoliated graphite oxide", Carbon 45 (2007) 1558-1565, Available online Mar. 6, 2007.

Yonglai Zhang et al., "Direct imprinting of microcircuits on graphene oxides film by femtosecond laser reduction", Nano Today (2010) 5, 15-20, Available online Jan. 19, 2010.

Richa Sharma et al., "Anomalously Large Reactivity of Single Graphene Layers and Edges toward Electron Transfer Chemistries", DOI: 10.1021/nl902741x | Nano Lett. 2010, 10, 398-405, Published on Web: Jan. 7, 2010.

Haitao Liu et al., "Photochemical Reactivity of Graphene", J. Am. Chem. Soc. 2009, 131, 17099-17101, Published on Web Nov. 10, 2009.

Xing Zhong et al., "Aryne cycloaddition: highly efficient chemical modification of graphenew", 7340 Chem. Commun., 2010, 46, 7340-7342, Accepted Aug. 13, 2010.

Vasilios Georgakilas et al., "Organic functionalisation of graphenes", 1766 | Chem. Commun., 2010, 46, 1766-1768, First published as an Advance Article on the web Jan. 13, 2010.

Stefan J. Pastine et al., "A Facile and Patternable Method for the Surface Modification of Carbon Nanotube Forests Using Perfluoroarylazides", J. Am. Chem. Soc. 2008, 130, 4238-4239, Published on Web Mar. 11, 2008.

* cited by examiner

DISPLAY DEVICE AND METHOD FOR MANUFACTURING SAME

TECHNICAL FIELD

The disclosure relates to a display device and a manufacturing method thereof.

BACKGROUND ART

In related art, in manufacturing a self-luminous display device including light-emitting elements, a method of forming an organic compound material layer excluding a light-emitting layer between an anode electrode and a cathode electrode as a common layer common to a plurality of pixels is used (see, for example, PTL 1).

CITATION LIST

Patent Literature

PTL 1: JP 2003-142277 A

Non Patent Literature

NPL 1: Sung Huh and other five collaborators, "UV/Ozone-Oxidized Large-Scale Graphene Platform with Large Chemical Enhancement in Surface-Enhanced Raman Scattering", American Chemical Society, ACSNANO, Vol. 5, No. 12 (2011), Pages 9799-9806

NPL 2: Chun Kiang Chua and other two collaborators, "Introducing Dichlorocarbene in Graphene", Chem. Commun., 2012, 48, pages 5376-5378

NPL 3: Xiaoyan Zhang and other five collaborators, "Synthesis and characterization of a graphene-C60 hybrid material", Carbon 47 (2008), pages 334-347

NPL 4: Nikolaos Karousis and other three collaborators, "Porphyrin counter anion in imidazolium-modified graphene-oxide", Carbon 48 (2010), pages 854-860

NPL 5: Sasha Stankovich and other three collaborators, "Synthesis and exfoliation of isocyanate-treated graphene oxide nanoplatelets", Carbon 44, (2006), pages 3342-3347

NPL 6: Sasha Stankovich and other eight collaborators, "Synthesis of graphene-based nanosheets via chemical reduction of exfoliated graphite oxide", Carbon 45 (2007), Pages 1558-1565

NPL 7: Yonglai Zhang and other eight collaborators, "Direct imprinting of microcircuits on graphene oxides film by femtosecond laser reduction", Nano Today (2010) 5, pages 15-20

NPL 8: Richa Sharma and other three collaborators, "Anomalously Large Reactivity of Single Graphene Layers and Edges toward Electron Transfer Chemistries", Nano Lett. 2010, 10, pages 398-405

NPL 9: Haitao Liu and other five collaborators, "Photochemical Reactivity of Graphene", J. Am. Chem. Soc. Vol. 131, No. 47, 2009, pages 17099-17101

NPL 10: Xing Zhong and other six collaborators, "Aryne-cycloaddition: highly efficient chemical modification of graphene", Chem. Commun., 2010, 46, pages 7340-7342

NPL 11: Vasilios Georgakilas and other six collaborators, "Organic functionalisation of graphenes", Chem. Commun., 2010, 46, pages 1766-1768

NPL 12: Stefan J. Pastine and other six collaborators, "A Facile and Patternable Method for the Surface Modification of Carbon Nanotube Forests Using Perfluoroarylazides", J. Am. Chem. Soc. Vol. 130, No. 13, 2008, pages 4238-4239

SUMMARY

Technical Problem

As described above, by forming an organic compound material layer excluding a light-emitting layer between an anode electrode and a cathode electrode as a common layer common to a plurality of pixels, the number of manufacturing steps may be reduced, whereby the manufacturing cost may be reduced, for example.

By forming the organic compound material layer excluding the light-emitting layer between the anode electrode and the cathode electrode as the common layer common to the plurality of pixels, the penetration of foreign matters such as water and oxygen from the outside may be prevented, whereby a more reliable display device may be achieved.

However, in the case where the organic compound material layer excluding the light-emitting layer between the anode electrode and the cathode electrode is formed as the common layer common to the plurality of pixels as described above, when one pixel (light-emitting element) emits light, carriers are transported also to the light-emitting layer of an adjacent pixel (light-emitting element) via the common layer, thereby causing optical crosstalk to occur in which the adjacent light-emitting element also emits light. Such crosstalk causes deterioration in display quality of the display device.

The disclosure has been made in view of the problems described above, and an object of the disclosure is to provide a self-luminous display device in which crosstalk does not occur regardless of including a common layer which is formed to be common to a plurality of pixels and through which carriers are transported, and to provide a manufacturing method of the display device mentioned above.

Solution to Problem

In order to solve the above problems, a display device according to one aspect of the disclosure is a display device including a plurality of pixels. The display device includes a support body, a thin film transistor layer, a light-emitting element layer, and a sealing layer configured to seal the light-emitting element layer in this order, wherein, the light-emitting element layer includes a plurality of light-emitting elements having different luminescent colors from each other, the plurality of light-emitting elements are respectively formed corresponding to the plurality of pixels, each of the plurality of light-emitting elements includes a lower electrode, an upper electrode and a light-emitting layer formed between the lower electrode and the upper electrode, and includes, of a first carrier injection layer and a first carrier transport layer formed between the light-emitting layer and the lower electrode and a second carrier injection layer and a second carrier transport layer formed between the light-emitting layer and the upper electrode, at least the first carrier injection layer and the first carrier transport layer, the lower electrode, the first carrier transport layer, and the light-emitting layer are formed in island shapes for each of the plurality of pixels, and at least the first carrier injection layer of the carrier injection layers included in the plurality of light-emitting elements is a common layer formed to be common to the plurality of light-emitting elements of the plurality of pixels, and includes, for each of the plurality of pixels, a carrier injection section formed overlapping the light-emitting layer in each of the plurality of light-emitting elements and configured to inject carriers into the light-emitting layer, and a neighboring pixel carrier blocking section formed in a portion between the light-emitting elements of the adjacent pixels and configured to block transportation of carriers between the light-emitting elements of the adjacent pixels.

To solve the above problems, a manufacturing method of a display device according to one aspect of the disclosure is a manufacturing method of the display device according to the one aspect of the disclosure, and includes a step of forming the lower electrode, a step of forming the first carrier injection layer, a step of forming the first carrier transport layer, a step of forming the light-emitting layer, and a step of forming the upper electrode.

Advantageous Effects of Disclosure

According to one aspect of the disclosure, it is possible to provide a self-luminous display device in which crosstalk does not occur regardless of including a common layer which is formed to be common to a plurality of pixels and through which carriers are transported, and a manufacturing method thereof.

DESCRIPTION OF EMBODIMENTS

First Embodiment

An embodiment of the disclosure will be described as follows based on FIGS. 1 to 17.

Schematic Configuration of Display Device

Figure 2:
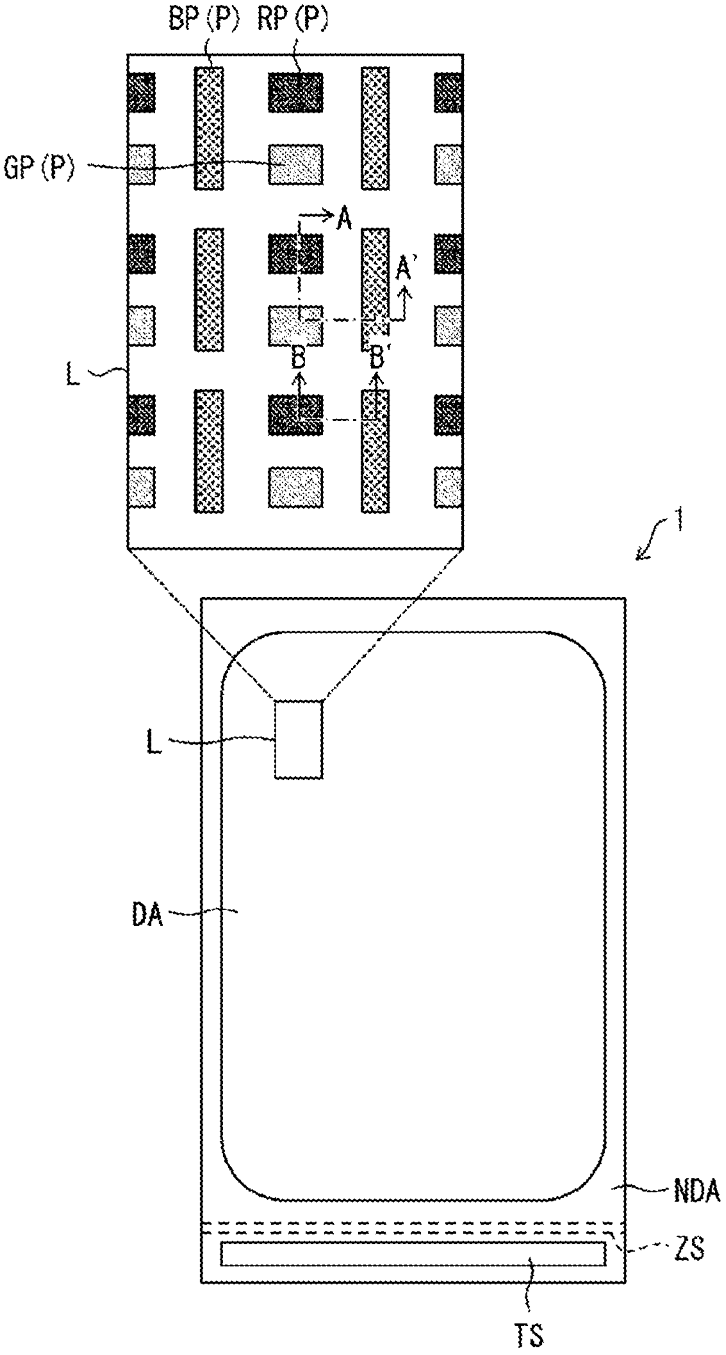
FIG. 2 is a partially enlarged plan view illustrating an example of a schematic configuration of the display device according to the first embodiment.

FIG. 2 is a partially enlarged plan view illustrating an example of a schematic configuration of a display device 1 according to the present embodiment.

As illustrated in FIG. 2, the display device 1 has a display region DA including a plurality of pixels P and a frame region NDA provided around the display region DA so as to surround the display region DA.

The frame region NDA is a non-display region and includes a terminal portion TS and a bending portion ZS provided between the terminal portion TS and the display region DA. The terminal portion TS is provided with an electronic circuit board (not illustrated) such as an integrated circuit (IC) chip and a flexible printed circuit board (FPC).

A plurality of wiring lines including a plurality of scanning signal lines and a plurality of data signal lines are provided in the display region DA. The scanning signal lines extend in a row direction. The data signal lines extend in a column direction. The display device 1 is a full-color active matrix display device, and has a plurality of pixels P corresponding to intersections of these scanning signal lines and data signal lines.

The display device 1, as illustrated in an enlarged region L, which is part of the display region DA, has, for example, red (R) pixels RP, green (G) pixels GP, and blue (B) pixels BP as the pixels P. Note that in the present embodiment, when there is no need to distinguish between these pixels RP, GP, and BP, the pixels RP, GP, and BP are collectively referred to simply as "pixel P".

Hereinafter, the display device 1 will be described as having these pixels RP, GP, and BP. However, the above example is just an example, and the display device 1 may have pixels P other than the pixels of RGB.

FIG. 2 illustrates, as an example, a case in which the pixels P are arranged in a so-called PenTile arrangement with the blue pixel BP as a base pixel. Thus, in the display device 1 illustrated in FIG. 2, although the pixels BP are aligned in a straight line in the column direction, the pixels RP and the pixels GP are arranged alternately in the column direction. However, the pixel arrangement in the display device 1 is not limited to the PenTile arrangement, and may be another arrangement, such as a stripe arrangement.

Figure 1:
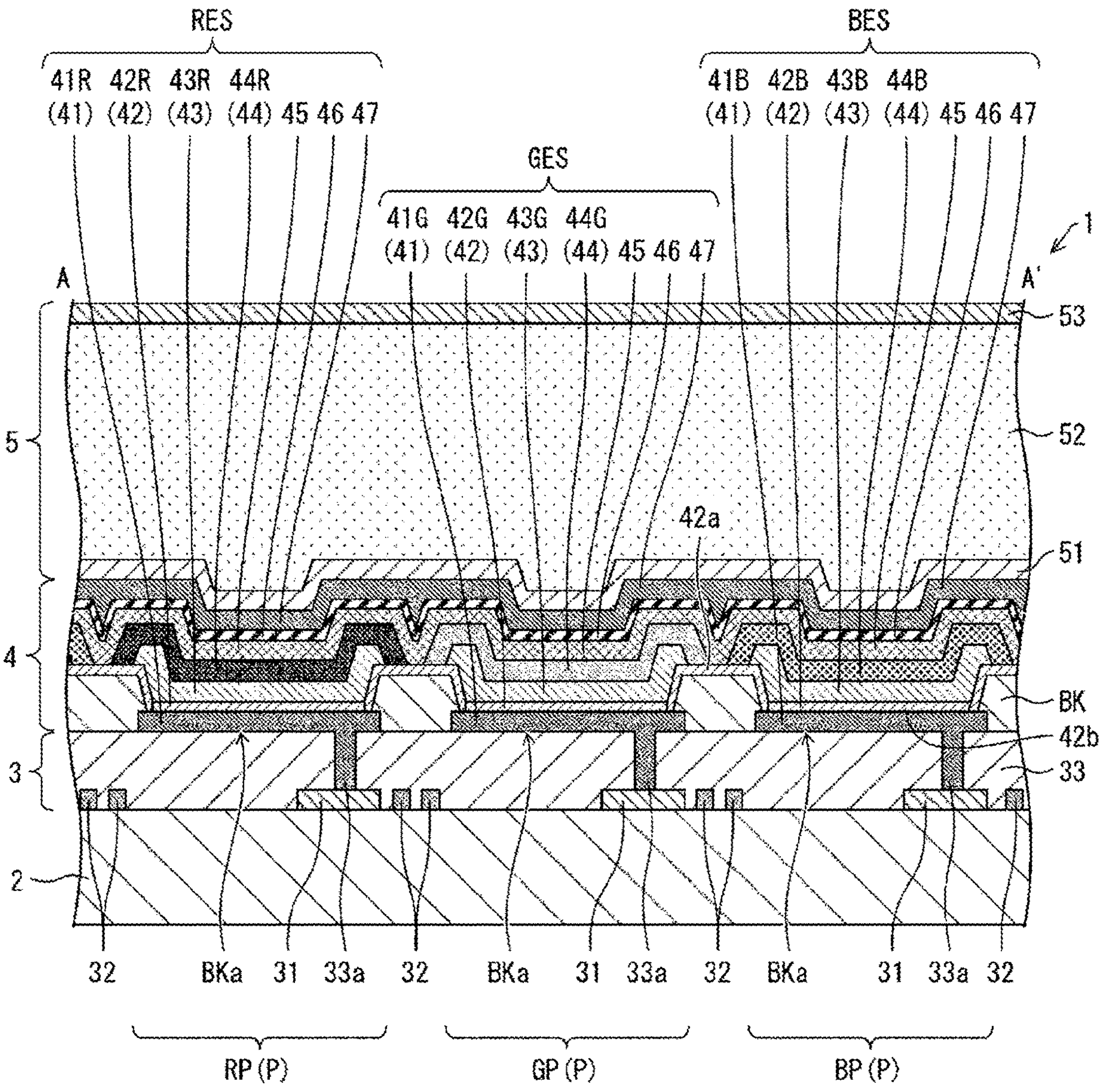
FIG. 1 is a cross-sectional view illustrating an example of a schematic configuration of a pixel in a display device according to a first embodiment.

FIG. 1 is a cross-sectional view illustrating an example of a schematic configuration of the pixel P in the display device 1 according to the present embodiment. Note that FIG. 1 is a cross-sectional view taken along a line A-A' illustrated in FIG. 2.

The display device 1 is a self-luminous display device called, for example, an organic electroluminescent (EL) display device. As illustrated in FIG. 1, each pixel P is formed with a self-luminous light-emitting element ES referred to as an organic light-emitting diode (OLED) or an organic EL element. Hereinafter, a case in which the display device 1 is an organic EL display device (OLED display) including an OLED as the light-emitting element ES will be described as an example. However, the present embodiment is not limited thereto, and the display device 1 may be a quantum dot light emitting diode (QLED) display including a QLED as the light-emitting element ES. Alternatively, the display device 1 may be an inorganic EL display device including an inorganic EL as the light-emitting element ES.

In the red pixel RP, a red light-emitting element (RES) that emits red light is provided as the light-emitting element ES. In the green pixel GP, a green light-emitting element (GES) that emits green light is provided as the light-emitting element ES. In the blue pixel BP, a blue light-emitting element (BES) that emits blue light is provided as the light-emitting element ES. Thus, the display region DA is provided with a plurality of light-emitting elements ES having different luminescent colors from each other. Note that in the present embodiment, when there is no need to distinguish between the light-emitting elements RES, GES, and BES, the light-emitting elements RES, GES, and BES are collectively referred to simply as "light-emitting element ES". The individual layers in the light-emitting elements ES are also collectively named in the same manner when there is no need to distinguish between the light-emitting elements RES, GES, and BES.

As illustrated in FIG. 1, the display device 1 includes a substrate 2, a thin film transistor layer 3, a light-emitting element layer 4, and a sealing layer 5 in this order.

The substrate 2 is a support body that supports individual layers from the thin film transistor layer 3 to the sealing layer 5. The substrate 2 may be, for example, an inorganic substrate made of an inorganic material such as glass, quartz, or ceramics, or a flexible substrate made primarily of a resin such as polyethylene terephthalate, polycarbazole, or polyimide. For example, the substrate 2 can also be made of two layers of polyimide films and an inorganic film sandwiched therebetween. Alternatively, the substrate 2 may be a metal substrate made of metal such as aluminum or iron, the surface of which is coated with an insulating film of silicon oxide (SiOx), silicon nitride (SiNx), an organic insulating material, or the like. Alternatively, the substrate 2 may be a metal substrate containing Al or the like, the surface of which has been subjected to insulation treatment by a method such as anode oxidation.

When the display device 1 is a top-emission display device that emits light from above the light-emitting element ES (i.e., from the opposite side to the substrate 2 side of the light-emitting element ES), the substrate 2 used is not limited to a specific substrate. However, when the display device 1 is a bottom-emission display device that emits light from below the light-emitting element ES (i.e., from the back face side of the substrate 2), the substrate 2 is a transparent substrate that is transparent or semitransparent.

A pixel circuit that controls each light-emitting element ES in the light-emitting element layer 4 and wiring lines 32 connected to the pixel circuit are formed in the thin film transistor layer 3. The wiring lines 32 include the plurality of scanning signal lines and the plurality of data signal lines described above. The pixel circuit is provided for each pixel P corresponding to each pixel P in the display region DA.

The pixel circuit controls current to the light-emitting element ES according to a gray-scale voltage. The configuration of the pixel circuit is not limited to a specific configuration as long as the light-emitting element ES in each pixel P can be driven individually. A plurality of thin film transistors 31 including a thin film transistor connected to a lower electrode of the light-emitting element ES in each pixel P are provided in each pixel circuit. Note that a configuration of a thin film transistor has been well known. Thus, illustrations and descriptions of individual layers in the thin film transistor 31 are omitted.

The plurality of thin film transistors 31 and the plurality of wiring lines 32 are covered with a flattening film 33. The thin film transistor layer 3 includes the plurality of thin film transistors 31 and the plurality of wiring lines 32, and the flattening film 33 formed to cover the plurality of thin film transistors 31 and the plurality of wiring lines 32.

In the flattening film 33, a contact hole 33*a* for electrically connecting the lower electrode in the light-emitting element ES to the thin film transistor 31 is provided. Thus, the thin film transistor 31 is electrically connected to the light-emitting element ES via the contact hole 33*a*. The flattening film 33 can be made of a coatable photosensitive organic material such as a polyimide resin or an acrylic resin, for example.

The light-emitting element layer 4 includes the plurality of light-emitting elements ES (specifically, light-emitting elements RES, GES, and BES) described above. The light-emitting element ES is formed for each pixel P in correspondence with each pixel P as described above.

The light-emitting element ES is a self-luminous element. The light-emitting element ES according to the present embodiment includes a cathode electrode 47 and a light-emitting layer (hereinafter, referred to as "EML") 44 provided between an anode electrode 41 and the cathode electrode 47. Between the anode electrode 41 and the EML 44, a hole injection layer (hereinafter, referred to as "HIL") 42 as a carrier injection layer and a hole transport layer (hereinafter referred to as "HTL") 43 as a carrier transport layer are provided in this order from the anode electrode 41 side. Between the cathode electrode 47 and the EML 44, an electron injection layer (hereinafter referred to as "EIL") 46 as a carrier injection layer and an electron transport layer (hereinafter referred to as "ETL") 45 as a carrier transport layer are provided in this order from the cathode electrode 47 side.

Note that hereinafter, the carrier injection layer provided between the lower electrode and the EML 44 is referred to as a "first carrier injection layer", and the carrier injection layer provided between the upper electrode and the EML 44 is referred to as a "second carrier injection layer". Likewise, the carrier transport layer provided between the lower electrode and the EML 44 is referred to as a "first carrier transport layer", and the carrier transport layer provided between the upper electrode and the EML 44 is referred to as a "second carrier transport layer". Accordingly, in the present embodiment, the HIL 42 is the first carrier injection layer and the EIL 46 is the second carrier injection layer. The HTL 43 is the first carrier transport layer and the ETL 45 is the second carrier transport layer.

Further, in the following, the layers between the anode electrode 41 and the cathode electrode 47 in the light-emitting element ES are collectively referred to as function layers. The light-emitting element ES illustrated in FIG. 1 includes the HIL 42, the HTL 43, the EML 44, the ETL 45, and the EIL 46 as the function layers.

In the light-emitting element ES illustrated in FIG. 1, the lower electrode is the anode electrode 41 and the upper electrode is the cathode electrode 47. The anode electrode 41, which is the lower electrode, is a pixel electrode (patterned anode) that is patterned in an island shape for each pixel P (in other words, for each light-emitting element ES) corresponding to each pixel P. On the other hand, the cathode electrode 47, which is the upper electrode, is a common electrode (common cathode electrode) provided to be common to all the pixels P (in other words, common to all the light-emitting elements ES).

The anode electrode 41 is formed on the flattening film 33 and adjacent to the flattening film 33. An edge (pattern edge) of the anode electrode 41 is covered with a bank BK referred to as an edge cover.

The light-emitting element layer 4 has a configuration in which the anode electrode 41, the bank BK, the HIL 42, the HTL 43, the EML 44, the ETL 45, the EIL 46, and the cathode electrode 47 are layered in this order from the thin film transistor layer 3 side.

The bank BK is an insulating layer for preventing a short circuit between the anode electrode 41 and the cathode electrode 47. The bank BK also functions as an element separation film (also referred to as a pixel separation film) that separates the light-emitting element ES in each pixel P. Openings BKa are provided in the bank BK for the respective pixels P. The openings BKa in the bank BK are the light-emitting regions of the respective pixels P. The bank BK may be formed of a coatable photosensitive organic material, such as a polyimide resin and an acrylic resin, for example.

The anode electrode 41 and the cathode electrode 47 are each formed of a conductive material. The anode electrode 41 has a function to supply positive holes to the EML 44, and the cathode electrode 47 has a function to supply electrons to the EML 44.

Of the anode electrode 41 and the cathode electrode 47, at least the electrode on the light extraction surface side needs to have optical transparency. On the other hand, the electrode on the side opposite to the light extraction surface may have optical transparency or light reflectivity.

For example, when the display device 1 is a top-emission display device, the cathode electrode 47, which is the upper electrode, is formed of a light transmissive electrode made of an optical transparent material, and the anode electrode 41, which is the lower electrode, is formed of a light-reflective electrode made of a light-reflective material. On the other hand, when the display device 1 is a bottom-emission display device, the cathode electrode 47, which is the upper electrode, is formed of a light-reflective electrode made of a light-reflective material, and the anode electrode 41, which is the lower electrode, is formed of a light transmissive electrode made of an optical transparent material.

A transparent electrode or a semitransparent electrode is used for the light transmissive electrode. For example, indium tin oxide (ITO) or indium zinc oxide (IZO), is used for the transparent electrode. For example, a thin metal film having optical transparency such as a magnesium silver alloy, is used for the semitransparent electrode. For example, a metal such as silver (Ag) or aluminum (Al), or an alloy containing these metals is used for the light-reflective electrode. Note that the electrode having light reflectivity may be obtained by forming a layered body of a light-transmissive material and a light-reflective material.

The HIL 42 has hole transport properties and has a function of enhancing hole injection efficiency into the EML 44. The HIL 42 injects positive holes from the anode electrode 41 into the HTL 43. The HTL 43 is a layer that has hole transport properties and transports the positive holes injected from the HIL 42 to the EML 44.

On the other hand, the EIL 46 has electron transport properties and has a function of enhancing electron injection efficiency into the EML 44. The EIL 46 injects electrons from the cathode electrode 47 into the ETL 45. The ETL 45 is a layer that has electron transport properties and transports the electrons injected from the EIL 46 to the EML 44.

The HTL 43 is formed in an island shape for each pixel P (to rephrase, for each light-emitting element ES) corresponding to each pixel P. The HIL 42, the ETL 45, and the EIL 46 are each a common layer provided to be common to all the pixels P (in other words, common to all the light-emitting elements ES).

However, of the HIL 42, the ETL 45, and the EIL 46, the HIL 42 includes a hole injection section **42*b* as a carrier injection section and a neighboring pixel hole blocking section 42*a*** as a neighboring pixel carrier blocking section.

The hole injection section **42*b* has hole transport properties. The hole injection section 42*b* is provided, for each light-emitting element ES, overlapping the HTL 43 and the EML 44 in each light-emitting element ES, and transports positive holes as carriers to the EML 44 overlapping the hole injection section 42*b* via the HTL 43 overlapping the hole injection section 42*b***.

The neighboring pixel hole blocking section 42*a* is provided in a portion between the light-emitting elements ES of adjacent pixels P, and blocks transportation of positive holes between the light-emitting elements ES of the adjacent pixels P.

The size of the neighboring pixel hole blocking section 42*a* is not particularly limited as long as the neighboring pixel hole blocking section 42*a* is provided between the hole injection sections 42*b* of the adjacent pixels P to enable the blocking of the transportation of positive holes between the light-emitting elements ES of the adjacent pixels P.

The hole injection section 42*b* and the neighboring pixel hole blocking section 42*a* may be formed, for example, by transforming at least part of a common layer provided to be common to all the pixels P by a chemical reaction. The hole injection section 42*b* and the neighboring pixel hole blocking section 42*a* formed in this manner are chemically bonded to each other and are formed integrally with each other in the same layer. The hole injection section 42*b* and the neighboring pixel hole blocking section 42*a* have, suitably, substantially the same thickness by transforming at least part of the common layer provided to be common to all the pixels P by the chemical reaction as described above.

Figure 3:
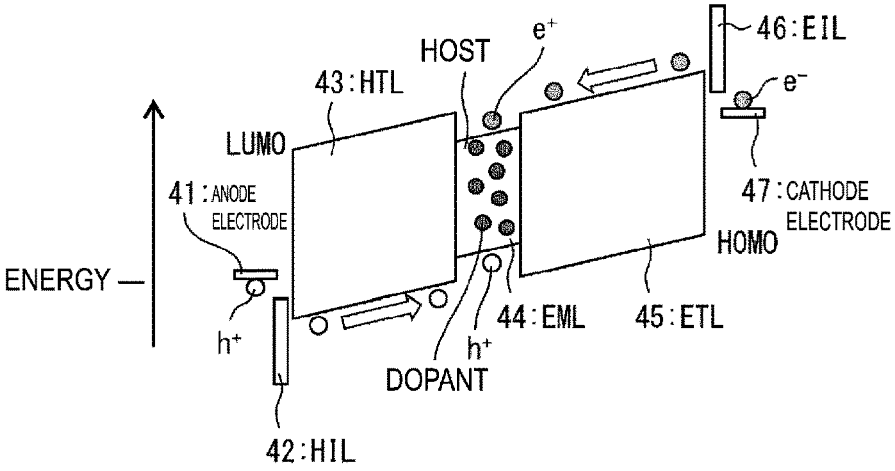
FIG. 3 is a diagram illustrating an energy level of each of layers constituting a light-emitting element according to the first embodiment.

FIG. 3 is a diagram illustrating an energy level of each of the layers constituting the light-emitting element ES according to the present embodiment. In each of the light-emitting elements ES, as illustrated in FIG. 3, the highest occupied molecular orbital level (hereinafter referred to as "HOMO level") of the hole injection section 42*b*, which is an energy level of the highest occupied molecular orbital thereof, is preferably deeper (lower) than the HOMO level of the HTL 43. With this, positive holes are likely to enter the HTL 43 relative to the hole injection section 42*b*. Thus, for each of the light-emitting elements ES, positive holes may be efficiently injected from the hole injection section 42*b* into the HTL 43, and the EML 44 may efficiently emit light.

In each of the light-emitting elements ES, as illustrated in FIG. 3, the lowest unoccupied molecular orbital level (hereinafter referred to as "LUMO level") of the hole injection section 42*b*, which is an energy level of the lowest unoccupied molecular orbital thereof, is preferably deeper (lower) than the LUMO level of the HTL 43. With this, electrons are unlikely to leak from the HTL 43 to the hole injection section 42*b*, and thus the EML 44 may efficiently emit light.

As illustrated in FIG. 3, it is preferable that a gap between the HOMO level and the LUMO level be small in the hole injection section 42*b*. In FIG. 3, used is a material in which the gap between the HOMO level and the LUMO level in the hole injection section 42*b* is smaller than the gap between the HOMO level and the LUMO level in the HTL 43. This makes it possible to provide the display device 1, in which positive holes easily move from the HIL 42 to the HTL 43, low voltage driving can be performed, and the luminous efficiency is high.

Both the HOMO level and the LUMO level may be determined by an ordinary technique.

In the case where the light-emitting element ES is a QLED, the HOMO level and the LUMO level are replaced with a conduction band level and a valence band level in sequence.

The hole injection section 42*b* is made of a hole transport material. On the other hand, the neighboring pixel hole blocking section 42*a* is made of a hole blocking material that blocks transportation of positive holes. The hole blocking material may be an organic insulating material or an electron transport material.

The hole injection section 42*b* may be formed by forming a film of a hole transport material, or may be formed by converting (transforming) an organic insulating material or an electron transport material into a hole transport material by a chemical reaction. Accordingly, the hole injection section 42*b* may be formed by transforming the hole blocking material used for the neighboring pixel hole blocking section 42*a* by a chemical reaction.

The neighboring pixel hole blocking section 42*a* may be formed by forming a film of an organic insulating material or an electron transport material, or may be formed by converting (transforming) an organic insulating material or a hole transport material into an electron transport material by a chemical reaction.

However, the present embodiment is not limited to the above configuration. The hole injection section 42*b* and the neighboring pixel hole blocking section 42*a* may be patterned with different materials from each other.

When the hole injection section 42*b* and the neighboring pixel hole blocking section 42*a* are patterned with different materials, the patterning may be performed by any of the following methods, for example.

For example, when the materials of the hole injection section 42*b* and the neighboring pixel hole blocking section 42*a* are powders (solids), examples of the patterning method include (1) a method of separate patterning vapor deposition using a fine metal mask (FMM), (2) an ink-jet method, and (3) a method of transferring the above materials into pixels RP, GP, and BP by using silicon rubbers having patterns corresponding to the pixels RP, GP, and BP.

When the materials of the hole injection section 42*b* and the neighboring pixel hole blocking section 42*a* are liquids, examples of the patterning method include the method (2) described above, the method (3) described above, (4) a method of performing photolithography after applying the above materials onto the entire surface of the substrate, and (5) a method of laser processing after applying the above materials onto the entire surface of the substrate.

In a case where the hole injection section 42*b* and the neighboring pixel hole blocking section 42*a* are patterned separately, when at least one of the hole injection section 42*b* and the neighboring pixel hole blocking section 42*a* is subjected to conversion (transformation) of the material, the conversion (transformation) of the material may be performed after patterning the section to be subjected to the conversion (transformation) of the material, or may be performed after patterning both the hole injection section 42*b* and the neighboring pixel hole blocking section 42*a*. When film formation and patterning are performed separately, the conversion (transformation) of the above material may be performed after patterning, or may be performed after film formation and before patterning.

When forming the hole injection section 42*b* and the neighboring pixel hole blocking section 42*a* by transforming at least part of the common layer by a chemical reaction as described above, the hole injection section 42*b* and the neighboring pixel hole blocking section 42*a* are chemically bonded to each other by covalent bonds.

On the other hand, when the hole injection section 42*b* and the neighboring pixel hole blocking section 42*a* are patterned with different materials from each other, the hole injection section 42*b* and the neighboring pixel hole blocking section 42*a* are chemically bonded to each other by, for example, intermolecular forces (van der Waals forces) or hydrogen bonds between chemical substances of the materials to form a single integrated layer. In this case as well, the neighboring pixel hole blocking section 42*a* formed integrally with the hole injection sections **42*b* is provided between the adjacent hole injection sections 42*b*** in the same layer.

As the hole transport material, at least one hole transport material may be selected from the group consisting of inorganic hole transport materials including graphene oxide, a graphene oxide derivative formed by introducing an electron-attracting group into graphene oxide, a graphene derivative formed by introducing an electron-attracting group into graphene, copper thiocyanate (CuSCN), and tungsten oxide ($WO_{3-x}$); and organic hole transport materials including 2,6-bis(9H-carbazoyl-9-yl)pyridine, 4,4'-bis(3-ethyl-N-carbazoyl)-1,1'-biphenyl, 4-(dibenzylamino)benzaldehyde-N,N'-diphenylhydrazone, 9,9'-[2,2'-dimethyl(1,1'-biphenyl)-4,4'-diyl]bis-9H-carbazole, 2,2'-dimethyl-N,N'-di(1-naphthyl-N,N'-diphenyl)-1,1'-biphenyl-4,4'-diamine, 9,9'-dimethyl-N,N'-di(1-naphthyl)-N,N'-diphenyl-9H-fluorene-2,7-diamine, N,N'-di(2-naphthyl-N,N'-diphenyl)-1,1'-biphenyl-4,4'-diamine, N,N'-diphenyl-N,N'-bis[4-(phenyl-m-tolylamino)phenyl]biphenyl-4,4'-diamine, N,N'-diphenyl-N,N'-di-p-tolylbenzene-1,4-diamine, N,N'-di(1-naphthyl)-N,N'-diphenyl-1,1'-biphenyl-4,4'-diamine, N4,N4'-bis{4-[bis(3-methylphenyl)amino]phenyl}-N4,N4'-diphenyl-(1,1'-biphenyl)-4,4'-diamine ("DNTPD"), 3-(4,6-diphenyl-1,3,5-triazine-2-yl)-9-phenyl-9H-carbazole ("DPTPCz"), 9-(2-ethylhexyl)-N,N,N,N-tetrakis(4-methoxyphenyl)-9H-carbazole-2,7-diamine ("EH44"), indium(III) phthalocyanine chloride, poly[N,N'-bis(4-butylphenyl)-N,N'-bis(phenyl)-benzidine]("Poly-TPD"), 2,8-bis(diphenylphosphine oxide)dibenzofuran ("PPF"), 4,4',4'',4'''-silanetetrayltetrakis(N,N-bis(4-methoxyphenyl)aniline) ("Si-OMeTPA"), spiro[9H-fluorene-9,9'-(9H)xanthine]-2,7-diamine, spiro[9H-fluorene-9,9'-(9H)xanthine]-2,2'-7,7'-tetramine, 2,4,6-tris[3-(carbazole-9-yl)phenyl]triazine ("TCPZ"), N,N,N',N'-tetrakis(4-methoxyphenyl)benzidine, N,N,N',N'-tetrakis(3-methylphenyl)-3,3'-dimethylbenzidine, N,N,N',N'-tetrakis(2-naphthyl)benzidine, tetra-N-phenylbenzidine, N,N,N',N'-tetraphenylnaphthalene-2,6-diamine, poly[(9,9-dioctylfluorenyl-2,7-diyl)-co-{4,4'-[N-(4-sec-butylphenyl)diphenylamine]}]("TFB"), titanyl phthalocyanine, 1,3,5-tris[(3-methylphenyl)phenylamino]benzene, 4,4',4''-tris[2-naphthyl(phenyl)amino]triphenylamine, vanadyl phthalocyanine, 4,4'-cyclohexylidenebis[N,N-bis(4-methylphenyl)benzenamine], dipyrazino[2,3-f:2',3'-h]quinoxaline-2,3,6,7,10,11-hexacarbonitrile, tin(IV)2,3-naphthalocyanine dichloride, N2,N2,N2',N2',N7,N7,N7',N7'-octakis(4-methoxyphenyl)-9,9'-spirobi[9H-fluorene]-2,2',7,7'-tetramine ("Spiro-MeOTD"), titanyl phthalocyanine, 1,3,5-tris(2-(9-ethylcarbazyl-3)ethylene)benzene, tris(4-carbazoyl-9-ylphenyl)amine, tris[4-(diethylamino)phenyl]amine, 1,3,5-tris(diphenylamino)benzene, 4,4',4''-tris[phenyl(m-tolyl)amino]triphenylamine, 4,4'-bis(N-carbazolyl)-1,1'-biphenyl, 1,3-bis(N-carbazolyl)benzene, 1,4-bis(N-carbazolyl)benzene, N,N'-bis(3-methylphenyl)-N,N'-diphenylbenzidine, poly(N-ethyl-2-vinylcarbazole), poly[bis(4-phenyl)(2,4,6-trimethylphenyl)amine], poly(9-vinylcarbazole), poly(1-vinylnaphthalene), poly(2-vinylnaphthalene), poly(copper phthalocyanine), and copper (II) phthalocyanine. Note that when the hole transport material is an inorganic hole transport material, the inorganic hole transport material may be nanoparticles.

A known photosensitive resin that can be patterned can be used as the organic insulating material. As the organic insulating material, for example, at least one resin is selected from the group consisting of polyimide (PI), polyetherimide (PEI), polyacrylonitrile (PAN), polyetheretherketone (PEEK), polyvinyl alcohol (PVA), polyisoprene, novolac resin, and polyacrylamide.

As the electron transport material, at least one electron transport material is selected from the group consisting of inorganic electron transport materials including graphene, a graphene derivative formed by introducing an electron-donating group into graphene, a graphene oxide derivative formed by introducing an electron-donating group into graphene oxide, tin(IV) oxide, and zinc oxide; and organic electron transport materials including tris(2,4,6-trimethyl-3-(pyridin-3-yl)phenyl)borane ("3TPYMB"), 4,6-bis(3,5-di(pyridin-3-yl)phenyl)-2-methylpyrimidine ("B3PYMPM"), 1,3-bis(3,5-dipyrid-3-ylphenyl)benzene ("B3PyPB"), 2,7-bis(2,2'-bipyridin-5-yl)triphenylene ("BPy-TP2"), lithium 8-quinolinolate, poly[(9,9-bis(3'-((N,N-dimethyl)-N-ethylammonium)-propyl)-2,7-fluorene)-alt-2,7-(9,9-dioctylfluorene)]dibromide ("PFN-Br"), poly[(9,9-bis(3'-(N,N-dimethylamino)propyl)-2,7-fluorene)-alt-2,7-(9,9-dioctylfluorene)] ("PFN-DOF"), (1,3,5-triazine-2,4,6-triyl)tris(benzene-3,1-diyl)tris(diphenylphosphine oxide) ("PO-T2T"), 2,5,8,11-tetrakis(1,1-dimethylethyl)perylene ("TBPe"), 1,3,5-tris(3-pyridyl-3-phenyl)benzene ("TmPyPB"), 1,3,5-tris(1-phenyl-1H-benzimidazol-2-yl)benzene ("TPBi"), diphenyl [4-(triphenylsilyl)phenyl]phosphine oxide ("TSPO1"), 3,5-diphenyl-4-(1-naphthyl)-1H-1,2,4-triazole, tris(8-hydroxyquinoline)aluminum, 2,9-dimethyl-4,7-diphenyl-1,10-phenanthroline ("bathocuproine"), 4.7-diphenyl-1.10-phenanthroline ("bathophenanthroline"), 2,5-bis(1-naphthyl)-1,3,5-oxadiazole, bis(8-hydroxy-2-methylquinoline)-(4-phenylphenoxy)aluminum, 3,5-bis(4-tert-butylphenyl)-4-phenyl-4H-1,2,4-triazole, 2-(4-biphenylyl)-5-phenyl-1,3,4-oxadiazole, 3-(biphenyl-4-yl)-5-(4-tert-butylphenyl)-4-phenyl-4H-1,2,4-triazole, and 2-(4-tert-butylphenyl)-5-(4-biphenylyl)-1,3,4-oxadiazole. Note that when the electron transport material is an inorganic electron transport material, the inorganic electron transport material may be nanoparticles.

When the neighboring pixel hole blocking section **42*a*** is made of an electron transport material, the electron transport material may be graphene derived from the aforementioned organic insulating material (derived graphene). For example, organic insulating materials such as PI, PEI, and PAN have sufficient heat resistance and contain carbon so that the organic insulating materials are converted into graphene by exposure to laser light, for example. Note that when PAN is used as the organic insulating material, the PAN is converted into graphene by gradually heating.

The laser source is not limited as long as the laser source has a laser excitation wavelength matching an absorption wavelength of the organic insulating material (resin) forming the organic insulating film.

Examples of the laser source include a $CO_2$ laser, a solid-state laser, a gas-phase laser, an infrared laser, an ultraviolet laser, and a visible laser. Note that these laser sources can be used in combination. The laser sources can be used at various wavelengths. The laser sources can be operated in various power ranges. The laser sources have various pulse widths (pulse time widths).

When the organic insulating film is, for example, PI, PEI, or PAN, a $CO_2$ laser is suitably used as the laser source. In this case, laser scribing for selectively irradiating only the inside of each pixel P with laser light can be incorporated into a $CO_2$ laser cutter system. The $CO_2$ laser cutter system can align a laser head to the pixel P, set laser intensity, set scan rate intensity, and the like.

As described above, the hole injection section 42*b* may be formed, for example, by transforming the hole blocking material by a chemical reaction. For example, when the hole blocking material is graphene, the graphene has electron transport properties, but is converted into graphene oxide having hole transport properties by an oxidation reaction.

Graphene has, for example, a structure represented in the following structural formula (1). Graphene oxide has, for example, a structure represented in the following structural formula (2).

[Chem. 1]

(1)

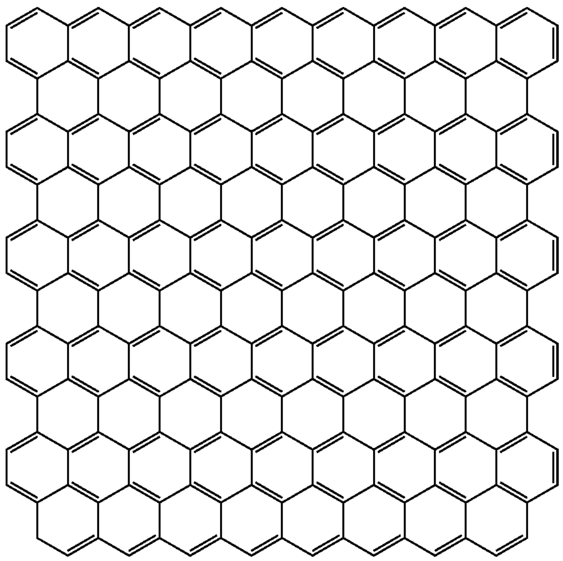

[Chem. 2]

(2)

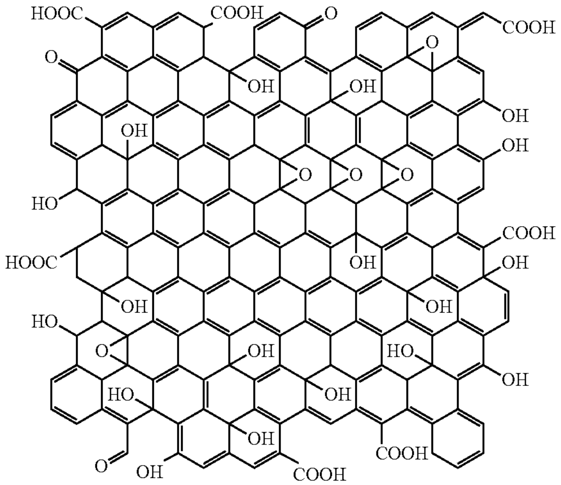

As described above, the graphene film transformed (in other words, converted) from an organic insulating film such as a PI film by laser irradiation has a structure in which pieces of flake-like single graphene (graphene thin films) randomly overlap each other and portions where the pieces of flake-like single graphene (graphene thin films) are in contact with each other are chemically bonded, whereby the graphene thin films are connected to each other.

The graphene oxide film obtained by oxidizing the graphene film has a structure in which pieces of flake-like single graphene oxide (graphene oxide thin films) randomly overlap each other and portions where the pieces of flake-like single graphene oxide (graphene oxide thin films) are in contact with each other are chemically bonded, whereby the graphene oxide thin films are connected to each other.

Examples of methods of oxidizing graphene to obtain graphene oxide include the Staudenmaier method, the Brodie method, the Hofmann method, the Hummers method, and the Tour method. Among these methods, the Tour method is considered to be suitable for production in comprehensive consideration of reaction time, simplicity, toxicity, and the like.

Graphene is transformed into graphene oxide by exposure to a solution in which, for example, potassium permanganate ($KMnO_4$) is dissolved in sulfuric acid ($H_2SO_4$).

Graphene is transformed into graphene oxide by doping with oxygen through $UV/O_3$ treatment using ozone ($O_3$) induced by ultraviolet (UV) (see, for example, NPL 1).

As described above, by introducing an electron-attracting group into graphene, a graphene derivative exhibiting hole transport properties may be obtained. A graphene oxide derivative obtained by introducing an electron-attracting group into graphene oxide exhibiting hole transport properties also exhibits hole transport properties. As described above, as the hole transport material, at least one material selected from the group consisting of, for example, graphene oxide obtained by transformation of graphene which is an electron transport material (hole blocking material), a graphene oxide derivative obtained by introducing an electron-attracting group into graphene oxide, and a graphene derivative obtained by introducing an electron-attracting group into graphene may be used. In this case, it is possible to form the hole injection section 42*b* and the neighboring pixel hole blocking section 42*a* by transforming at least part of the common layer provided to be common to all the pixels P by a chemical reaction. According to the present embodiment, by introducing an electron-attracting group into the graphene oxide as described above, the HOMO level and the LUMO level may be made deeper. By introducing an electron-attracting group into graphene oxide as described above, energy levels may be adjusted in combination with layers around the HIL 42 (the HTL 43 and the EML 44, an electron blocking layer (hereinafter referred to as "EBL") (not illustrated) when the EBL is provided, and the like). As a result, the hole injection efficiency may be further improved. In addition, since the hole injection property and the hole mobility can be adjusted, the carrier balancing may be optimized.

On the other hand, when an electron-donating group is introduced into graphene oxide, a graphene oxide derivative having electron transport properties is obtained as exemplified above as the electron transport material. A graphene derivative formed by introducing an electron-donating group into graphene exhibiting electron transport properties also exhibits electron transport properties. As described above, as the electron transport material (hole blocking material), at least one material selected from the group consisting of, for example, graphene obtained by transformation of graphene oxide which is a hole transport material, a graphene derivative formed by introducing an electron-donating group into graphene, and a graphene oxide derivative formed by introducing an electron-donating group into graphene oxide may be used. In this case as well, it is possible to form the hole injection section 42*b* and the neighboring pixel hole blocking section 42*a* by transforming at least part of the common layer provided to be common to all the pixels P by a chemical reaction. The introduction of an electron-donating group into graphene and the introduction of an electron-donating group into graphene oxide will be described in a second embodiment to be explained later.

Examples of the electron-attracting group include a halogen group such as a fluoro group (—F) or a chloro group (—Cl); an acyl group (—$COR^1$, where $R^1$ represents a hydrocarbon group having 1 to 100 carbon atoms); a halogenated methyl group (—$CH_nX_{4-n}$, where n represents an integer of 0 to 4); an amide group (—$CONR^2R^3$, where $R^2$ and $R^3$ each independently represent a hydrogen atom or a hydrocarbon group having 1 to 100 carbon atoms); and a boron group (—B).

For example, doping or chemical reaction may be used to introduce the electron-attracting group.

Examples of the method for introducing an electron-attracting group into graphene include methods represented by Formulae (3) to (5) given below.

[Chem. 3]

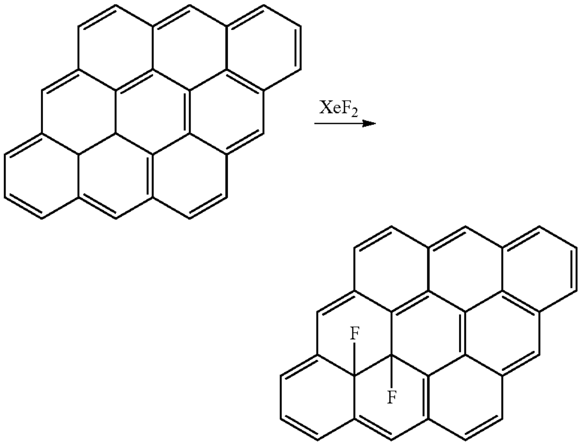

(3)

[Chem. 4]

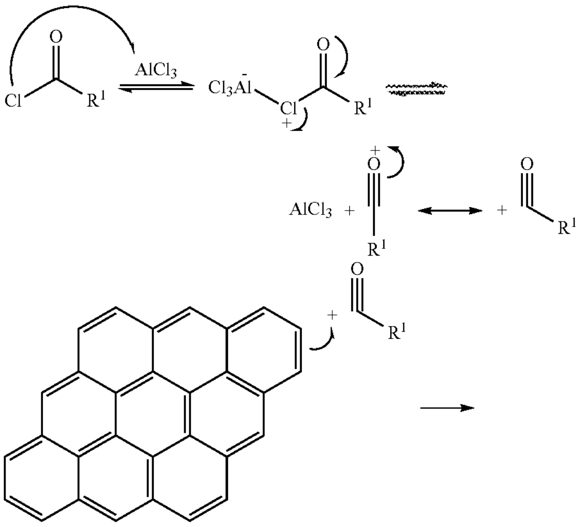

-continued

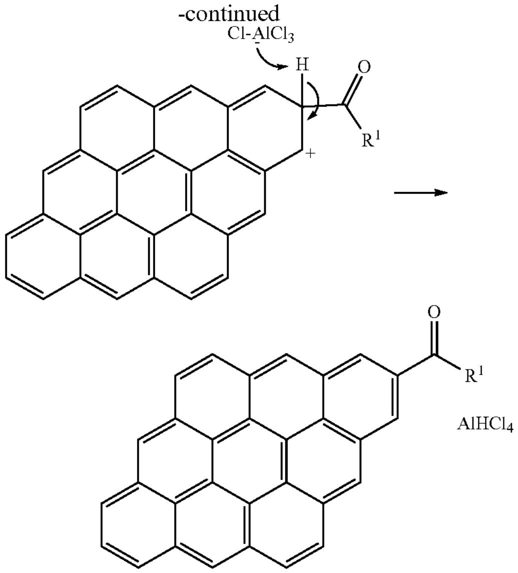

(4)

[Chem. 5]

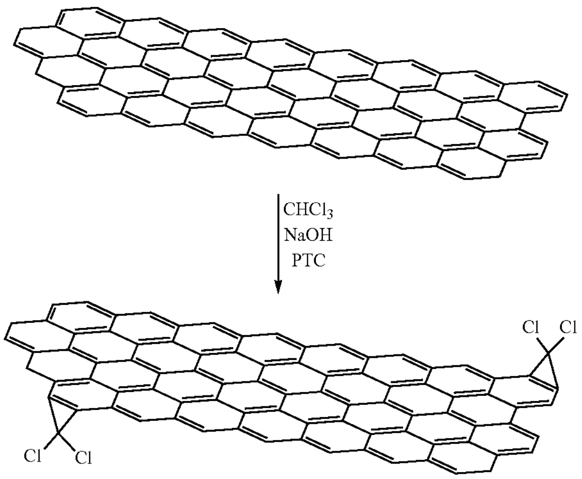

(5)

Formula (3) represents an example of a method for introducing a fluoro group into graphene. For example, a substrate on which a graphene film is formed is put in a closed chamber made of nickel and containing xenon difluoride ($XeF_2$) (1 g or less), is left as it is in the closed environment at 200° C., and then is taken out, whereby graphene may be converted (transformed) into graphene fluoride as represented by Formula (3). Graphene has electron transport properties, whereas graphene fluoride has hole transport properties.

Formula (4) represents an example of a method for introducing an acyl group as an electron-attracting group into graphene. In Formula (4), $R^1$ represents a hydrocarbon group having 1 to 100 carbon atoms.

Formula (5) represents an example of a method for introducing a chloro group as an electron-attracting group into graphene (see NPL 2). Hereinafter, a method for introducing a chloro group into graphene as represented by Formula (5) in the present embodiment will be described, by exemplifying a case where a graphene film equivalent to 200 mg is formed on a substrate. In this case, triethylbenzylammonium chloride ("PCT"; 200 mg of a compound used as a phase-transfer catalyst) is first added to and mixed with a mixed solution of 150-mL water and 200-mL chloroform example, when graphene oxide is used instead of graphene in Formula (3) or (4), an electron-attracting group may be introduced into the graphene oxide.

Examples of the method for introducing an electron-attracting group into graphene oxide also include methods represented by Formulae (6) to (11) given below.

[Chem. 6]

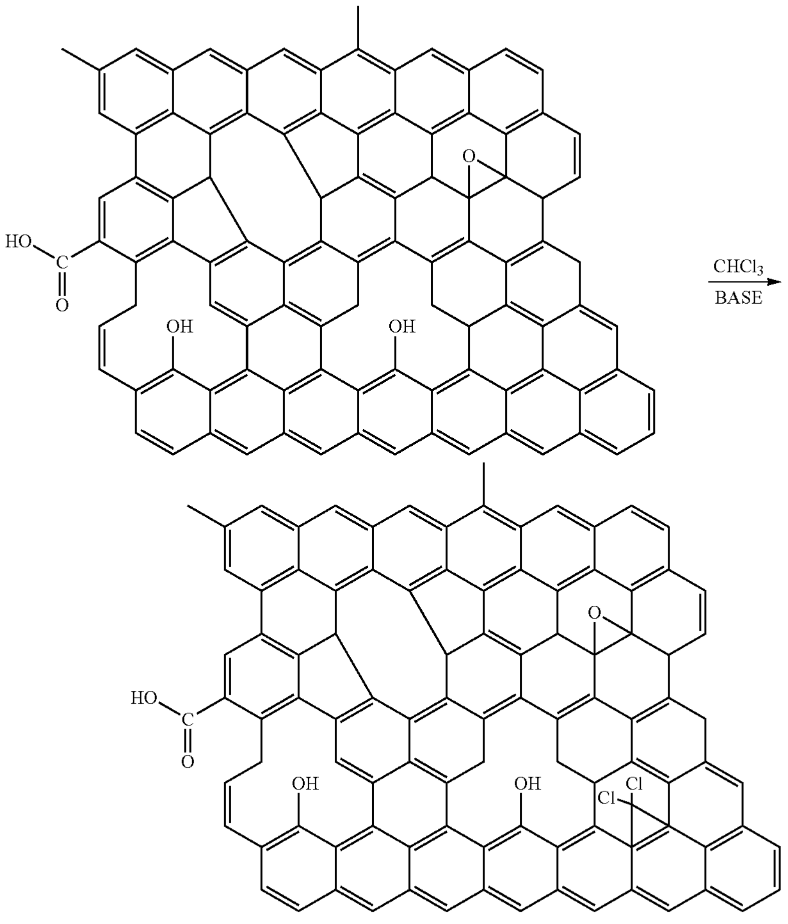

(6)

($CHCl_3$). Subsequently, the substrate on which the graphene film is formed is immersed in the mixed solution. Then, in a state where the substrate is immersed in the mixed solution, ultrasonic waves are applied to the mixed solution for about four hours, and then 200-g sodium hydroxide (NaOH) and 200-mL chloroform are added to the mixed solution. Subsequently, the substrate is rapidly rotated for 24 hours while circulating the mixed solution in a closed device. Thereafter, the mixed solution is returned to ambient temperature, and the substrate is moved to another container. Then, the substrate is washed with 5-L water while being rotated. Thereafter, the substrate is further washed with large amounts of acetone and ethanol separately. Subsequently, the substrate is further washed with hexane, chloroform, ethanol, water, ethanol, and water in this order. Finally, the washed substrate is dried in a vacuum heating environment at 70° C. for about five hours.

An electron-attracting group may also be introduced into graphene oxide by a method similar to the method for introducing an electron-attracting group into graphene. For

[Chem. 7]

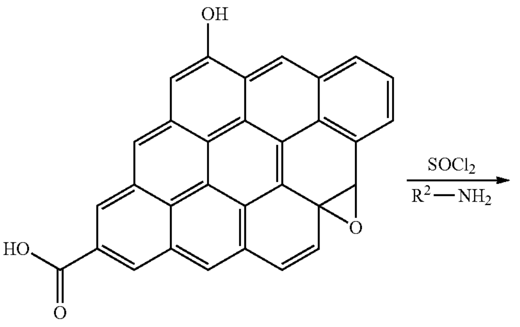

-continued
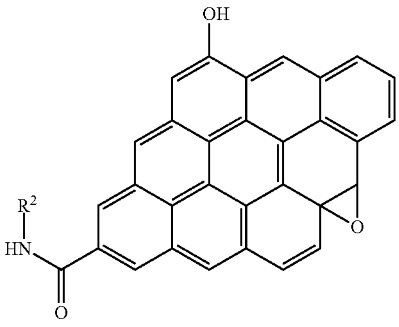
(7)
[Chem. 8]
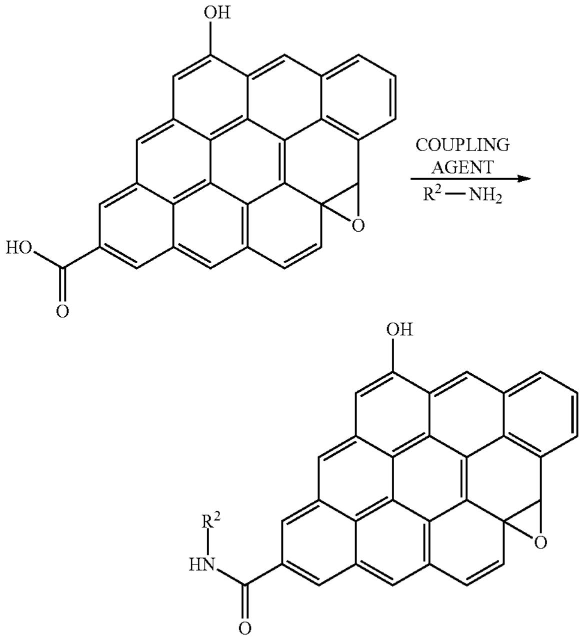
(8)
[Chem. 9]
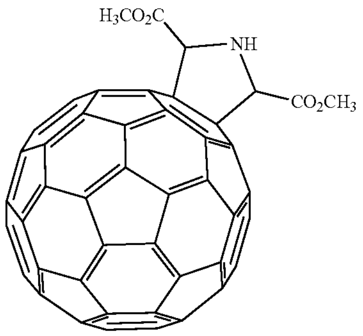
+

-continued
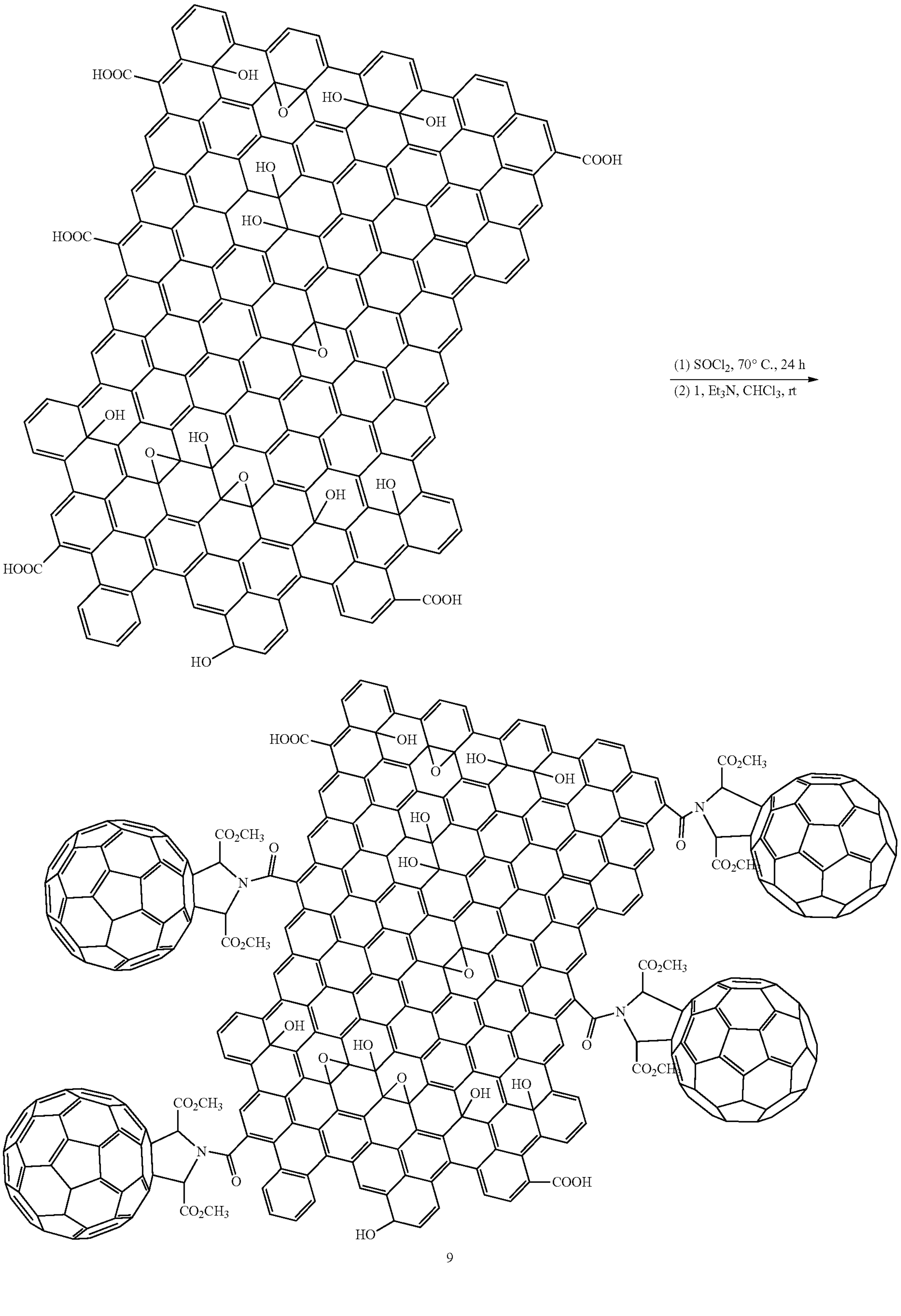
9

[Chem. 10]
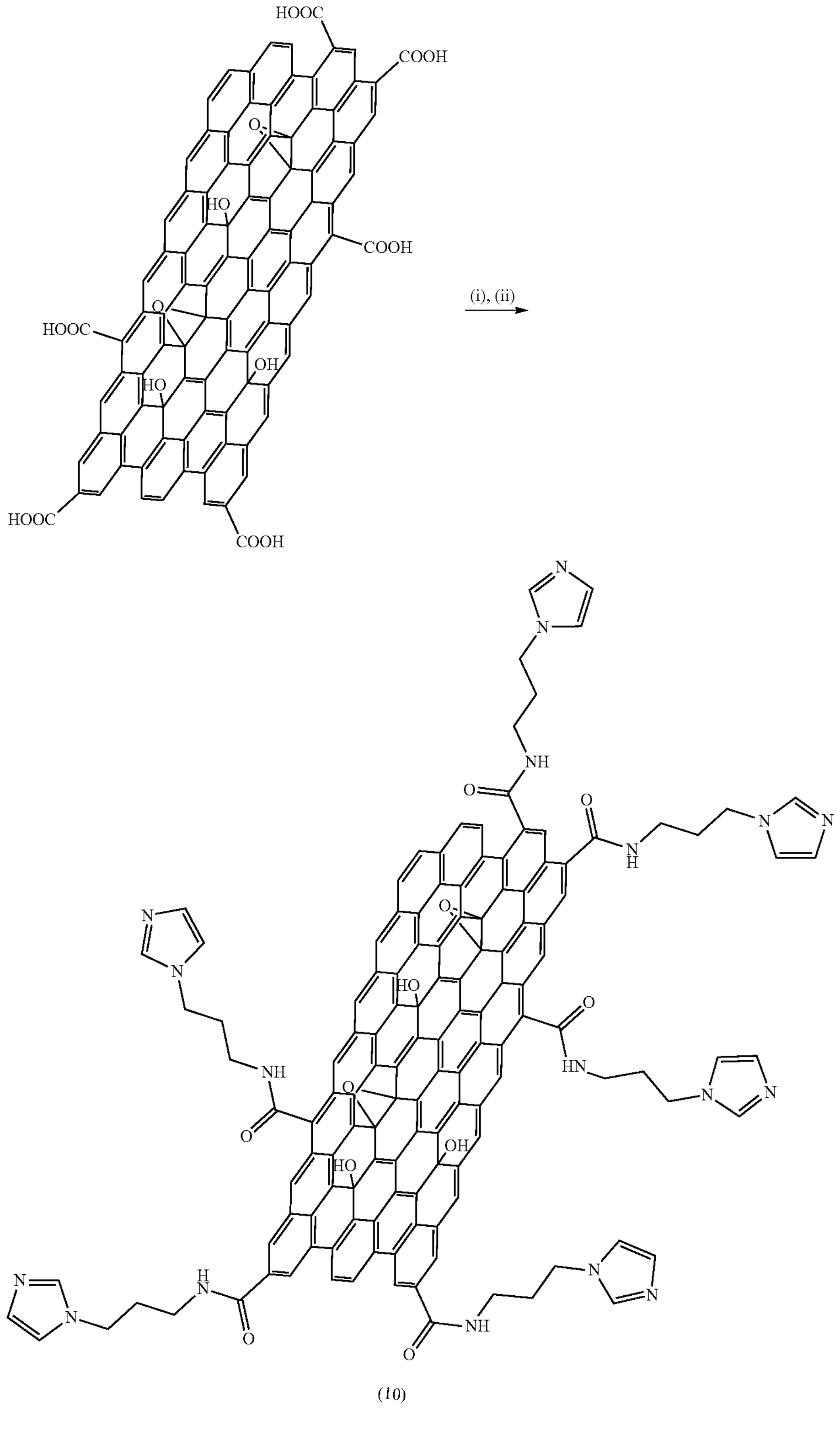
(10)

[Chem. 11]

(11)

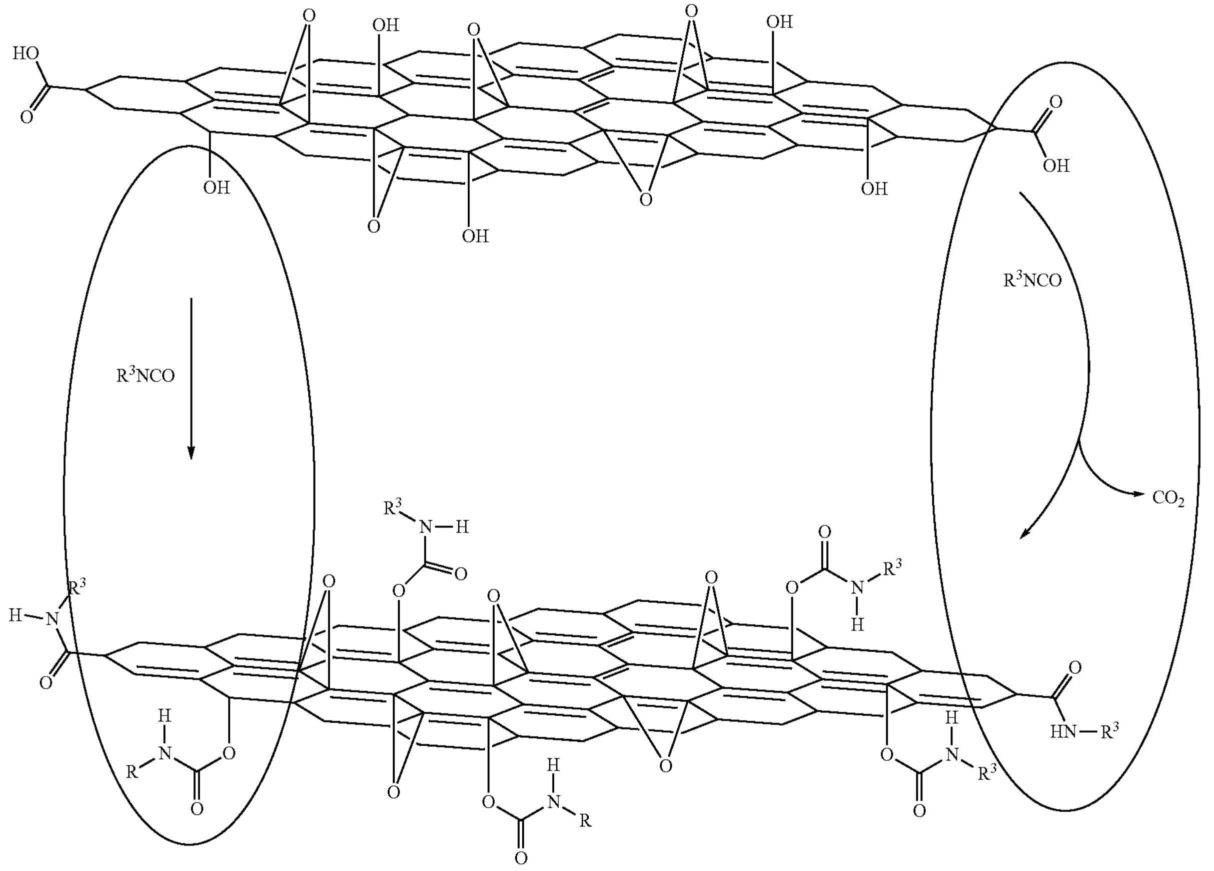

Formula (6) represents an example of a method for introducing a chloro group into graphene oxide. In Formula (6), as a base, for example, a Lewis base such as trialkylamine ($NR^3$, where R represents an alkyl group having 2 to 20 carbon atoms) may be used.

Formulae (7) to (11) each represent an example of a method for introducing an amide group into graphene oxide.

In Formula (7) and Formula (8), $R^2$ represents an alkyl group, an allyl group, an allyl group derivative, an epoxy group, or the like, having 1 to 100 carbon atoms. In Formula (8), as a coupling agent, for example, at least one compound selected from the group consisting of N,N'-dicyclohexylcarbodiimide ("DCC"), 1-(3-dimethylaminopropyl)-3-ethylcarbodiimide ("EDC"), and 1-hydroxybenzotriazole ("HOBT") may be used. In the examples represented by Formulae (7) and (8), a —C(═O)— group (ketone group) is directly bonded to the conjugated skeleton of graphene, and therefore the electron-attracting property is dominant.

Formula (9) represents an example in which graphene oxide is converted into a graphene oxide-$C_{60}$ compound having an amide bond, as an example of a method for introducing an amide group into graphene oxide (see, for example, NPL 3). In the case of using the example represented by Formula (9) in the present embodiment, graphene oxide is reacted first with thionyl chloride ($SOCl_2$) to form acid chloride (acyl chloride) of graphene oxide, for example. Subsequently, the acid chloride of graphene oxide and pyrrolidine fullerene are subjected to a condensation reaction. Thus, a graphene oxide-$C_{60}$ compound having an amide bond may be obtained.

Formula (10) represents another example of the method for introducing an amide group into graphene oxide (for example, see NPL 4). In the case of using the example represented by Formula (10) in the present embodiment, first, (i) a substrate on which a film made of, for example, 50-mg graphene oxide is formed is rotated in 20-mL oxalyl chloride at 80° C. for 24 hours to generate a carboxy group, thereby transforming the graphene oxide to carboxylic acid chloride. Subsequently, the substrate is heated to above 80° C. (about 100° C.) to remove excess oxalyl chloride. Subsequently, the substrate is washed with tetrahydrofuran ("THF"), then rotated at high speed, and vacuum-dried at room temperature. Subsequently, (ii) the carboxylic acid chloride of graphene oxide formed on the substrate is reacted with 5-mL 1-(3-aminopropyl)imidazole in an oxygen-free dry environment at 100° C. for 18 hours. After the reaction, the surface of the substrates is washed four times with 20-mL dichloromethane and is washed two times with 20-mL diethyl ether, and after the above washing, the substrate is vacuum-dried. Thus, the substrate on which there is formed a graphene oxide film transformed by the imidazole and having the amide bond may be obtained.

Formula (11) represents an example in which a phenyl isocyanate group is introduced into graphene oxide, as an example of a method for introducing an amide group into graphene oxide (for example, see NPL 5). In Formula (11), $R^3$ represents a benzene ring. In the case of using the example represented by Formula (11) in the present embodiment, for example, a substrate on which a graphene oxide film equivalent to 200 mg is provided is put in dimethylformamide ("DMF"), 20-g phenyl isocyanate is added while the substrate being rotated, and then the substrate is rotated for one week. After one week has passed, the substrate is washed with 25-mL dichloromethane ("DCM"). Specifically, the substrate is rotated in the DCM for 10 minutes at a rotation speed of 1000 rpm. Thereafter, the substrate is washed with 50-mL chloroform ($CHCl_3$). To be specific, the substrate is rotated in the $CHCl_3$ for 10 minutes at a rotation speed of 11000 rpm.

As described above, a hole transport material having a lower energy level may be obtained by introducing an electron-attracting group into graphene oxide which is a hole transport material, for example, by adopting or applying the techniques described in the above-mentioned NPLs.

The above-described methods are examples, and the method for introducing an electron-attracting group into graphene or graphene oxide is not limited to the above-described methods. The method for obtaining a goal graphene derivative or a goal graphene oxide derivative is not limited to one method.

As discussed above, for example, by converting part of the common layer made of the organic insulating material or the electron transport material into a hole transport material, the hole injection section 42*b* made of the hole transport material and the neighboring pixel hole blocking section 42*a* made of the organic insulating material or the electron transport material that has not been converted into the hole transport material may be integrally formed in the same layer. As described above, when the neighboring pixel hole blocking section 42*a* is, for example, graphene derived from an organic insulating material, by converting the organic insulating material into a hole transport material and an electron transport material, the hole injection section 42*b* made of the hole transport material and the neighboring pixel hole blocking section 42*a* made of the electron transport material may be integrally formed in the same layer. Thus, a hole blocking material for forming the neighboring pixel hole blocking section 42*a* may be the same as or different from a hole blocking material prior to conversion (transformation) into a hole transport material.

As described above, the neighboring pixel hole blocking section 42*a* may be formed by, for example, transforming a hole transport material by a chemical reaction. For example, graphene oxide is converted into graphene by reduction (reduced graphene oxide). Graphene reduced from graphene oxide (reduced graphene oxide) has some defects but has electron transport properties (e.g., approximately $2\times10^2$ S/m) (see, for example, NPL 6).

Examples of known methods of reducing graphene oxide include a heating reduction method in which graphene oxide is heated to a high temperature to separate oxygen-containing groups, and a chemical reduction method using a reducing agent.

Examples of the chemical reduction method include a reduction method using hydrazine ($N_2H_4$) as a reducing agent, as represented in Formula (12) given below (see, for example, NPL 6). Note that the following formula shows a reaction scheme of graphene oxide and hydrazine as an example of the chemical reduction method. Note that, for convenience of illustration, only part of graphene oxide involved in the reaction with hydrazine is shown in the following formula.

[Chem. 12]

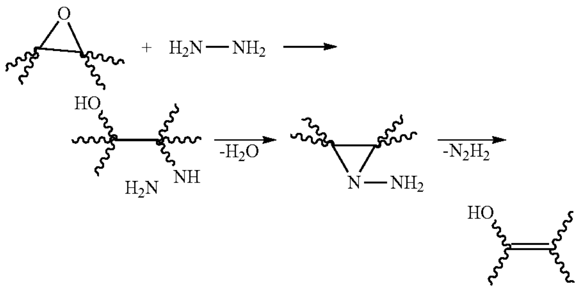

(12)

It is also known that in the reduction of graphene oxide, sodium borohydride ($NaBH_4$), ascorbic acid, hydrogen iodide (HI), or the like can be used as a reducing agent instead of hydrazine. Graphene oxide can be reduced in an aqueous solution or in a thin film state.

It is also known that graphene oxide is reduced to graphene by irradiation with a femtosecond laser (see, for example, NPL 7).

Thus, by converting part of the common layer made of, for example, graphene oxide which is a hole transport material into an electron transport material, the neighboring pixel hole blocking section 42*a* made of the electron transport material and the hole injection section 42*b* made of graphene oxide that has not been converted into the electron transport material may be integrally formed in the same layer.

The thickness of the HIL 42 is more preferably 0.5 nm or more for enhancing the hole injection property. The thickness of the HIL 42 is more preferably 30 nm or less for adjusting an optical path length.

The hole injection section 42*b* and the neighboring pixel hole blocking section 42*a* preferably have substantially the same thickness as described above, but they may have different thicknesses from each other. In a case where the hole injection section 42*b* is formed by transforming an organic insulating material by a chemical reaction, when the thickness of a portion made of the organic insulating material that has not been transformed is in a range from 0.5 nm to 3 nm, it is possible to transport positive holes to the EML 44 by a tunneling effect. Because of this, when the thickness of the HIL 42 is greater than 3 nm at which the tunneling effect is not expressed, and the thickness of the portion made of the organic insulating material that has not been transformed is in a range from 0.5 nm to 3 nm at which the tunneling effect is expressed, the hole injection section 42*b* may be provided only on the surface of the HIL 42.

A known hole transport material may be used for the HTL 43. The hole transport material is not limited to any specific material, and for example, at least one hole transport material selected from the group consisting of the hole transport materials exemplified above may be cited.

The hole transport material used for the HTL 43 and the hole transport material used for the hole injection section 42*b* of the HIL 42 are appropriately selected so that the HOMO level, the LUMO level, and the gap between the HOMO level and the LUMO level in each of the HTL 43 and the hole injection section 42*b* have the relationship described in FIG. 3, for example.

When graphene oxide is used, for example, for at least one of the HTL 43 and the hole injection section 42*b*, the hole mobility and the band gap of the graphene oxide may be adjusted by the concentration of oxygen (in other words, the level of oxidation). By lowering the concentration of oxygen in the graphene oxide, the hole mobility may be increased and the band gap may fall within a range from 0 eV to 3.39 eV.

When graphene oxide is used for the hole injection section 42*b*, the concentration of oxygen in the graphene oxide is preferably 25% or more, and more preferably 40% or more, in order to improve the hole injection property from the hole injection section 42*b* to the HTL 43. When graphene oxide is used for the hole injection section 42*b*, the concentration of oxygen in the graphene oxide is preferably 70% or less, and more preferably 60% or less, in order to maintain the hole injection property from the hole injection section 42*b* to the HTL 43. Here, the concentration of oxygen in the graphene oxide refers to the ratio (O/C) of oxygen atoms (O) to carbon atoms (C).

On the other hand, when graphene oxide is used for the HTL 43, the concentration of oxygen in the graphene oxide is preferably 30% or more, and more preferably 35% or more, in order to improve the hole injection property from the HIL 42 to the HTL 43 by reducing a HOMO gap as much as possible. When graphene oxide is used for the HTL 43, the concentration of oxygen in the graphene oxide is preferably 60% or less, and more preferably 50% or less from the viewpoint of chemical stability of the graphene oxide. Here, the HOMO gap refers to a barrier against the hole injection from the HIL 42 to the HTL 43 (an energy difference between the HOMO levels of the HIL 42 and the HTL 43).

The concentration of oxygen in the graphene oxide may be adjusted by, for example, adjusting the concentration of the oxide, the strength of the oxide, or the reaction time between carbon and the oxide. For example, when graphene is oxidized by the $UV/O_3$ treatment as described above, the concentration of oxygen in the obtained graphene oxide can be increased by the reaction of the graphene in the presence of acid under strong $UV/O_3$ conditions for a long time, while the concentration of oxygen in the obtained graphene oxide can be lowered by the reaction of the graphene under weak $UV/O_3$ conditions for a shorter time.

The thickness of the HTL 43 may be set in a similar manner as in a known technique. The thickness of the HTL 43 is set in a range from 30 nm to 300 nm, for example, in order to adjust the optical path length.

As described above, the ETL 45 and the EIL 46 are each a common layer provided to be common to all the pixels P. Because of this, in the light-emitting element ES illustrated in FIG. 1, the ETL 45 and the EIL 46 are each made of an electron transport material common to all the pixels P. A known electron transport material may be used for the ETL 45 and the EIL 46. The electron transport material used for the ETL 45 and the EIL 46 is not limited to any specific material, and for example, at least one electron transport material selected from the group consisting of the electron transport materials exemplified above may be used.

As depicted in FIG. 3, in each light-emitting element ES, the EIL 46 is preferably formed of a material whose LUMO level is shallower (higher) than the LUMO level of the ETL 45. This makes it easier for electrons to enter the ETL 45 than the EIL 46. Thus, for each of the light-emitting elements ES, electrons may be efficiently injected from the EIL 46 into the ETL 45, and thus the EML 44 may efficiently emit light.

In each light-emitting element ES, the EIL 46 is preferably formed of a material whose HOMO level is shallower (higher) than the HOMO level of the ETL 45. With this, positive holes are unlikely to leak from the ETL 45 to the EIL 46, and thus the EML 44 may efficiently emit light.

Further, as depicted in FIG. 3, the EIL 46 is preferably formed of a material having a small gap between the HOMO level and the LUMO level. In FIG. 3, such a material is used that the gap between the HOMO level and the LUMO level in the EIL 46 is smaller than the gap between the HOMO level and the LUMO level in the ETL 45. This makes it possible to provide the display device 1, in which electrons easily move from the EIL 46 to the ETL 45, low voltage driving can be performed, and the luminous efficiency is high.

As described above, in the case where the light-emitting element ES is a QLED, the HOMO level and the LUMO level are replaced with a conduction band level and a valence band level in sequence.

The electron transport material used for the EIL 46 and the electron transport material used for the ETL 45 are appropriately selected so that the HOMO level, the LUMO level, and the gaps between the HOMO level and the LUMO level in each of the EIL 46 and the ETL 45 have the relationship described in FIG. 3, for example.

In the present embodiment, the thicknesses of the ETL 45 and the EIL 46 may be set in a similar manner as in a known technique. The thickness of the ETL 45 is set in a range from 5 nm to 30 nm, for example. The thickness of the EIL 46 is set in a range from 0.1 nm to 5 nm, for example.

The EML 44 is a layer having a function to emit light by recombining positive holes ($h^+$) injected from the anode electrode 41 and electrons ($e^-$) injected from the cathode electrode 47.

When the light-emitting element ES is an OLED, in the light-emitting element ES, light is emitted in a process in which excitons generated by the recombination of positive holes and electrons in the EML 44 by a drive current between the anode electrode 41 and the cathode electrode 47 transit to a ground state. When the light-emitting element ES is a QLED, light (fluorescence or phosphorescence) is emitted in a process in which excitons generated by the recombination of positive holes and electrons in the EML 44 by a drive current between the anode electrode 41 and the cathode electrode 47 transit from a conduction band level to a valence band level of the quantum dot. However, the light-emitting element ES may be a light-emitting element other than the OLED or the QLED (e.g., an inorganic light-emitting diode, etc.).

The EML 44 is patterned on the HIL 42 and HTL 43 in an island shape for each of the pixels P (in other words, for each of the light-emitting elements ES) to cover at least the opening BKa of the bank BK corresponding to each pixel P.

When the light-emitting element ES is an OLED, the EML 44 is made of an organic luminescent material such as a low molecular weight fluorescent colorant or a metal complex. Note that the organic luminescent material may be a phosphorescent luminescent material or a fluorescence light-emitting material. The EML 44 may be formed of a two-component system of a host material that transports positive holes and electrons and a luminescent dopant material that emits light as a luminescent material. Alternatively, the EML 44 may be made of a luminescent material alone.

When the light-emitting element ES is a QLED, the EML 44 includes, for example, nano-sized quantum dots (semiconductor nanoparticles) as a luminescent material. A known quantum dot can be employed for this quantum dot. This quantum dot may contain, for example, at least one semiconductor material made of at least one element selected from the group consisting of cadmium (Cd), sulfur (S), tellurium (Te), selenium (Se), zinc (Zn), indium (In), nitrogen (N), phosphorus (P), arsenic (As), antimony (Sb), aluminum (Al), gallium (Ga), lead (Pb), silicon (Si), germanium (Ge), and magnesium (Mg). The quantum dots may be of a two-component core type, a three-component core type, a four-component core type, a core-shell type, or a core multi-shell type. Further, the quantum dots may contain nanoparticles doped with at least one of the elements described above or may have a compositionally graded structure.

As illustrated in FIG. 1, the light-emitting element RES includes an anode electrode 41R, an HIL 42R, an HTL 43R, an EML 44R, the ETL 45, the EIL 46, and the cathode electrode 47. The light-emitting element GES includes an anode electrode 41G, an HIL 42G, an HTL 43G, an EML 44G, the ETL 45, the EIL 46, and the cathode electrode 47. The light-emitting element BES includes an anode electrode 41B, an HIL 42B, an HTL 43B, an EML 44B, the ETL 45, the EIL 46, and the cathode electrode 47. The HIL 42R is the hole injection section 42*b* of the HIL 42 in the pixel RP. The HIL 42G is the hole injection section 42*b* of the HIL 42 in the pixel GP. The HIL 42B is the hole injection section 42*b* of the HIL 42 in the pixel BP.

The sealing layer 5 is a layer that prevents penetration of foreign matters such as water or oxygen into the light-emitting element layer 4. The sealing layer 5 includes, for example, an inorganic sealing film 51 covering the upper electrode (the cathode electrode 47 in the present embodiment), an organic buffer film 52 on the inorganic sealing film 51, and an inorganic sealing film 53 on the organic buffer film 52.

The inorganic sealing film 51 and the inorganic sealing film 53 are transparent inorganic insulating films and can be formed of inorganic insulating films such as silicon oxide films or silicon nitride films formed by chemical vapor deposition (CVD). The organic buffer film 52 is a transparent organic insulating film having a flattening effect and can be made of a coatable organic material such as acrylic. The organic buffer film 52 can be formed by, for example, ink-jet coating, and a bank (not illustrated) for stopping droplets may be provided in the frame region NDA.

A function film (not illustrated) is provided on the sealing layer 5. The function film has, for example, at least one of an optical compensation function, a touch sensor function, and a protection function.

Method for Manufacturing Display Device 1

Next, a method for manufacturing the display device 1 will be described.

Figure 4:
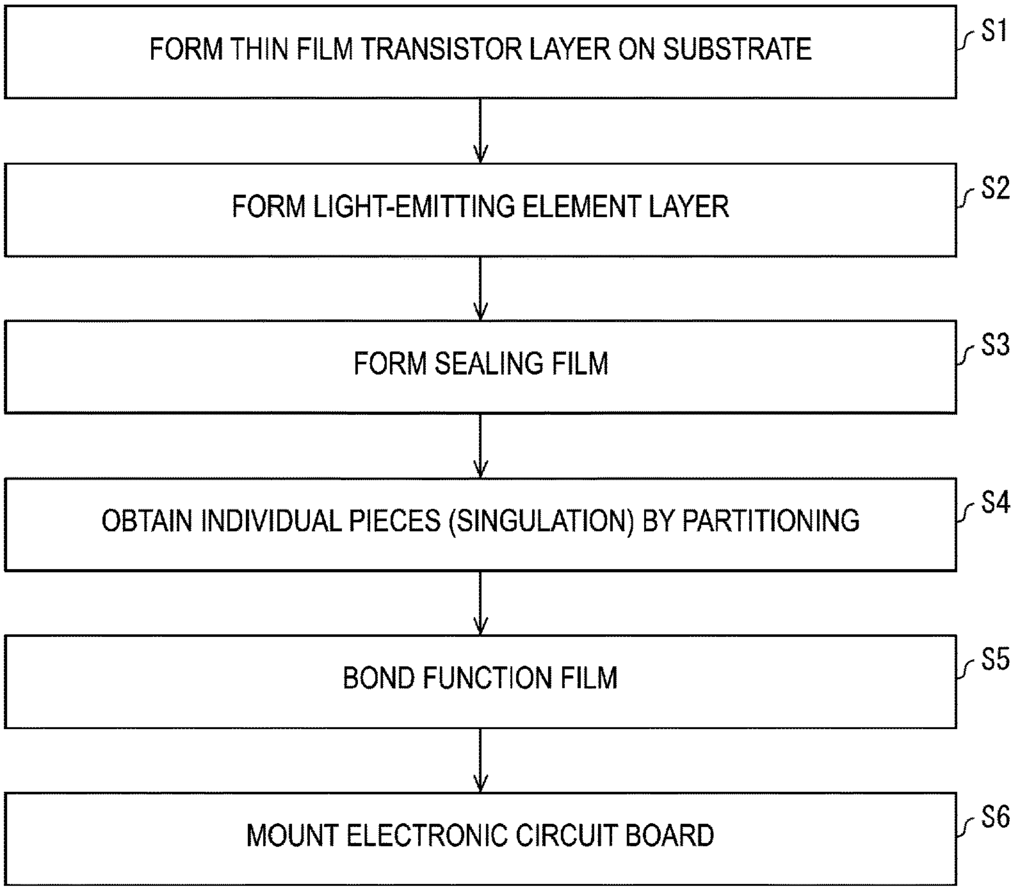
FIG. 4 is a flowchart illustrating manufacturing steps of the display device according to the first embodiment in order of the steps.

FIG. 4 is a flowchart illustrating manufacturing steps of the display device 1 in order of the steps.

As illustrated in FIG. 4, in the manufacturing steps of the display device 1 according to the present embodiment, first, the thin film transistor layer 3 including the plurality of thin film transistors 31 and the wiring lines 32, and the flattening film 33 covering the thin film transistors 31 and the wiring lines 32, is formed on the substrate 2 (step S1). Subsequently, the light-emitting element layer 4 is formed on the thin film transistor layer 3 (step S2). Subsequently, the sealing layer 5 is formed on the light-emitting element layer 4 so as to cover the light-emitting element layer 4 (step S3). As described above, the inorganic sealing film 51 and the inorganic sealing film 53 can be formed by, for example, CVD. The organic buffer film 52 can be formed using a coating method, such as an ink-jet method. Subsequently, a layered body including the substrate 2, the thin film transistor layer 3, the light-emitting element layer 4, and the sealing layer 5 is partitioned to obtain a plurality of individual pieces (step S4). Subsequently, the function film (not illustrated) is bonded to the obtained individual piece (step S5). Subsequently, an electronic circuit board (e.g., an IC chip and an FPC) (not illustrated) is mounted on part of the frame region NDA (terminal portion TS) outside the display region DA in which the plurality of pixels P are formed (step S6). In this manner, the display device 1 according to the present embodiment is manufactured. Note that steps S1 to S6 are performed by a display device manufacturing apparatus (including film formation apparatuses that perform the respective steps S1 to S3).

When manufacturing a flexible display device as the display device 1, a step of forming a resin layer on a transparent support substrate (e.g., mother glass) and a step of forming a barrier layer on the resin layer may be further provided before step S1. In this case, in step S1, the thin film transistor layer 3 is formed on the barrier layer. After forming the sealing layer 5 in step S3, an upper face film is bonded on the sealing layer 5. Thereafter, the support substrate is peeled off from the resin layer by irradiation with laser light or the like, and a lower face film is bonded to a lower face of the resin layer. Thereafter, in step S4, a layered body including the lower face film, the resin layer, the barrier layer, the thin film transistor layer 3, the light-emitting element layer 4, the sealing layer 5, and the upper face film is partitioned to obtain a plurality of individual pieces.

Figure 5:
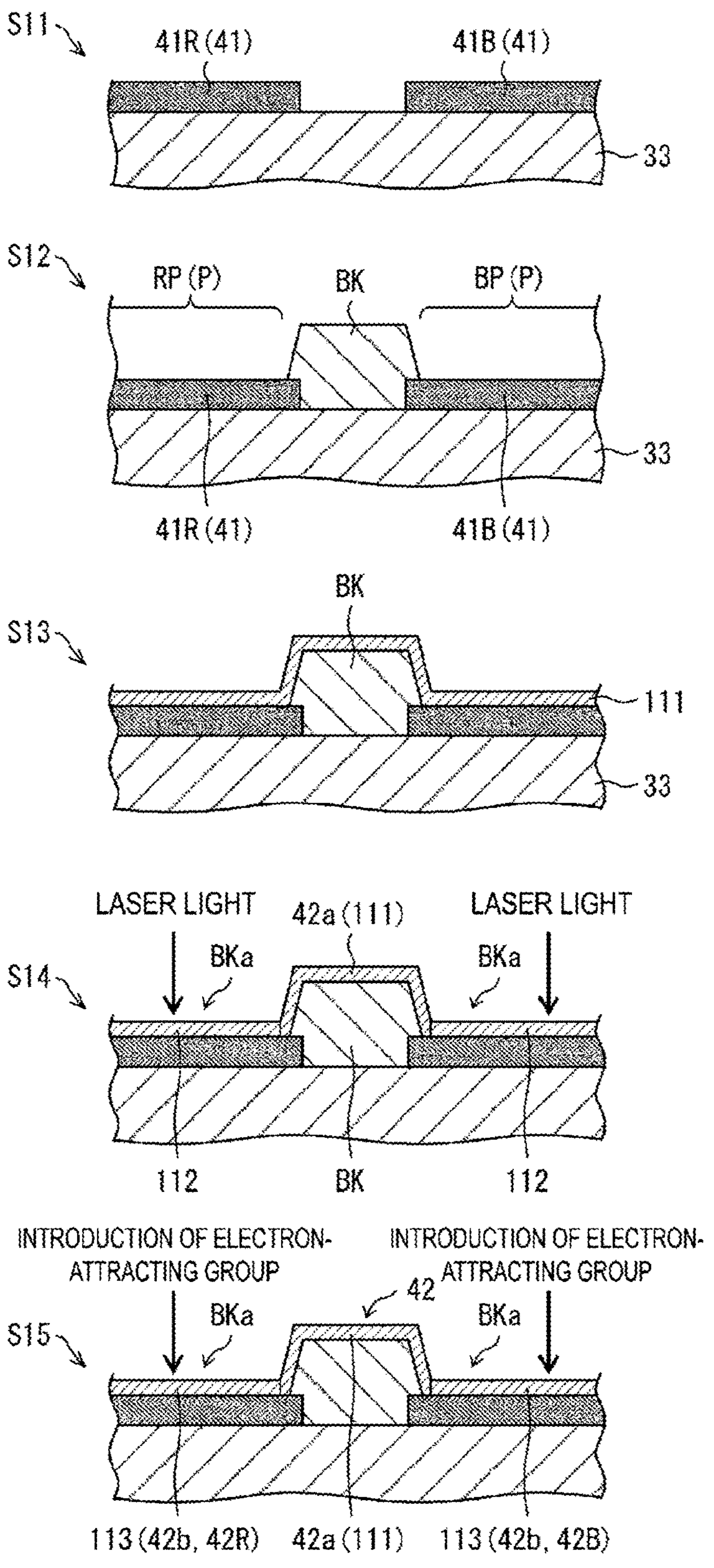
FIG. 5 includes cross-sectional views illustrating some of steps of forming a light-emitting element layer in the display device according to the first embodiment in order of the steps.
Figure 6:
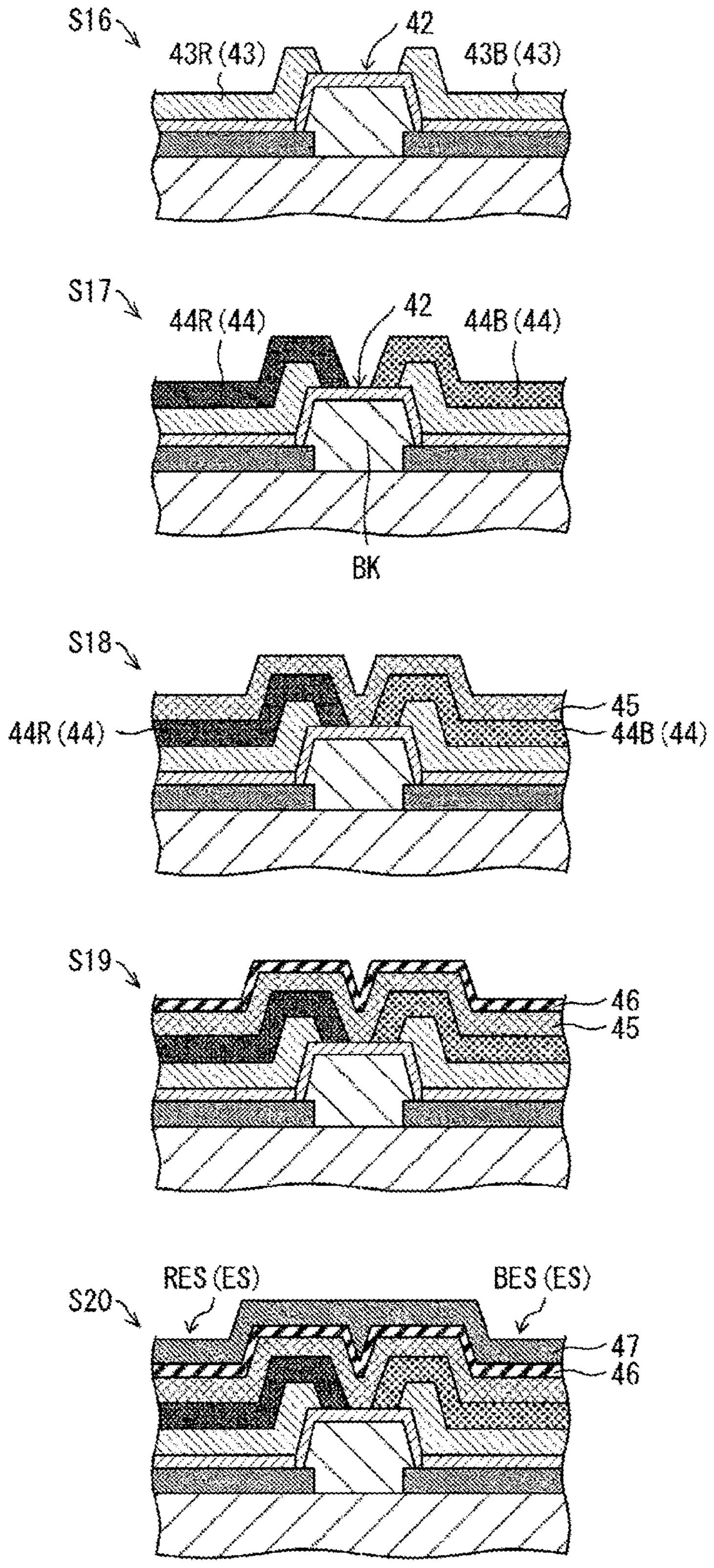
FIG. 6 includes other cross-sectional views illustrating some of the steps of forming the light-emitting element layer in the display device according to the first embodiment in order of the steps.

FIGS. 5 and 6 each illustrate cross-sectional views of some of the steps of forming the light-emitting element layer 4 in step S2 in order of the steps. FIG. 6 illustrates manufacturing steps after the manufacturing steps illustrated in FIG. 5. FIGS. 5 and 6 illustrate cross sections corresponding to part of a cross section taken along a line B-B' illustrated in FIG. 2. Step S2 includes steps S11 to S15 illustrated in FIG. 5 and steps S16 to S20 illustrated in FIG. 6.

In the following, a case of forming the hole injection section 42*b* and the neighboring pixel hole blocking section 42*a* by transforming at least part of the organic insulating film provided to be common to all the pixels P as the common layer by a chemical reaction will be described as an example.

In step S2, first, as illustrated in S11 in FIG. 5, the anode electrode 41 is patterned as the lower electrode on the flattening film 33 in the thin film transistor layer 3 in an island shape for each pixel P (step S11, step of forming the lower electrode). Any of various known methods for forming an anode electrode, such as sputtering, a vacuum vapor deposition technique, CVD, plasma CVD, and a printing method, can be used to form the anode electrode 41.

Subsequently, as illustrated in S12 in FIG. 5, the bank BK to serve as a pixel separation film is formed on the flattening film 33 in such a manner as to cover a pattern edge of the anode electrode 41 of each pixel P (step S12). The bank BK can be formed by applying an organic material such as polyimide or acrylic on the flattening film 33 so as to cover the anode electrodes 41 and then patterning the applied organic material by photolithography.

Subsequently, as illustrated in S13 in FIG. 5, on the anode electrodes 41 and the bank BK, an organic insulating film 111 is formed by film-forming an organic insulating material to be finally converted into a material having hole transport properties through a chemical reaction in a solid-like form over all the pixels P (step S13, first film formation step).

Examples of the organic insulating film 111 include resin films made of organic insulating materials such as PI, PEI, and PAN, as described above. As previously mentioned, these organic insulating materials have sufficient heat resistance and contain carbon so that these organic insulating materials are converted into graphene by exposure to laser light. Graphene has electron transport properties, but is converted into graphene oxide having hole transport properties by an oxidation reaction.

In the following, a case in which a resin that serves as a graphene precursor material that is converted into graphene by exposure to laser light as described above is used for the organic insulating film 111 will be described as an example.

The organic insulating film 111 can be formed by applying a resin precursor such as a PI precursor, a PEI precursor, or a PAN precursor using a known thin film forming technique such as spin coating, and curing the applied resin precursor with heat or light (e.g., ultraviolet light).

Subsequently, as illustrated in S14 in FIG. 5, only the inside of each pixel P (specifically, the inside of the opening BKa of the bank BK) is selectively irradiated with laser light.

In the present embodiment, as an example, PI was used for the organic insulating film 111 and a laser system using a $CO_2$ laser as the laser source was used. Further, as an example, the pulse time width was approximately 14 μs, the laser excitation wavelength was 10.6 μm, the beam size width was approximately 120 μm, the laser power was in a range from 2.4 W to 5.4 W, the scan rate was 3.5 inches/$s^{-1}$, and the number of pulses per inch was 1000 p.p.i.

Figure 7:
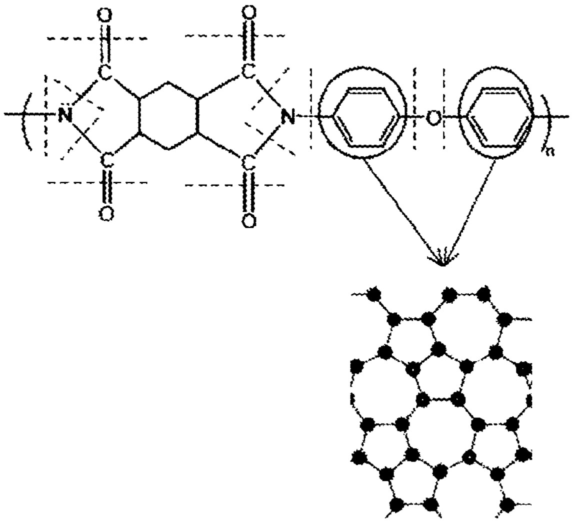
FIG. 7 is a diagram illustrating a thermal reaction of polyimide by laser irradiation.

FIG. 7 is a diagram illustrating a thermal reaction of PI by laser irradiation. As illustrated in FIG. 7, the thermal reaction of PI by laser irradiation breaks heteroatom bonds (e.g., C═O bonds, C—N bonds) of PI and the remaining aromatic compounds recombine to form graphene.

According to the present embodiment, in this manner, by irradiating only the inside of each pixel P (specifically, the opening BKa in the bank BK) with laser light, the organic insulating film 111 in each pixel P is converted into graphene. Thus, a graphene film 112 is formed in each pixel P, and the neighboring pixel hole blocking section 42*a* made of the organic insulating film 111 is formed between the adjacent pixels P to block the transportation of positive holes between the light-emitting elements ES of the pixels P (step S14, first transformation step, first carrier injection section transformation step).

Subsequently, as illustrated in S15 in FIG. 5, for example, an electron-attracting group is introduced into the graphene constituting the graphene film 112. With this, the graphene film 112 is transformed to a graphene derivative film 113 made of a graphene derivative having been subjected to chemical modification with the electron-attracting group (step S15, first transformation step, first carrier injection section transformation step).

The method of introducing an electron-attracting group into graphene to transform the graphene film 112 to the graphene derivative film 113 is not particularly limited, and the various methods described above may be used.

In the present embodiment, as an example, the substrate with the graphene film 112 formed thereon obtained in the above-described step S14 was put in a closed chamber made of nickel and containing $XeF_2$ (1 g or less) and left in a closed environment at 200° C., and then was taken out. As a result, graphene was converted into graphene fluoride as represented by Formula (3) discussed above. Thus, a graphene fluoride film was formed as the graphene derivative film 113. However, as described above, the method of introducing an electron-attracting group into graphene is not limited to the above method. Any of various known methods may be used as a method for introducing an electron-attracting group into graphene.

Subsequently, as illustrated in S16 in FIG. 6, the HTL 43 is formed, for each pixel P, on the HIL 42 provided with the neighboring pixel hole blocking section 42*a* and the hole injection section 42*b* (step S16, step of forming a first carrier transport layer). At this time, the HTL 43 is formed in an island shape for each pixel P (in other words, for each light-emitting element ES) to cover at least the opening BKa of the bank BK corresponding to each pixel P. The method of forming the HTL 43 is not limited to any specific one as long as the method is capable of forming a fine pattern required for the light-emitting element ES. Any of various known methods for forming an HTL, such as vapor deposition and an ink-jet method, may be used to form the HTL 43.

Subsequently, as illustrated in S17 in FIG. 6, the EML 44 is formed, for each pixel P, on the HIL 42 to cover the HTL 43 (step S17, step of forming a light-emitting layer). At this time, the EML 44 is formed in an island shape for each pixel P (in other words, for each light-emitting element ES) to cover at least the opening BKa of the bank BK corresponding to each pixel P. The method of forming the EML 44 is not limited to any specific one as long as the method is capable of forming a fine pattern required for the light-emitting element ES as in the HTL 43. Any of various known methods for forming an EML, such as vapor deposition and an ink-jet method, may be used to form the EML 44.

Subsequently, as illustrated in S18 in FIG. 6, the ETL 45 is formed on the EML 44 (step S18, step of forming a second carrier transport layer). Then, as illustrated in S19 in FIG. 6, the EIL 46 is formed on the ETL 45 (step S19). In the present embodiment, the ETL 45 and the EIL 46 are provided as common layers common to all the pixels P as illustrated in FIG. 1, but the present embodiment is not limited thereto. Similar to the HTL 43 and EML 44, the ETL 45 and EIL 46 may each be formed in an island shape for each pixel P (in other words, for each light-emitting element ES) to cover at least the opening BKa of the bank BK corresponding to each pixel P. Any of various known methods for forming an ETL and EIL, such as vapor deposition and an ink-jet method, may be used to form the ETL 45 and EIL 46.

Subsequently, as illustrated in S20 in FIG. 6, the cathode electrode 47 is formed as the upper electrode on the EIL 46 (step S20, step of forming the upper electrode). Any of various known methods for forming a cathode electrode, such as sputtering, a vacuum vapor deposition technique, CVD, plasma CVD, and a printing method, may be used to form the cathode electrode 47.

Thus, the light-emitting element layer 4 including the plurality of light-emitting elements ES is formed on the flattening film 33.

Advantageous Effects

Next, advantageous effects of the display device 1 according to the present embodiment will be described below with reference to FIGS. 8 and 9.

Figure 8:
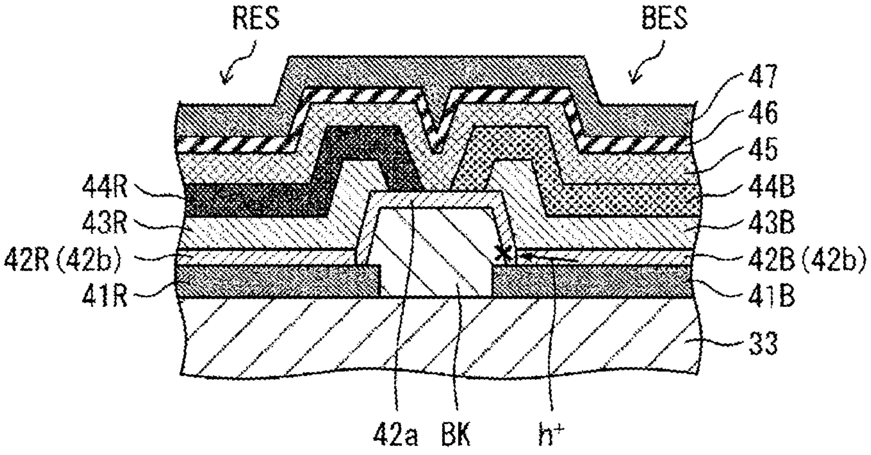
FIG. 8 is a cross-sectional view illustrating part of a cross section taken along a line B-B' illustrated in FIG. 2.
Figure 9:
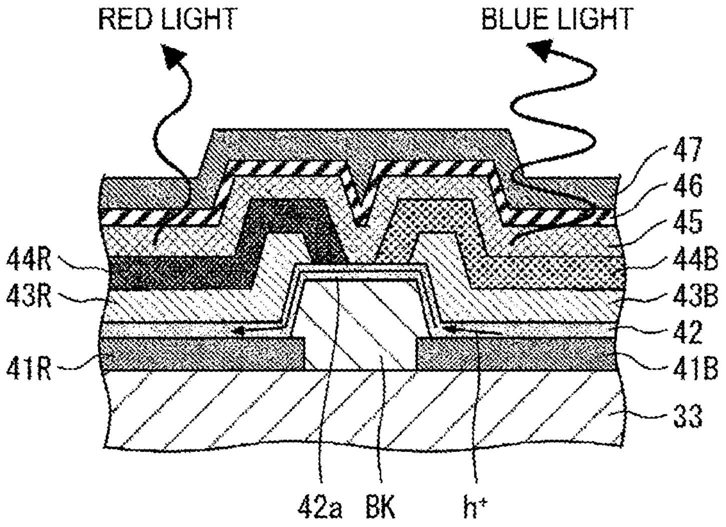
FIG. 9 is a cross-sectional view for explaining a problem in a known display device.

FIG. 8 is a cross-sectional view illustrating part of a cross section taken along the line B-B' illustrated in FIG. 2. FIG. 9 is a cross-sectional view for explaining a problem in a known display device. FIG. 9 illustrates a cross-section of a portion of the known display device corresponding to the cross-section illustrated in FIG. 8. In FIG. 9, constituent elements having the same functions as the constituent elements illustrated in FIG. 8 are designated by the same reference signs, and detailed descriptions thereof are omitted.

In the following, as a known problem, description will be made focusing on the HIL 42. As illustrated in FIG. 9, in a case where the HIL 42 is provided to be common to a plurality of light-emitting elements ES, for example, when the light-emitting element BES emits light, positive holes ($h^+$) are transported from the light-emitting element BES also to, for example, the light-emitting element RES adjacent to the light-emitting element BES via the HIL 42. As described above, of the cathode electrode 47, EIL 46, and ETL 45, at least the cathode electrode 47 is a common layer provided to be common to all the pixels P. Accordingly, when the light-emitting element BES emits light, electrons are transported also to, for example, the light-emitting element RES adjacent to the light-emitting element BES via at least the cathode electrode 47 among the cathode electrode 47, EIL 46, and ETL 45. Thus, in the case where the light-emitting element BES emits light as described above, when positive holes are transported to the light-emitting element RES of the adjacent pixel RP via the HIL 42, the electrons and the positive holes transported from the light-emitting element BES are recombined in the EML 44R of the light-emitting element RES, and the light-emitting element RES emits light weakly. As discussed above, in the case where one light-emitting element ES emits light, when positive holes are transported to the EML 44 of the adjacent pixel P via the HIL 42, the light-emitting element ES of the adjacent pixel P emits light weakly. FIG. 9 illustrates an example in which, when the light-emitting element BES emits light, the light-emitting element RES of the pixel RP adjacent to the light-emitting element BES emits light weakly in the manner described above. However, at this time, the light-emitting element GES of the pixel GP adjacent to the light-emitting element BES also emits light weakly. Such a phenomenon is called optical crosstalk and causes deterioration of display quality.

On the other hand, as illustrated in FIG. 8, the display device 1 according to the present embodiment is provided with the neighboring pixel hole blocking section 42*a* between the light-emitting elements ES of the adjacent pixels P, where the neighboring pixel hole blocking section 42*a* blocks the transportation of positive holes between the light-emitting elements ES of the adjacent pixels P. With this, as illustrated in FIG. 8, the transportation of positive holes to the light-emitting elements ES in the adjacent pixels P is blocked. Thus, according to the present embodiment, it is possible to provide the display device 1, in which crosstalk does not occur.

According to the present embodiment, the hole injection section 42*b* and the neighboring pixel hole blocking section 42*a* are part of the HIL 42, which is a common layer. The HIL 42 and the display device 1 including the HIL 42 according to the present embodiment are simply processed as compared to a case in which the HIL 42 is formed in an island shape for each pixel P, and the material constituting the HIL 42 may be replaced with an inexpensive material. Therefore, the manufacturing costs may be significantly reduced.

In particular, organic insulating materials used as graphene precursors are inexpensive compared to known hole transport materials, and the finally formed graphene oxides have high temperature stability and high chemical stability. Thus, according to the present embodiment, it is possible to provide the display device 1 more reliable than a display device formed using a known hole transport material.

In addition, organic materials of related art used for the HIL may have poor adhesion between each other. However, according to the present embodiment, as described above, the hole injection section 42*b* and the neighboring pixel hole blocking section 42*a* are part of the HIL 42, which is a common layer, are chemically bonded to each other, and are integrally formed with each other in the same layer. As a result, according to the present embodiment, a level of adhesion between the materials of the hole injection section 42*b* and the neighboring pixel hole blocking section 42*a* is high, thereby making it possible to prevent the penetration of a foreign matter such as water or oxygen from the outside. Thus, according to the present embodiment, it is possible to provide the display device 1 with higher reliability.

First Modified Example

Figure 10:
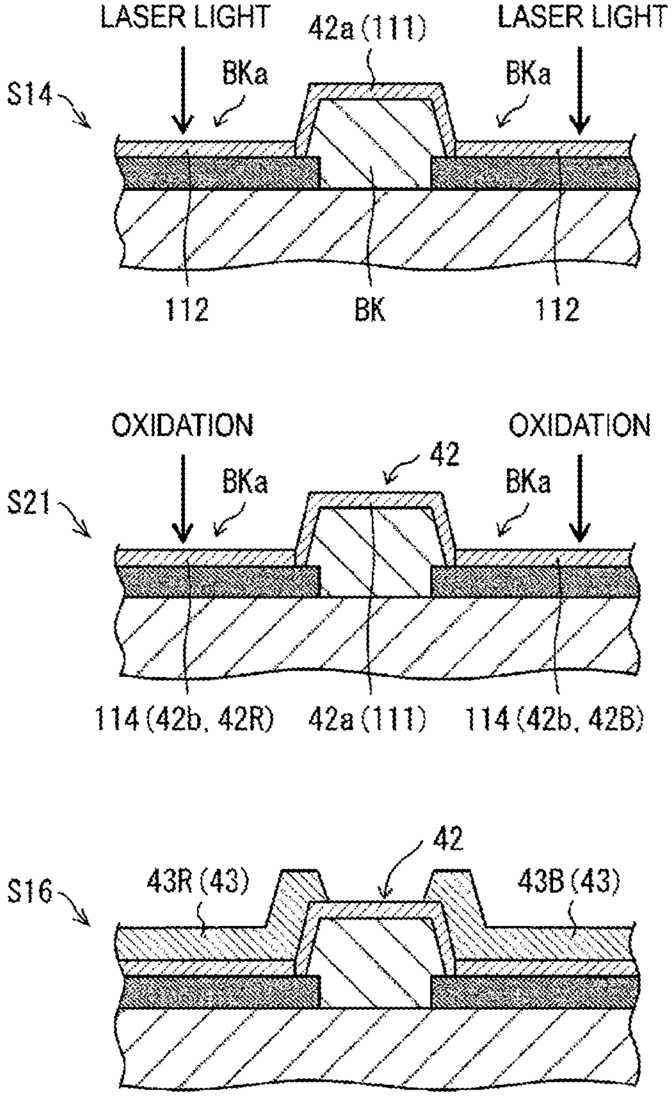
FIG. 10 includes cross-sectional views illustrating some of steps of forming a light-emitting element layer in a display device according to a first modified example of the first embodiment in order of the steps.

In FIG. 5, the case in which the hole injection section 42*b* is formed of a graphene derivative that is chemically modified with an electron-attracting group is exemplified and described. However, as described above, the hole injection section 42*b* may be formed of graphene oxide. FIG. 10 illustrates cross-sectional views of some of the steps of forming the light-emitting element layer 4 in the display device 1 according to the present modified example in order of the steps. FIG. 10 illustrates some of the manufacturing steps after step S13 illustrated in FIG. 5. Note that FIG. 10 also illustrates cross sections corresponding to part of the cross section taken along the line B-B' illustrated in FIG. 2.

In the present modified example, as illustrated in S14 in FIG. 10, after steps S11 to S13, step S14, which is the same as step S14 illustrated in FIG. 5, is performed.

Subsequently, as illustrated in S21 in FIG. 10, the graphene film 112 formed in step S14 is oxidized and transformed to a graphene oxide film 114 (step S21, first transformation step, first carrier injection section transformation step). As previously mentioned, graphene oxide can be formed by oxidizing graphene.

As previously mentioned, graphene is transformed into graphene oxide by exposure to a solution of, for example, $KMnO_4$ dissolved in $H_2SO_4$.

For example, when the graphene formed on the substrate obtained in step S14 is 10 g in quantity, the substrate is immersed in a mixed solution of 60-g $KMnO_4$ being mixed in a 1320-mL solution containing $H_2SO_4$ and phosphoric acid ($H_3PO_4$) at the ratio of 9:1, and is rotated for 12 hours. After the surface of the substrate returns to room temperature, the substrate is immersed in 30% hydrogen peroxide water at 0° C., and after approximately five minutes, the substrate is washed with water, 30% hydrochloric acid, and ethanol. Finally, the substrate is dried in a vacuum chamber for 8 to 12 hours. Thus, the graphene film 112 formed on the substrate obtained in step S14 may be transformed to the graphene oxide film 114.

However, the above method is an example, and the present embodiment is not limited to the above method. For example, instead of immersing the substrate on which the graphene film 112 is formed, in the solution containing the oxidant, the graphene film 112 may be brought into contact with the oxidant by supplying a solution containing the oxidant to the substrate on which the graphene film 112 is formed.

As described above, graphene has electron transport properties, whereas graphene oxide has hole transport properties. Because of this, according to the present embodiment, the hole injection section 42*b* made of the graphene oxide film 114 may be formed in each pixel P through the above-discussed steps. The hole mobility and the band gap of the graphene oxide may be adjusted by adjusting the oxygen concentration as described above.

Subsequently, as illustrated in S16 in FIG. 10, step S16, which is the same as step S16 illustrated in FIG. 6, is performed to form the HTL 43 for each pixel P on the HIL 42 provided with the neighboring pixel hole blocking section 42*a* and the hole injection section 42*b* (step S16). Thereafter, by performing steps S17 to S20 illustrated in FIG. 6, the light-emitting element layer 4 is formed including the light-emitting element ES with the hole injection section 42*b* made of graphene oxide.

Second Modified Example

Figure 11:
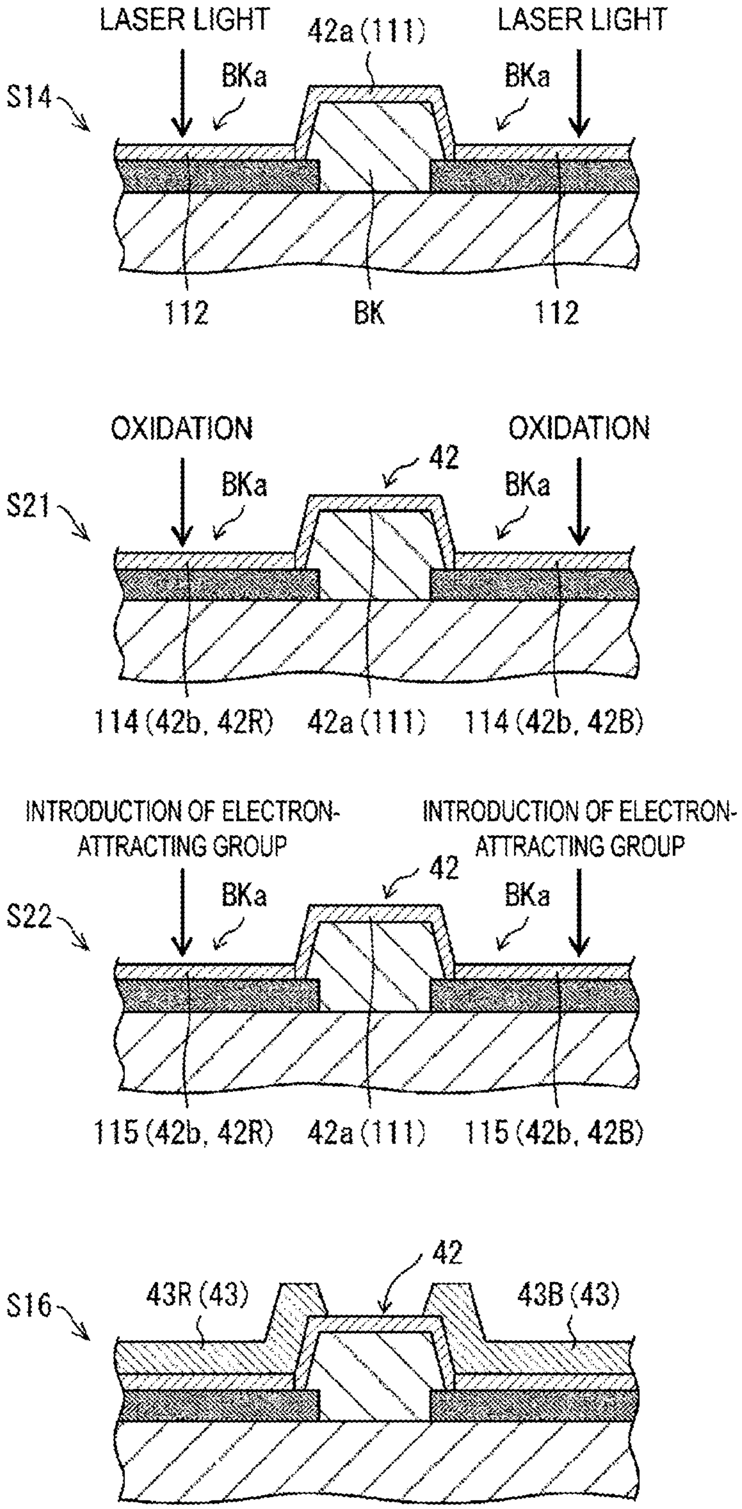
FIG. 11 includes cross-sectional views illustrating some of steps of forming a light-emitting element layer in a display device according to a second modified example of the first embodiment in order of the steps.

As described above, the hole injection section 42*b* may be formed of a graphene oxide derivative obtained by introducing an electron-attracting group into graphene oxide. FIG. 11 illustrates cross-sectional views of some of the steps of forming the light-emitting element layer 4 in the display device 1 according to the present modified example in order of the steps. FIG. 11 illustrates some of the manufacturing steps after step S13 illustrated in FIG. 5. Note that FIG. 11 also illustrates cross sections corresponding to part of the cross section taken along the line B-B' illustrated in FIG. 2.

In the present modified example, as illustrated in S14 in FIG. 11, after steps S11 to S13, step S14, which is the same as step S14 illustrated in FIG. 5, is performed.

Subsequently, as illustrated in S21 in FIG. 11, step S21, which is the same as step S21 illustrated in FIG. 10, is performed to transform the graphene film 112 to the graphene oxide film 114.

Then, as illustrated in S22 in FIG. 11, an electron-attracting group is introduced into the graphene oxide constituting the graphene oxide film 114. With this, the graphene oxide film 114 is transformed to a graphene oxide derivative film 115 made of a graphene oxide derivative having been subjected to chemical modification with the electron-attracting group (step S22, first transformation step, first carrier injection section transformation step).

As a method for introducing an electron-attracting group into graphene oxide, a method similar to the method for introducing an electron-attracting group into graphene may be used. For example, in a case where a fluoro-group is introduced into graphene oxide, the substrate with the graphene oxide film 114 formed thereon obtained in step S21 is put in a closed chamber made of nickel and containing $XeF_2$ (1 g or less) and is left in a closed environment at 200° C., and then is taken out. Thus, the introduction of the fluoro-group into the graphene oxide makes it possible to convert the graphene oxide into fluorinated graphene oxide.

As described above, for example, when the substrate on which the graphene oxide film 114 is formed is used instead of the substrate on which the graphene film 112 is formed in step S15 discussed above, the graphene oxide derivative may be formed instead of the graphene derivative.

Fluorinated graphene oxide has hole transport properties. Because of this, according to the present modified example, the hole injection section 42*b* made of the graphene oxide derivative film 115 may be formed in each pixel P through the above step. According to the present modified example, by introducing an electron-attracting group into graphene oxide which is a hole transport material, a hole transport material having a lower energy level may be obtained.

Note that the above-described method is an example, and the method for introducing an electron-attracting group into graphene oxide is not limited to the above-described method. Any of various known methods may be used as a method for introducing an electron-attracting group into graphene oxide.

Subsequently, as illustrated in S16 in FIG. 11, step S16, which is the same as step S16 illustrated in FIG. 6, is performed to form the HTL 43 for each pixel P on the HIL 42 provided with the neighboring pixel hole blocking section 42*a* and the hole injection section 42*b* (step S16). Thereafter, by performing steps S17 to S20 illustrated in FIG. 6, the light-emitting element layer 4 is formed including the light-emitting element ES with the hole injection section 42*b* made of the graphene oxide derivative obtained by introducing the electron-attracting group into the graphene oxide.

Third Modified Example

Figure 12:
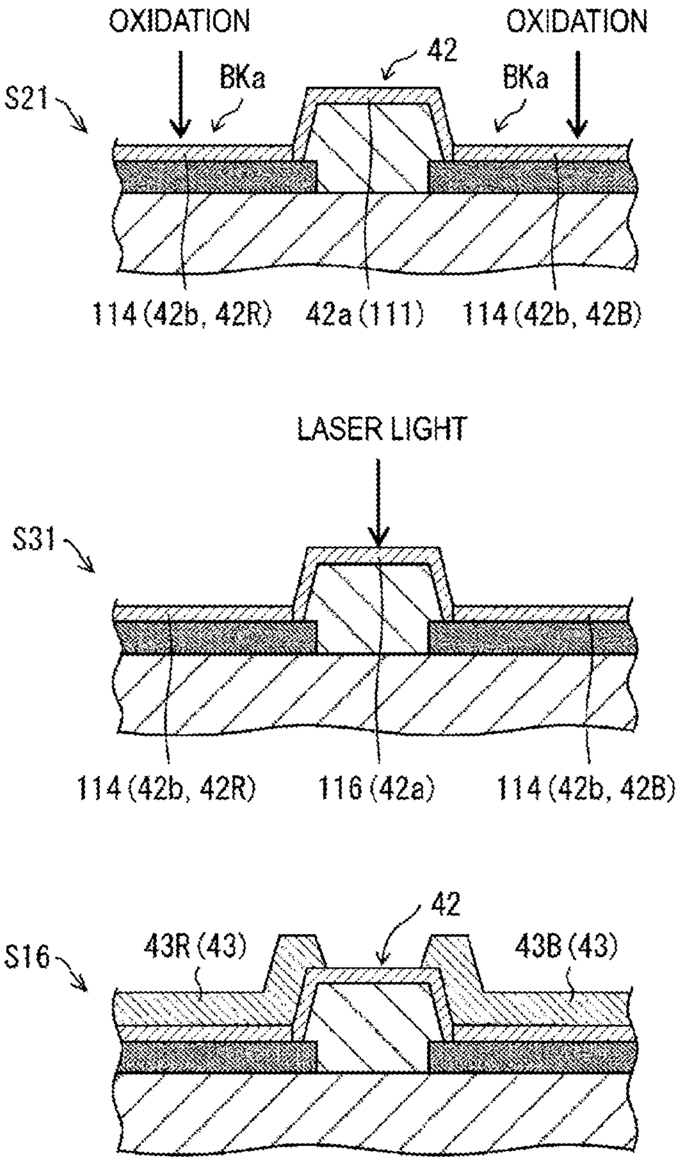
FIG. 12 includes cross-sectional views illustrating some of steps of forming a light-emitting element layer in a display device according to a third modified example of the first embodiment in order of the steps.

In FIG. 5, as illustrated in S15, the case in which the neighboring pixel hole blocking section 42*a* is part of the organic insulating film 111 and is made of an organic insulating material (resin) used for the organic insulating film 111 has been described as an example. However, as described above, the hole blocking material forming the neighboring pixel hole blocking section 42*a* may be an electron transport material. FIG. 12 illustrates cross-sectional views of some of the steps of forming the light-emitting element layer 4 in the display device 1 according to the present modified example in order of the steps. FIG. 12 illustrates some of the manufacturing steps after step S14 illustrated in FIG. 10. Note that FIG. 12 also illustrates cross sections corresponding to part of the cross section taken along the line B-B' illustrated in FIG. 2.

In the present modified example, as illustrated in S21 in FIG. 12, after steps S11 to S14, step S21, which is the same as step S21 illustrated in FIG. 10, is performed.

Subsequently, as illustrated in S31 in FIG. 12, by irradiating the neighboring pixel hole blocking section 42*a* made of the organic insulating film 111 with laser light, the organic insulating film 111 in the neighboring pixel hole blocking section 42*a* is converted into a graphene film 116 (step S31, first transformation step). Thus, the neighboring pixel hole blocking section 42*a* made of the graphene film 116 having electron transport properties is formed.

The method of converting the organic insulating film 111 in the neighboring pixel hole blocking section 42*a* into the graphene film 116 is the same as the method of converting the organic insulating film 111 in each pixel P (specifically, in the opening BKa of the bank BK) into the graphene film 112 in step S14 illustrated in FIG. 5, for example. Therefore, description of the method of converting the organic insulating film 111 in the neighboring pixel hole blocking section 42*a* into the graphene film 116 is omitted.

Subsequently, as illustrated in S16 in FIG. 12, step S16, which is the same as step S16 illustrated in FIG. 5, is performed to form the HTL 43 for each pixel P on the HIL 42 provided with the neighboring pixel hole blocking section 42*a* and the hole injection section 42*b* (step S16). Thereafter, by performing steps S17 to S20 illustrated in FIG. 6, the light-emitting element layer 4 is formed including the light-emitting element ES with the neighboring pixel hole blocking section 42*a* made of the electron transport material.

In FIG. 12, the case in which the neighboring pixel hole blocking section 42*a* is made of graphene as an electron transport material when the hole injection section 42*b* in the HIL 42 is made of graphene oxide, is exemplified and explained. However, even when the hole injection section 42*b* in the HIL 42 is, for example, a graphene oxide derivative formed by introducing an electron-attracting group into graphene oxide, a graphene derivative formed by introducing an electron-attracting group into graphene, or the like, the neighboring pixel hole blocking section 42*a* made of an electron transport material may be formed in a similar manner.

Fourth Modified Example

In the third modified example, by transforming the organic insulating materials into the hole transport material and the electron transport material, respectively, through chemical reactions, the hole injection section 42*b* made of the hole transport material and the neighboring pixel hole blocking section 42*a* made of the electron transport material are formed. However, the present embodiment is not limited to this example.

In the present modified example, a case in which, by converting (transforming) part of a film made of a hole transport material into an electron transport film through a chemical reaction, the hole injection section 42*b* made of the hole transport material and the neighboring pixel hole blocking section 42*a* made of the electron transport material are formed will be described as an example.

Figure 13:
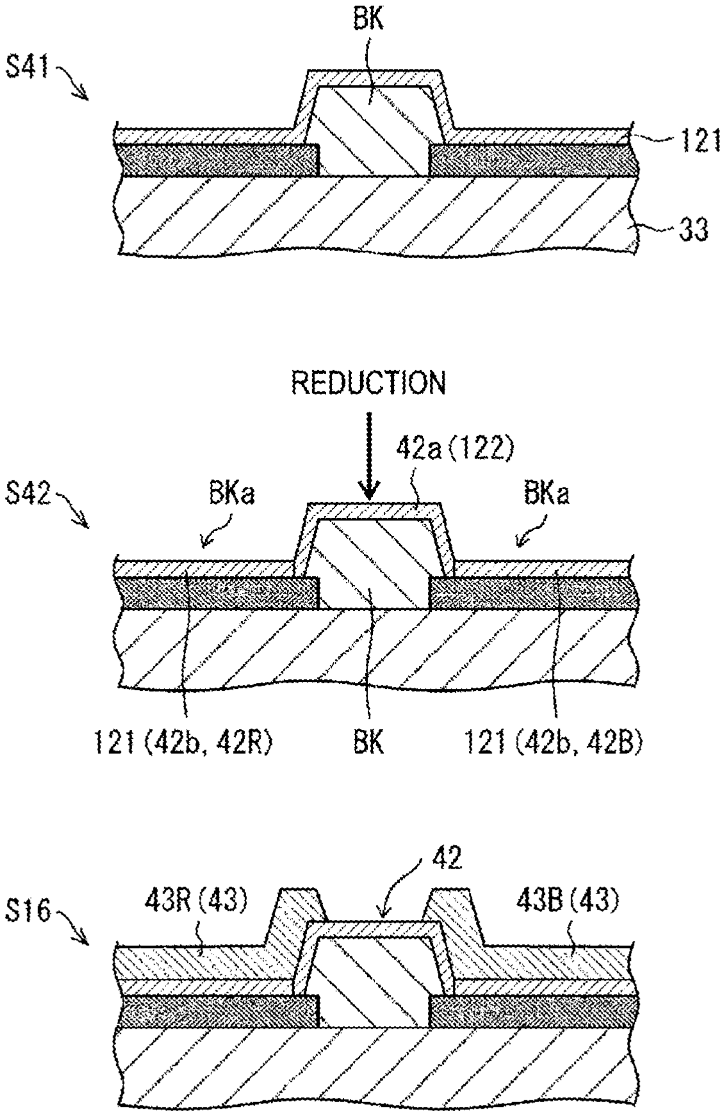
FIG. 13 includes cross-sectional views illustrating some of steps of forming a light-emitting element layer in a display device according to a fourth modified example of the first embodiment in order of the steps.

FIG. 13 illustrates cross-sectional views of some of the steps of forming the light-emitting element layer 4 in the display device 1 according to the present modified example in order of the steps. FIG. 13 illustrates some of the manufacturing steps after step S12 illustrated in FIG. 5. Note that FIG. 13 also illustrates cross sections corresponding to part of the cross section taken along the line B-B' illustrated in FIG. 2.

In the example illustrated in FIG. 13, after steps S11 to S12 illustrated in FIG. 5, as illustrated in S41 in FIG. 13, on the anode electrodes 41 and the bank BK, a hole transport film made of a hole transport material to be converted into a material exhibiting electron transport properties through a chemical reaction is formed in a solid-like form over all the pixels P (step S41, first film formation step).

Examples of the hole transport material include graphene oxide. As previously mentioned, graphene oxide is converted into graphene having electron transport properties by reduction (reduced graphene oxide).

In the following, a case in which the hole transport film is a graphene oxide film 121 will be described as an example. Any of various known methods can be used for forming the graphene oxide film 121, and the method is not limited to any specific method. The graphene oxide film 121 can be formed, for example, by applying a solution obtained by dissolving the graphene oxide in a solvent by a known coating method such as spin coating or spray coating, and drying the applied solution. The graphene oxide film 121 may be a film obtained by oxidizing graphene as described above. For example, after forming the organic insulating film 111 on the anode electrodes 41 and the bank BK in the same manner as in step S13 illustrated in FIG. 5, the graphene oxide film 121 may be formed by converting the organic insulating film 111 into graphene by laser irradiation and further oxidizing the obtained graphene. A graphene film formed by growing graphene may be oxidized, as illustrated in a fifth modified example described later.

Subsequently, as illustrated in S42 in FIG. 13, the graphene oxide film 121 between the light-emitting elements ES of the adjacent pixels P is selectively reduced by, for example, irradiating with a femtosecond laser. With this, the graphene oxide film 121 between the light-emitting elements ES is converted into a graphene film 122 (reduced graphene oxide film) (step S42, first transformation step). Thus, the HIL 42 including the neighboring pixel hole blocking section 42*a* made of the graphene film 122 having electron transport properties and the hole injection section 42*b* made of the graphene oxide film 121 having hole transport properties is formed.

Subsequently, as illustrated in S16 in FIG. 13, step S16, which is the same as step S16 illustrated in FIG. 6, is performed to form the HTL 43 for each pixel P on the HIL 42 provided with the neighboring pixel hole blocking section 42*a* and the hole injection section 42*b*. Thereafter, by performing steps S17 to S20 illustrated in FIG. 6, the light-emitting element layer 4 is formed including the light-emitting element ES with the neighboring pixel hole blocking section 42*a* made of the electron transport material.

Note that in the present modified example, as described above, a case in which, for example, a femtosecond laser is used for the reduction of the graphene oxide film 121 has been described as an example. However, the method of reducing the graphene oxide film 121 is not limited as long as part of the graphene oxide film 121 can be selectively reduced.

In FIG. 13, the case in which the neighboring pixel hole blocking section 42*a* is made of graphene as an electron transport material when the hole injection section 42*b* in the HIL 42 is made of graphene oxide, is exemplified and explained. However, in the present modified example as well, the hole injection section 42*b* in the HIL 42 may be, for example, a graphene oxide derivative formed by introducing an electron-attracting group into graphene oxide. The method of introducing the electron-attracting group into the graphene oxide of the hole injection section 42*b* is, for example, the same as the method of introducing the electron-attracting group into the graphene oxide in step S22 illustrated in FIG. 11. Therefore, description of the method for transforming the graphene oxide film 121 in the hole injection section 42*b* to a graphene oxide derivative film made of the graphene oxide derivative having been subjected to chemical modification with the electron-attracting group is omitted.

Fifth Modified Example

In the present modified example, a case in which, by converting (transforming) part of a film made of an electron transport material into a hole transport material through a chemical reaction, the hole injection section 42*b* made of the hole transport material and the neighboring pixel hole blocking section 42*a* made of the electron transport material are formed will be described as an example.

Figure 14:
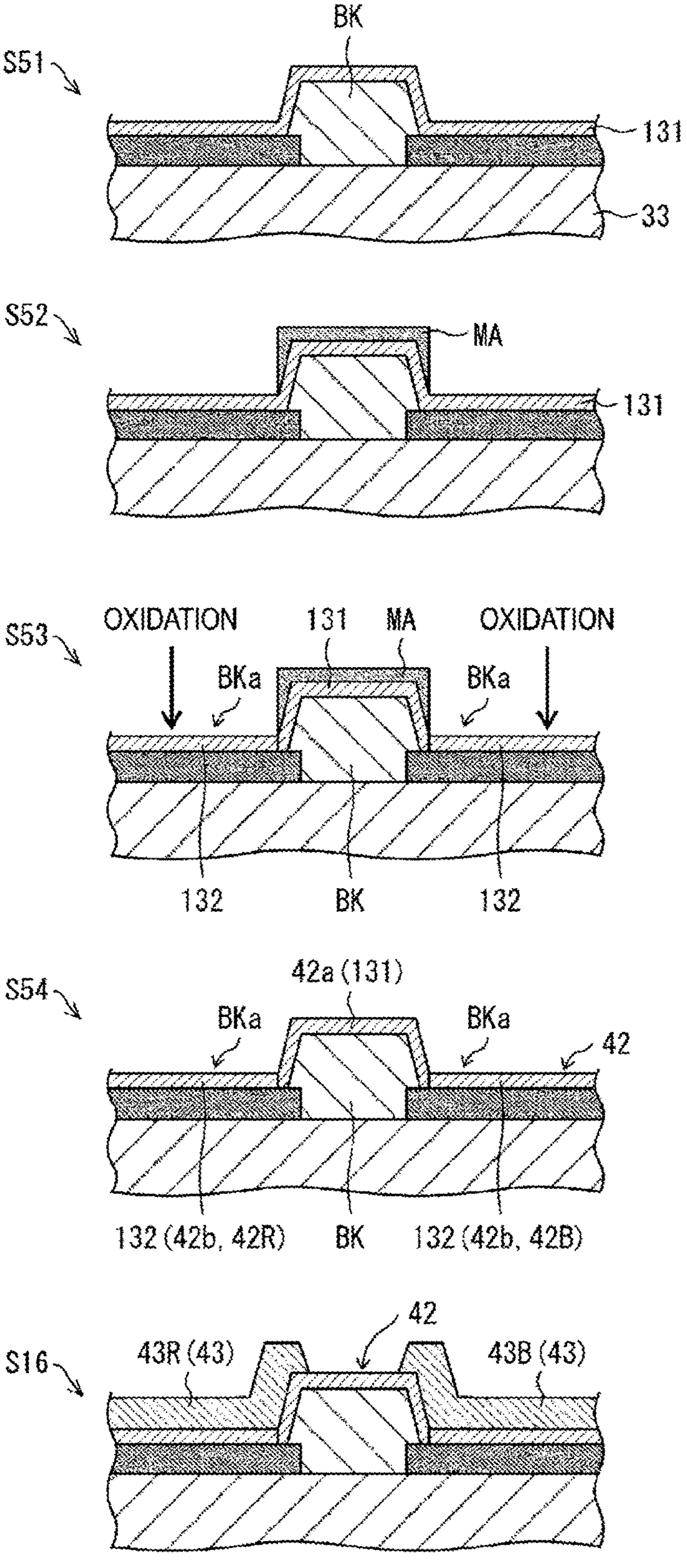
FIG. 14 includes cross-sectional views illustrating some of steps of forming a light-emitting element layer in a display device according to a fifth modified example of the first embodiment in order of the steps.

FIG. 14 illustrates cross-sectional views of an example of some of the steps of forming the light-emitting element layer 4 in the display device 1 according to the present modified example in order of the steps. FIG. 14 illustrates some of the manufacturing steps after step S12 illustrated in FIG. 5. FIG. 14 also illustrates cross sections corresponding to part of the cross section taken along the line B-B' illustrated in FIG. 2.

In the example illustrated in FIG. 14, after steps S11 to S12 illustrated in FIG. 5, as illustrated in S51 in FIG. 14, on the anode electrodes 41 and the bank BK, an electron transport film made of an electron transport material to be converted into a material exhibiting hole transport properties through a chemical reaction is formed in a solid-like form over all the pixels P (step S51, first film formation step).

Examples of the electron transport material include graphene. As previously mentioned, graphene is converted into graphene oxide having hole transport properties by oxidation.

In the following, a case in which the electron transport film is a graphene film 131 will be described as an example. Any of various known methods can be used for forming the graphene film 131, and the method is not limited to any specific method. The graphene film 131 may be, for example, a film derived from an organic insulating film as described above. For example, after forming the organic insulating film 111 on the anode electrodes 41 and the bank BK in the same manner as in step S13 illustrated in FIG. 5, the graphene film 131 may be formed by irradiating the entire organic insulating film 111 with a laser to transform it into graphene. The graphene film 131 can also be formed directly on a substrate to be processed by growing graphene on the substrate to be processed, for example, using remote microwave plasma to dissociate a carbon-containing gas as a source gas for film formation. The graphene film can also be formed by forming a support on a graphene film grown on a catalyst, etching away the catalyst and transferring the graphene film to a target substrate, and then removing the support.

Subsequently, part of the graphene film 131 is selectively oxidized to convert the graphene film 131 in each pixel P (specifically, in the opening BKa in the bank BK) into a graphene oxide film 132.

Specifically, for example, as illustrated in S52 in FIG. 14, a mask M made of, for example, polymethyl methacrylate (PMMA) is formed on the graphene film 131 by photolithography, covering the graphene film 131 between the light-emitting elements ES and having a mask opening MA exposing the graphene film 131 in the opening BKa of the bank BK (step S52, first transformation step).

Subsequently, as illustrated in S53 in FIG. 14, a portion of the graphene film 131 exposed through the mask opening MA is subjected to, for example, $UV/O_3$ treatment. Thus, the portion of the graphene film 131 exposed through the mask opening MA is selectively oxidized and selectively converted into the graphene oxide film 132 (step S53, first transformation step).

Thereafter, as illustrated in S54 in FIG. 14, the mask M is removed (step S54, first transformation step). For example, acetone or the like can be used for removing the mask M. As a result, the neighboring pixel hole blocking section 42*a* made of the graphene film 131 having electron transport properties and the hole injection section 42*b* made of the graphene oxide film 132 having hole transport properties are formed.

Subsequently, as illustrated in S16 in FIG. 14, step S16, which is the same as step S16 illustrated in FIG. 6, is performed to form the HTL 43 for each pixel P on the HIL 42 provided with the neighboring pixel hole blocking section 42*a* and the hole injection section 42*b*. Thereafter, by performing steps S17 to S20 illustrated in FIG. 6, the light-emitting element layer 4 is formed including the light-emitting element ES with the neighboring pixel hole blocking section 42*a* made of the electron transport material.

In the present modified example, as described above, the case in which the graphene film 131 is oxidized by, for example, $UV/O_3$ treatment has been described as an example. However, the method of oxidizing the graphene film 131 is not limited as long as part of the graphene film 131 can be selectively oxidized.

Any of the various known methods described above can be used for oxidizing graphene to obtain graphene oxide. The oxidation method is not limited as long as the oxidation conditions are set so that the graphene film 131 remains between the openings BKa in the bank BK adjacent to each other. Partial oxidation of the graphene film 131 may be performed, for example, by selectively dropping a solution containing an oxidant onto the graphene film 131 using a mask. Prior to partial oxidation, a surface of the graphene film 131 may be partially modified by, for example, partially irradiating the graphene film 131 with UV light or the like. By partially modifying the surface of the graphene film 131 to partially impart water repellency or hydrophilicity, the oxidation region can be controlled.

In FIG. 14, the case in which the hole injection section 42*b* is made of graphene oxide as a hole transport material when the neighboring pixel hole blocking section 42*a* in the HIL 42 is made of graphene, is exemplified and explained. However, in the present modified example as well, the hole injection section 42*b* in the HIL 42 may be, for example, a graphene oxide derivative formed by introducing an electron-attracting group into graphene oxide. The method of introducing the electron-attracting group into the graphene oxide of the hole injection section 42*b* is, for example, the same as the method of introducing the electron-attracting group into the graphene oxide in step S22 illustrated in FIG. 11. Therefore, description of the method for transforming the graphene oxide film 132 in the hole injection section 42*b* to a graphene oxide derivative film made of the graphene oxide derivative having been subjected to chemical modification with the electron-attracting group is omitted.

In the present modified example as well, the hole injection section 42*b* in the HIL 42 may be, for example, a graphene derivative formed by introducing an electron-attracting group into graphene. Accordingly, in step S53 in FIG. 14, the portion of the graphene film 131 exposed through the mask opening MA may be selectively converted into a graphene derivative film made of a graphene derivative having been subjected to chemical modification with an electron-attracting group instead of being selectively oxidized. In step S53 in FIG. 14, the method of introducing the electron-attracting group into the portion of the graphene of the graphene film 131 exposed through the mask opening MA is, for example, the same as the method of introducing the electron-attracting group into the graphene in step S15 illustrated in FIG. 5. Therefore, description of the method for transforming the graphene film 131 in the hole injection section 42*b* to a graphene derivative film made of the graphene derivative having been subjected to chemical modification with the electron-attracting group is omitted.

Sixth Modified Example

The neighboring pixel hole blocking section 42*a* and the hole injection section 42*b* may be patterned in such a manner as to finally form a single layer by being chemically bonded. In the present modified example, a case in which the hole injection section 42*b* and the neighboring pixel hole blocking section 42*a* are patterned with different materials from each other will be described as an example.

Figure 15:
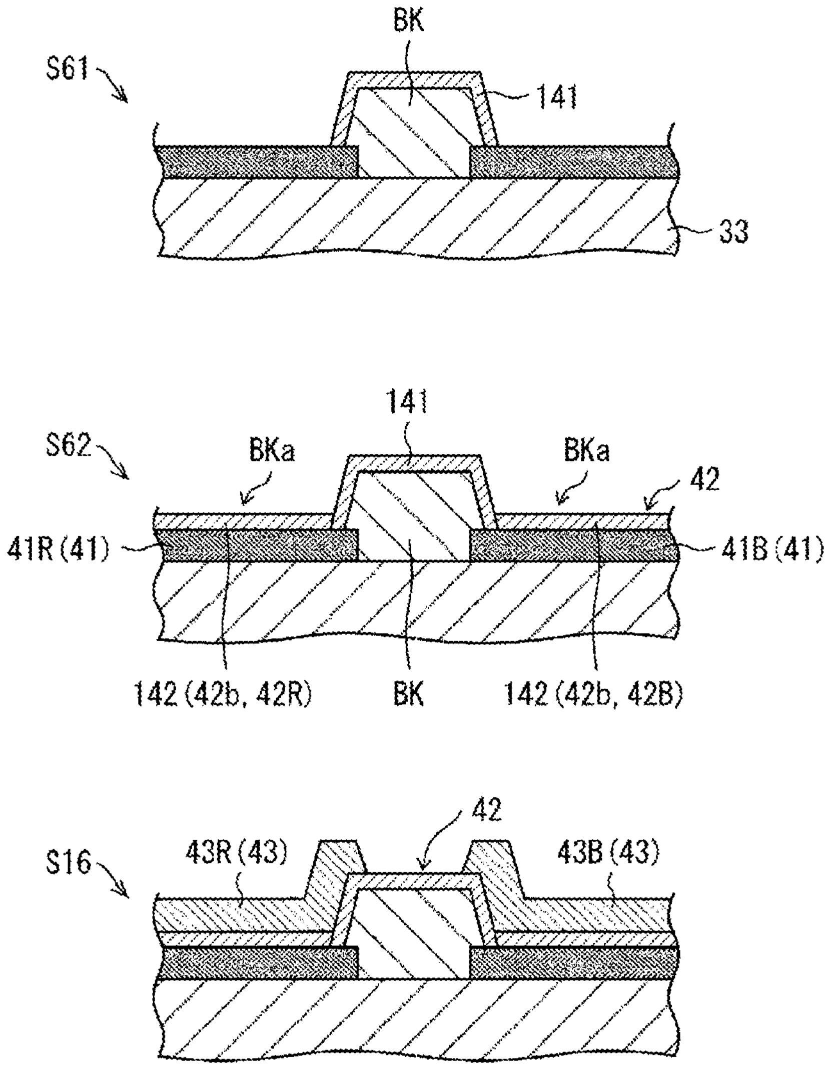
FIG. 15 includes cross-sectional views illustrating some of steps of forming a light-emitting element layer in a display device according to a sixth modified example of the first embodiment in order of the steps.

FIG. 15 illustrates cross-sectional views of some of the steps of forming the light-emitting element layer 4 in the display device 1 according to the present modified example in order of the steps. FIG. 15 illustrates some of the manufacturing steps after step S12 illustrated in FIG. 5. Note that FIG. 15 also illustrates cross sections corresponding to part of the cross section taken along the line B-B' illustrated in FIG. 2.

In the example illustrated in FIG. 15, after steps S11 to S12 illustrated in FIG. 5, as illustrated in S61 in FIG. 15, a film 141 made of a hole blocking material is patterned on the bank BK between the adjacent pixels P as the neighboring pixel hole blocking section 42*a* (step S61, step of patterning the carrier injection section). The film 141 made of the hole blocking material may be an organic insulating material or an electron transport material. In this case, any of the various materials described above can be used for the organic insulating material or the electron transport material.

A method of patterning the film 141 made of the hole blocking material is not limited to any specific method, and for example, any of the patterning methods (1) to (5) described above can be used.

When the film 141 made of the hole blocking material is a graphene film, the graphene film may be a film obtained by converting an organic insulating film, or a graphene film obtained by reducing a graphene oxide film (reduced graphene oxide film).

When the film 141 made of the hole blocking material is a film obtained by converting an organic insulating film into a graphene film, a patterned organic insulating film may be converted into a graphene film, or after converting a solid-like organic insulating film into a graphene film, the obtained graphene film may be patterned.

For example, after step S13 illustrated in FIG. 5, the entire solid-like organic insulating film 111 formed in step S13 may be converted into a graphene film and then the graphene film may be patterned, or the solid-like organic insulating film 111 may be patterned and then converted into a graphene film.

When the patterned organic insulating film is converted into the graphene film, a film made of an organic insulating material such as PI may be formed on the bank BK by, for example, a soft nanoimprint method, and then the organic insulating material may be transformed into graphene by laser irradiation.

Similarly, when the film 141 made of the hole blocking material is a reduced graphene oxide film obtained by reducing the graphene oxide film, the patterned graphene oxide film may be reduced to graphene. Alternatively, after the entire solid-like graphene oxide film is reduced, the obtained reduced graphene oxide film may be patterned.

As an example, a reduction method in an aqueous solution is described below. For example, first, a substrate on which a graphene oxide film (100 mg) is formed is immersed in water (minimum 100 mL). Subsequently, hydrazine (1.00 mL, 32.1 mmol) is dissolved in the water and heated at 100° C. for 24 hours for reduction reaction. Note that during the reduction reaction, it is desirable to use a condenser in order to circulate hydrazine that has evaporated to gas and continue the reduction reaction with graphene oxide. Thereafter, the substrate is washed five times with, for example, 100 mL of water, and then washed with 100 mL of methanol five times. After washing, the substrate is dried in a vacuum heating environment. Thus, the reduced graphene oxide film can be formed. Note that, as described above, the graphene oxide film may be pre-patterned, or may be patterned after reduction.

A known patterning technique such as photolithography or laser processing can be used for the patterning.

In the present modified example, after patterning the film 141 made of the hole blocking material in this manner, a film 142 made of a hole transport material is patterned as the hole injection section 42*b* as illustrated in S62 in FIG. 15 (step S62, step of patterning a neighboring pixel carrier blocking section). At this time, the film 142 made of the hole transport material is patterned so as to cover the anode electrode 41 in each pixel P (specifically, a region surrounded by the film 141 made of the hole blocking material). Any of the various materials described above can be used for the hole transport material.

A method of patterning the film 142 made of the hole transport material is not limited to any specific method. Also in this case, for example, any of the patterning methods (1) to (5) described above can be used.

Thus, the neighboring pixel hole blocking section 42*a* made of the film 141 made of the hole blocking material and the hole injection section 42*b* made of the film 142 made of the hole transport material are formed.

In the present modified example as well, the hole injection section 42*b* in the HIL 42 may be a graphene oxide derivative formed by introducing an electron-attracting group into graphene oxide, or a graphene derivative formed by introducing an electron-attracting group into graphene. When an electron-attracting group is introduced into graphene oxide or graphene, the introduction of the electron-attracting group may be carried out before or after the graphene oxide or graphene is patterned.

Subsequently, as illustrated in S16 in FIG. 15, step S16, which is the same as step S16 illustrated in FIG. 6, is performed to form the HTL 43 for each pixel P on the HIL 42 provided with the neighboring pixel hole blocking section 42*a* and the hole injection section 42*b*. Thereafter, by performing steps S17 to S20 illustrated in FIG. 6, the light-emitting element layer 4 is formed including the light-emitting element ES with the neighboring pixel hole blocking section 42*a* made of the electron transport material.

The neighboring pixel hole blocking section 42*a* made of the film 141 made of the hole blocking material and the hole injection section 42*b* made of the film 142 made of the hole transport material, which are formed in the present modified example, are chemically bonded to each other at each contact portion thereof. Thus, according to the method described above, it is possible to form the HIL 42, in which the neighboring pixel hole blocking section 42*a* and the hole injection section 42*b* are integrally formed in the same layer.

In the present modified example, the case of patterning the neighboring pixel hole blocking section 42*a* and then patterning the hole injection section 42*b* has been described as an example. However, the present modified example is not limited thereto, and after patterning the hole injection section 42*b*, the neighboring pixel hole blocking section 42*a* may be patterned.

Seventh Modified Example

Figure 16:
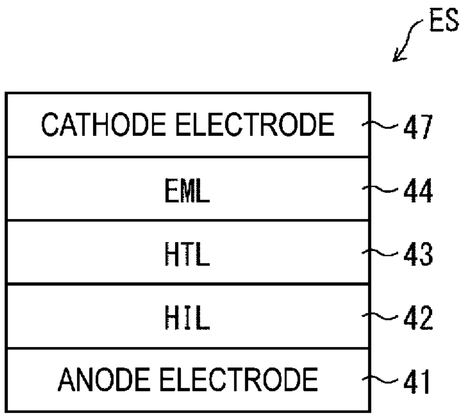
FIG. 16 is a diagram schematically illustrating an example of a layered structure of a light-emitting element according to a seventh modified example of the first embodiment.

FIG. 16 is a diagram schematically illustrating another example of a layered structure of a light-emitting element ES according to the present embodiment.

As illustrated in FIG. 16, the light-emitting element ES may have a configuration in which the anode electrode 41, the HIL 42, the HTL 43, the EML 44, and the cathode electrode 47 are layered in this order from the thin film transistor layer 3 side. Also in this case, similar advantageous effects to those described above can be obtained.

Eighth Modified Example

Figure 17:
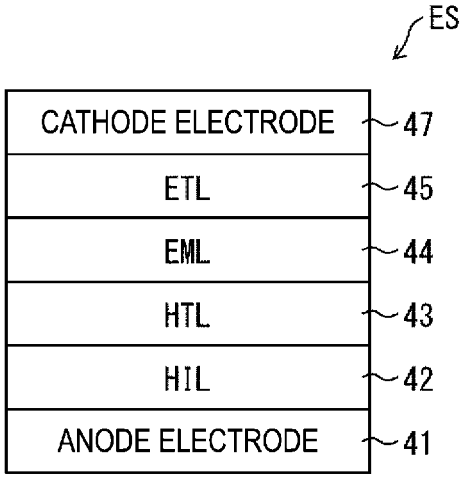
FIG. 17 is a diagram schematically illustrating an example of a layered structure of a light-emitting element according to an eighth modified example of the first embodiment.

FIG. 17 is a diagram schematically illustrating still another example of a layered structure of a light-emitting element ES according to the present embodiment.

As illustrated in FIG. 17, the light-emitting element ES may have a configuration in which the anode electrode 41, the HIL 42, the HTL 43, the EML 44, the ETL 45, and the cathode electrode 47 are layered in this order from the thin film transistor layer 3 side. Also in this case, similar advantageous effects to those described above can be obtained.

Second Embodiment

Another embodiment of the disclosure will be described below with reference to FIGS. 18 to 25. Note that differences from the first embodiment will be described in the present embodiment. For convenience of description, members having the same functions as the members described in the first embodiment are designated by the same reference signs, and descriptions thereof are omitted.

Figure 18:
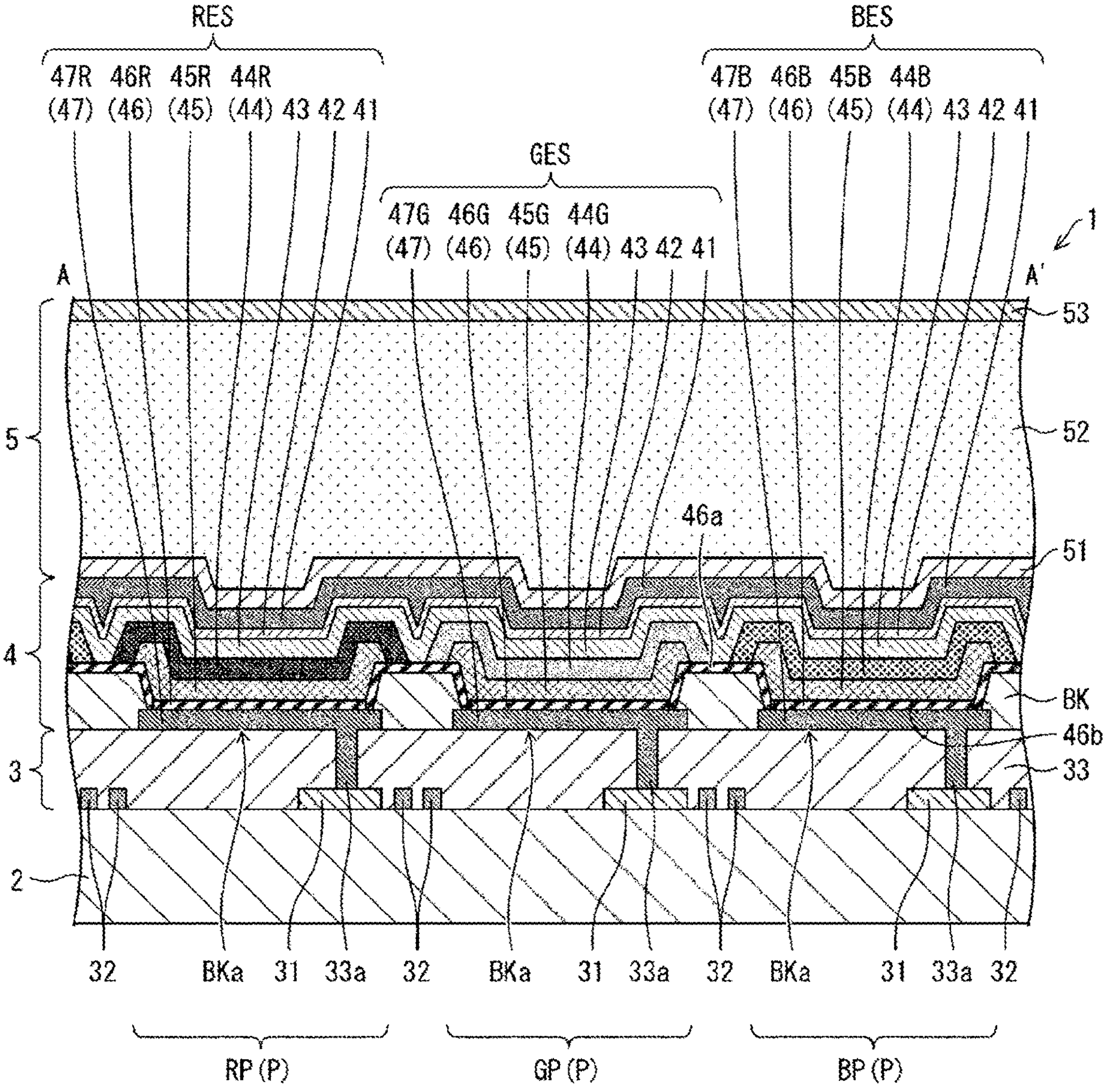
FIG. 18 is a cross-sectional view illustrating an example of a schematic configuration of a pixel in a display device according to a second embodiment.

FIG. 18 is a cross-sectional view illustrating an example of a schematic configuration of a pixel P in a display device 1 according to the present embodiment. A partially enlarged plan view illustrating an example of a schematic configuration of the display device 1 according to the present embodiment is the same as FIG. 2. FIG. 18 corresponds to the cross-sectional view taken along the line A-A' illustrated in FIG. 2.

The display device 1 illustrated in FIG. 18 has the same configuration as the display device 1 according to the first embodiment, except for the points described below. A light-emitting element layer 4 of the display device 1 illustrated in FIG. 18 has a configuration in which a cathode electrode 47, a bank BK, an EIL 46, an ETL 45, an EML 44, an HTL 43, an HIL 42, and an anode electrode 41 are layered in this order from the side of a thin film transistor layer 3. Thus, in the present embodiment, the EIL 46 is a first carrier injection layer and the HIL 42 is a second carrier injection layer. The ETL 45 is a first carrier transport layer and the HTL 43 is a second carrier transport layer. As illustrated in FIG. 18, in the first embodiment, the layering order from the anode electrode 41 to the cathode electrode 47 in the light-emitting element ES may be reversed.

As described in the first embodiment, of the anode electrode 41 and the cathode electrode 47, at least the electrode on the light extraction surface side needs to have optical transparency. On the other hand, the electrode on the side opposite to the light extraction surface may have optical transparency or light reflectivity.

Accordingly, in the present embodiment, for example, when the display device 1 is a top-emission display device, the anode electrode 41, which is an upper electrode, is formed of a light transmissive electrode made of an optical transparent material, and the cathode electrode 47, which is a lower electrode, is formed of a light-reflective electrode made of a light-reflective material. On the other hand, when the display device 1 is a bottom-emission display device, the anode electrode 41, which is the upper electrode, is formed of a light-reflective electrode made of a light-reflective material, and the cathode electrode 47, which is the lower electrode, is formed of a light transmissive electrode made of an optical transparent material.

In the display device 1 illustrated in FIG. 18, of the EIL 46 and the HIL 42, the EIL 46 includes an electron injection section **46*b* as a carrier injection section and a neighboring pixel electron blocking section 46*a*** as a neighboring pixel carrier blocking section.

The electron injection section **46*b* has electron transport properties. The electron injection section 46*b* is provided, for each light-emitting element ES, overlapping the EML 44 and ETL 45 of each light-emitting element ES, and transports electrons as carriers to the EML 44**.

The neighboring pixel electron blocking section **46*a* is provided in a portion between the light-emitting elements ES of the adjacent pixels P, and blocks the transportation of electrons between the light-emitting elements ES of the adjacent pixels P. The size of the neighboring pixel electron blocking section 46*a* is not particularly limited as long as the neighboring pixel electron blocking section 46*a* is provided between the electron injection sections 46*b*** of the adjacent pixels P to enable blocking of the transportation of electrons between the light-emitting elements ES of the adjacent pixels P.

The electron injection section **46*b* and the neighboring pixel electron blocking section 46*a* may be formed, for example, by transforming at least part of a common layer provided to be common to all the pixels P by a chemical reaction. The electron injection section 46*b* and the neighboring pixel electron blocking section 46*a* formed in this manner are chemically bonded to each other and are formed integrally with each other in the same layer. The electron injection section 46*b* and the neighboring pixel electron blocking section 46*a*** have, suitably, substantially the same thickness by transforming at least part of the common layer provided to be common to all the pixels P by the chemical reaction as described above.

The electron injection section **46*b* is made of an electron transport material. On the other hand, the neighboring pixel electron blocking section 46*a*** is made of an electron blocking material that blocks the transportation of electrons. As the electron blocking material, for example, an organic insulating material can be used. Note that the electron blocking material may be a hole transport material.

The electron injection section **46*b* may be formed by forming a film of an electron transport material, or may be formed by converting (transforming) an organic insulating material or a hole transport material into an electron transport material by a chemical reaction. Accordingly, the electron injection section 46*b* may be formed by transforming an electron blocking material used for the neighboring pixel electron blocking section 46*a*** by a chemical reaction.

The neighboring pixel electron blocking section **46*a*** may be formed by forming a film of an organic insulating material or a hole transport material, or may be formed by converting (transforming) an organic insulating material or an electron transport material into a hole transport material by a chemical reaction.

However, the present embodiment is not limited to the above configuration. The electron injection section **46*b* and the neighboring pixel electron blocking section 46*a*** may be patterned with different materials from each other.

When the electron injection section **46*b* and the neighboring pixel electron blocking section 46*a*** are patterned with different materials, the patterning may be performed by any of the following methods, for example.

For example, when the materials of the electron injection section **46*b* and the neighboring pixel electron blocking section 46*a*** are powders (solids), examples of the patterning method include (1) a method of separate patterning vapor deposition using a fine metal mask (FMM), (2) an ink-jet method, and (3) a method of transferring the above materials into pixels RP, GP, and BP using silicon rubbers having patterns corresponding to the pixels RP, GP, and BP.

When the materials of the electron injection section **46*b* and the neighboring pixel electron blocking section 46*a*** are liquids, examples of the patterning method include the method (2) described above, the method (3) described above, (4) a method performing photolithography after applying the above materials onto the entire surface of the substrate, and (5) a method of laser processing.

In a case where the electron injection section 46*b* and the neighboring pixel electron blocking section 46*a* are patterned separately, when at least one of the electron injection section 46*b* and the neighboring pixel electron blocking section 46*a* is subjected to conversion (transformation) of the material, the conversion (transformation) of the material may be performed after patterning the section to be subjected to the conversion (transformation) of the material, or may be performed after patterning both the electron injection section 46*b* and the neighboring pixel electron blocking section 46*a*. When film formation and patterning are performed separately, the conversion (transformation) of the above material may be performed after patterning, or may be performed after film formation and before patterning.

When forming the electron injection section 46*b* and the neighboring pixel electron blocking section 46*a* by transforming at least part of the common layer by a chemical reaction as described above, the electron injection section 46*b* and the neighboring pixel electron blocking section 46*a* are chemically bonded to each other by covalent bonds.

On the other hand, when the electron injection section 46*b* and the neighboring pixel electron blocking section 46*a* are patterned with different materials from each other, the electron injection section 46*b* and the neighboring pixel electron blocking section 46*a* are chemically bonded to each other by, for example, intermolecular forces (van der Waals forces) or hydrogen bonds between chemical substances of the materials to form a single integrated layer. In this case as well, the neighboring pixel electron blocking section 46*a* formed integrally with the electron injection sections 46*b* is provided between the adjacent electron injection sections 46*b* in the same layer.

As the electron transport material, for example, at least one electron transport material selected from the group consisting of the electron transport materials exemplified in the first embodiment can be used.

As the organic insulating material, for example, at least one compound selected from the group consisting of the organic insulating materials exemplified in the first embodiment can be used.

As the hole transport material, for example, at least one hole transport material selected from the group consisting of the hole transport materials exemplified in the first embodiment can be used.

As described above, the electron injection section 46*b* may be formed, for example, by transforming the electron blocking material by a chemical reaction. As described in the first embodiment, organic insulating materials such as PI, PEI, and PAN have sufficient heat resistance and contain carbon so that the organic insulating materials are converted into graphene by exposure to laser light. As described in the first embodiment, graphene oxide is converted into graphene by reduction (reduced graphene oxide). Thus, the electron transport material may be graphene derived from an organic insulating material (derived graphene) or graphene obtained by reducing graphene oxide (reduced graphene oxide).

As described in the first embodiment, by introducing an electron-donating group into graphene oxide, a graphene derivative exhibiting electron transport properties may be obtained. A graphene derivative formed by introducing an electron-donating group into graphene exhibiting electron transport properties also exhibits electron transport properties. As described above, as the electron transport material, at least one material selected from the group consisting of, for example, graphene obtained by the transformation of graphene oxide which is a hole transport material (electron blocking material), a graphene derivative formed by introducing an electron-donating group into graphene, and a graphene oxide derivative formed by introducing an electron-donating group into graphene oxide may be used. In this case, it is possible to form the electron injection section 46*b* and the neighboring pixel electron blocking section 46*a* by transforming at least part of the common layer provided to be common to all the pixels P by a chemical reaction. According to the present embodiment, by introducing an electron-donating group into the graphene as described above, the HOMO level and the LUMO level may be made shallower. By introducing an electron-donating group into graphene as described above, energy levels may be adjusted in combination with layers around the EIL 46 (for example, the ETL 45 and the EML 44, a hole blocking layer (hereinafter referred to as "HBL") when the HBL (not illustrated) is provided, and the like). As a result, the electron injection efficiency may be improved. In addition, since the electron injection property and the electron mobility can be adjusted, the carrier balancing may be optimized.

As described in the first embodiment, as the hole transport material (electron blocking material), at least one material selected from the group consisting of, for example, graphene oxide obtained by the transformation of graphene which is an electron transport material, a graphene oxide derivative formed by introducing an electron-attracting group into graphene oxide, and a graphene derivative formed by introducing an electron-attracting group into graphene may be used. In this case as well, it is possible to form the electron injection section 46*b* and the neighboring pixel electron blocking section 46*a* by transforming at least part of the common layer provided to be common to all the pixels P by a chemical reaction.

Examples of the electron-donating group include a phenyl group, a derivative of a phenyl group, a pyrrolidine group, a derivative of a pyrrolidine group, and an amino group.

For example, doping or chemical reaction may be used to introduce the electron-donating group.

Examples of the method for introducing an electron-donating group into graphene include methods represented by Formulae (13) to (17) given below.

[Chem. 13]

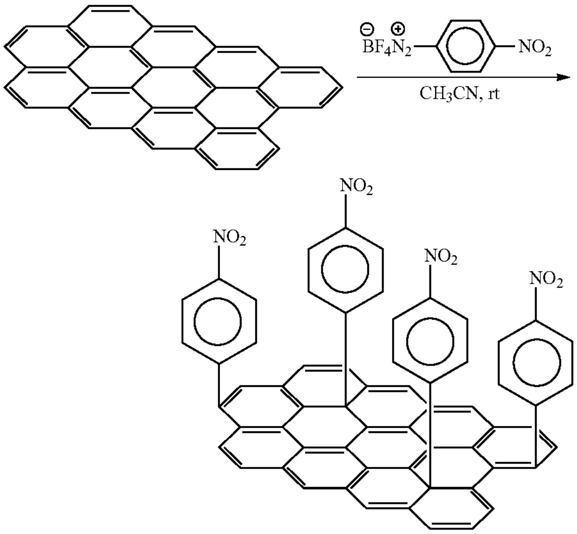

(13)

[Chem. 14]
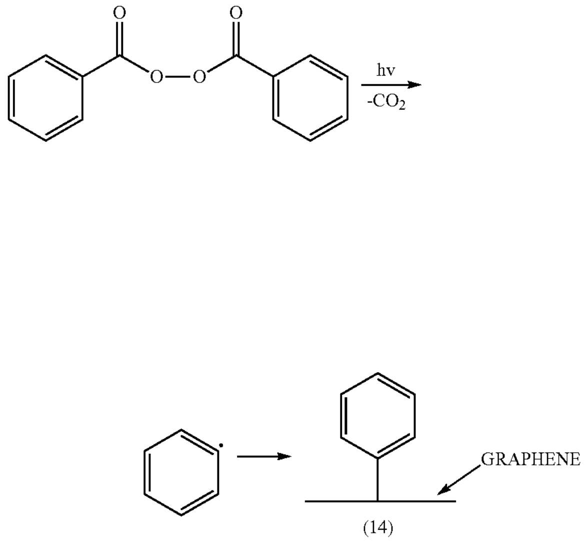
(14)
[Chem. 15]
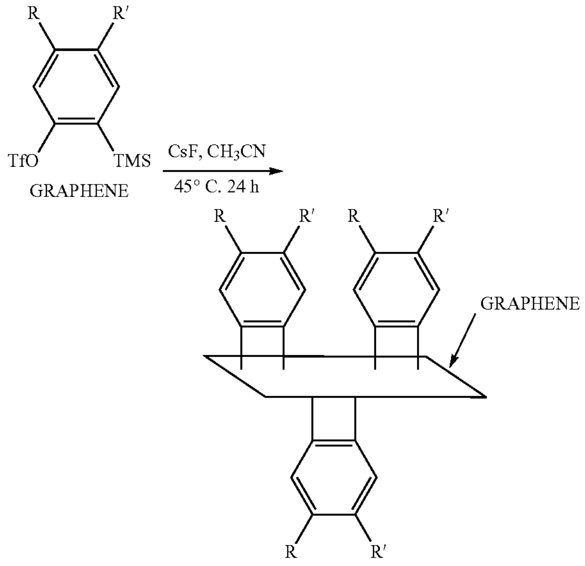
(15)
[Chem. 16]
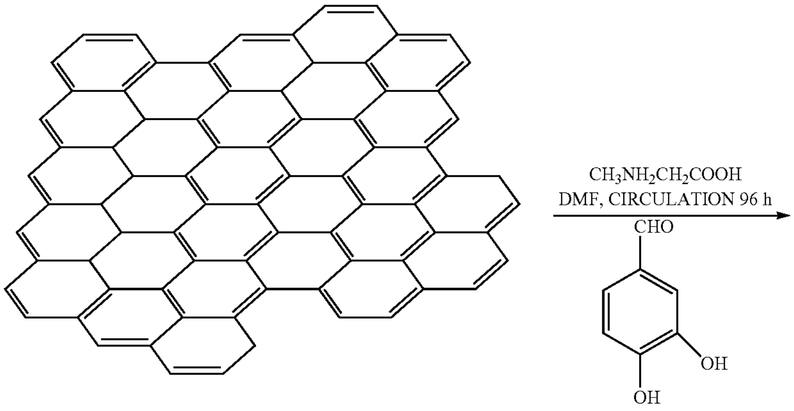

-continued
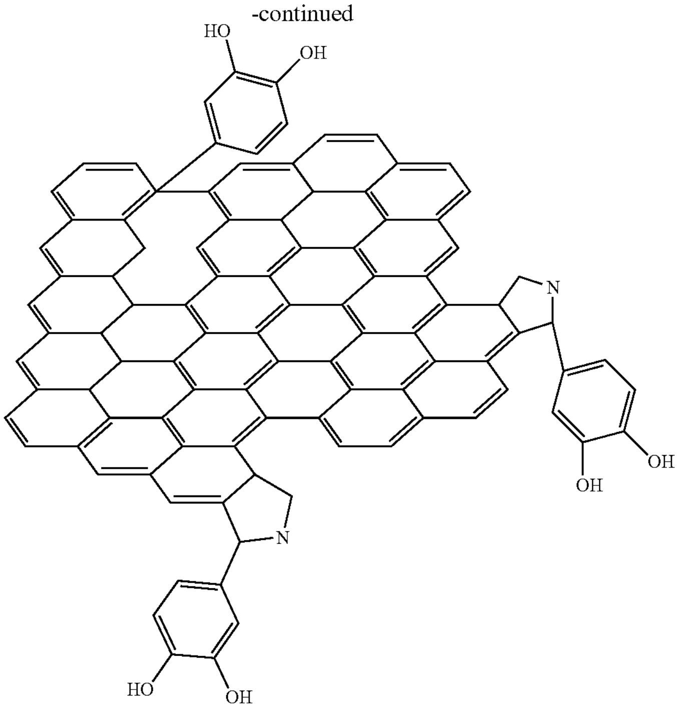
(16)
[Chem. 17]
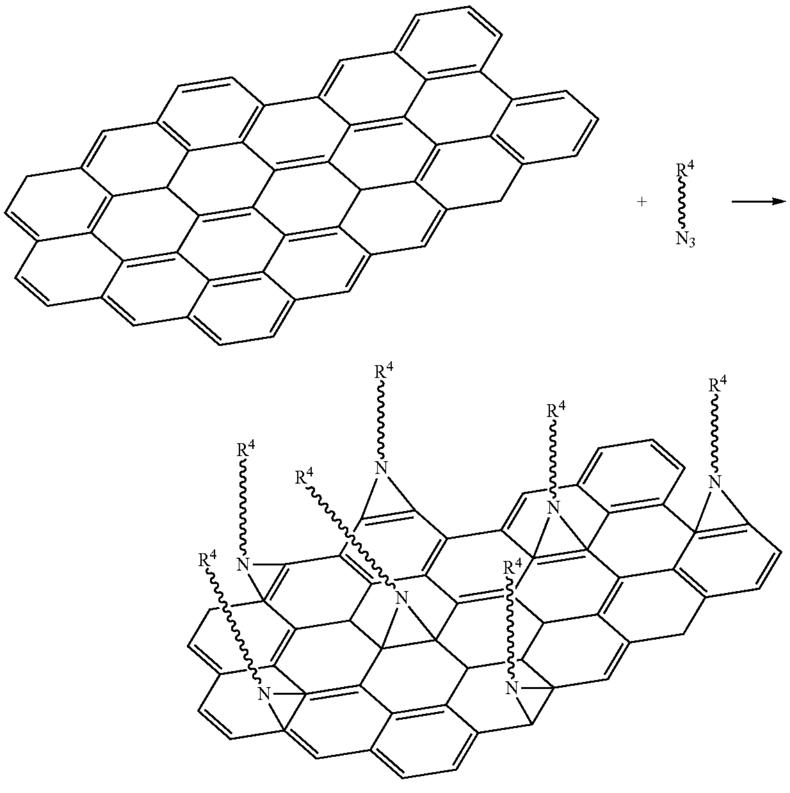
(17)

-continued

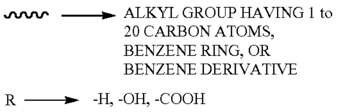

Formula (13) represents an example of a method for introducing a p-nitrophenyl group as a derivative of a phenyl group into graphene (see NPL 8). When the example represented by Formula (13) is used in the present embodiment, for example, first, a substrate on which a graphene film is formed is rotated at room temperature for seven hours in a 17 to 25-mol/$m^3$ acetonitrile solution of 4-nitrobenzene-diazonium-tetrafluoroborate. After the reaction, the substrate is rotated and washed in pure water for five hours. After the washing, the substrate is dried in a vacuum environment. Thus, a p-nitrophenyl group may be introduced into the graphene.

Formula (14) illustrates an example of a method for introducing a phenyl group into graphene (see NPL 9). When the example represented by Formula (14) is used in the present embodiment, for example, a substrate on which a graphene film is formed is immersed in a 5-mol/$m^3$ toluene solution of benzoyl peroxide, and an argon ion laser beam (wavelength $\lambda$=514.5 nm, 0.4 mW) is emitted toward a pixel region through the solution at room temperature. The benzoyl peroxide is decomposed after the irradiation of the laser beam, so that carbon dioxide ($CO_2$) is released as a gas, the remaining benzene ring becomes a radical of benzene, and the benzene ring and the graphene form a covalent bond, whereby the graphene is subjected to chemical modification with the phenyl group.

Formula (15) represents an example of a method for introducing a phenyl group or a derivative of a phenyl group into the above-described flake-like single graphene (graphene thin film) as graphene (see NPL 10). Note that in Formula (15), R and R' each independently represent a hydrogen atom, a halogen atom, or an alkyl group having 1 to 20 carbon atoms. In Formula (15), a —TfO group represents a trifluoromethane-sulfonyloxy ($-SO_3CF_3$, triflate) group, and a —TMS group represents a trimethylsilyl ($-Si(CH_3)_3$) group. In the case of using the example represented by Formula (15) in the present embodiment, for example, when R and R' are hydrogen atoms, first, a substrate on which a 24-mg graphene film is formed, for example, is immersed and rotated in acetonitrile, 5 mmol of trifluoromethane-sulfonate 2-(trimethylsilyl) phenyl and 10 mmol of cesium fluoride (CsF) are added, and the substrate is rotated at 45° C. for 24 hours for reaction. Thereafter, the substrate is taken out from the reaction solution, then washed with N, N-dimethylformamide ("DMF"), water and ethanol in this order, and vacuum-dried. Thus, a phenyl group may be introduced into each of pieces of flake-like graphene (graphene thin films) constituting the graphene film. When a derivative of a phenyl group is introduced into graphene, the derivative of the phenyl group may be introduced in a similar manner.

Formula (16) represents an example of a method for introducing a derivative of a pyrrolidine group and a phenyl group into graphene (see NPL 11). When the example represented by Formula (16) is used in the present embodiment, for example, a substrate on which a 50-mg graphene film is formed is first immersed and rotated in 10-mL pyridine, 50 mL of DMF is added, and then 50 mg of sarcosine ($CH_3NH_2CH_2COOH$) and 50 mg of protocatechualdehyde ($(OH)_2C_6H_3CHO$) are further added. Subsequently, this mixed solution is circulated at 145 to 150° C. for 96 hours while the substrate being rotated. After the circulation, the substrate is taken out from the mixed solution, then washed with DMF, ethanol and dichloromethane in this order, and vacuum-dried. Thus, the above-mentioned derivative may be introduced into the graphene.

Formula (17) represents an example of a method for introducing an amino group into graphene (see NPL 12). In the case of using the example represented by Formula (17) in the present embodiment, for example, first, a substrate on which a graphene film is formed is immersed in an acetone solution of azide (10 mg/mL) and rotated for several minutes. Thereafter, the substrate is taken out from the solution and dried, and then irradiated with UV ($\lambda$max=254 nm) for five minutes. Thereafter, the substrate is washed with acetone. Thus, an amino group may be introduced into the graphene.

As a method for introducing an electron-donating group into graphene oxide, a method similar to the method for introducing an electron-donating group into graphene may be used. For example, when graphene oxide is used instead of graphene in Formulae (13) or (17), an electron-donating group may be introduced into the graphene oxide.

The above-described methods are examples, and the method for introducing an electron-donating group into graphene or graphene oxide is not limited to the above-described methods. The method for obtaining a goal graphene derivative or a goal graphene oxide derivative is not limited to one method.

As described above, for example, by converting part of the common layer made of the organic insulating material or the hole transport material into an electron transport material, the electron injection section **46*b* made of the electron transport material and the neighboring pixel electron blocking section 46*a*** made of the organic insulating material or the hole transport material that has not been converted into the electron transport material can be integrally formed in the same layer.

For example, by converting part of the common layer made of the electron transport material into a hole transport material, the neighboring pixel electron blocking section **46*a* made of the electron transport material and the electron injection section 46*b*** made of the electron transport material that has not been converted into the hole transport material can be integrally formed in the same layer.

The thickness of the EIL 46 is more preferably 0.5 nm or more for improving the electron injection property. The thickness of the EIL 46 is more preferably 30 nm or less for adjusting the optical path length.

The electron injection section **46*b* and the neighboring pixel electron blocking section 46*a* preferably have substantially the same thickness as described above, but they may have different thicknesses from each other. In a case where the electron injection section 46*b* is formed by transforming an organic insulating material by a chemical reaction, when the thickness of a portion made of the organic insulating material that has not been transformed is in a range from 0.5 nm to 3 nm, it is possible to transport electrons to the EML 44 by the tunneling effect. Because of this, when the thickness of the EIL 46 is greater than 3 nm at which the tunneling effect is not expressed, and the thickness of a portion made of the organic insulating material that has not been transformed is in a range from 0.5 nm to 3 nm at which the tunneling effect is expressed, the electron injection section 46***b* may be provided only on the surface of the EIL 46.

On the other hand, a known electron transport material may be used for the ETL 45. The electron transport material is not limited to any specific material, and for example, at least one electron transport material selected from the group consisting of the electron transport materials exemplified above may be used. For example, the ETL 45 may be graphene, a graphene derivative formed by introducing an electron-donating group into graphene, a graphene oxide derivative formed by introducing an electron-donating group into graphene oxide, or a mixed material of these electron transport materials and resin (for example, the above-discussed resin exemplified as an electron transport material).

The electron transport material used for the ETL 45 and the electron transport material used for the electron injection section 46*b* of the EIL 46 are appropriately selected so that the HOMO level, the LUMO level, and the gap between the HOMO level and the LUMO level in each of the ETL 45 and the electron injection section 46*b* have the relationship described in FIG. 3, for example.

The thickness of the ETL 45 may be set in a similar manner as in a known technique. The thickness of the ETL 45 is set in a range from 30 nm to 300 nm, for example, in order to adjust the optical path length.

In the present embodiment, a known hole transport material may be used for the HIL 42 and the HTL 43. The hole transport material is not limited to any specific material, and for example, at least one hole transport material selected from the group consisting of the hole transport materials exemplified in the first embodiment, for example, may be used.

A light-emitting element RES illustrated in FIG. 18 includes a cathode electrode 47R, an EIL 46R, an ETL 45R, an EML 44R, the HTL 43, the HIL 42, and the anode electrode 41. A light-emitting element GES includes a cathode electrode 47G, an EIL 46G, an ETL 45G, an EML 44G, the HTL 43, the HIL 42, and the anode electrode 41. A light-emitting element BES includes a cathode electrode 47B, an EIL 46B, an ETL 45B, an EML 44B, the HTL 43, the HIL 42, and the anode electrode 41. The EIL 46R is the electron injection section 46*b* of the EIL 46 in the pixel RP. The EIL 46G is the electron injection section 46*b* of the EIL 46 in the pixel GP. The EIL 46B is the electron injection section 46*b* of the EIL 46 in the pixel BP.

Step of Forming Light-Emitting Element Layer 4

Steps of forming the light-emitting element layer 4 will be described below as a difference from the first embodiment.

Figure 19:
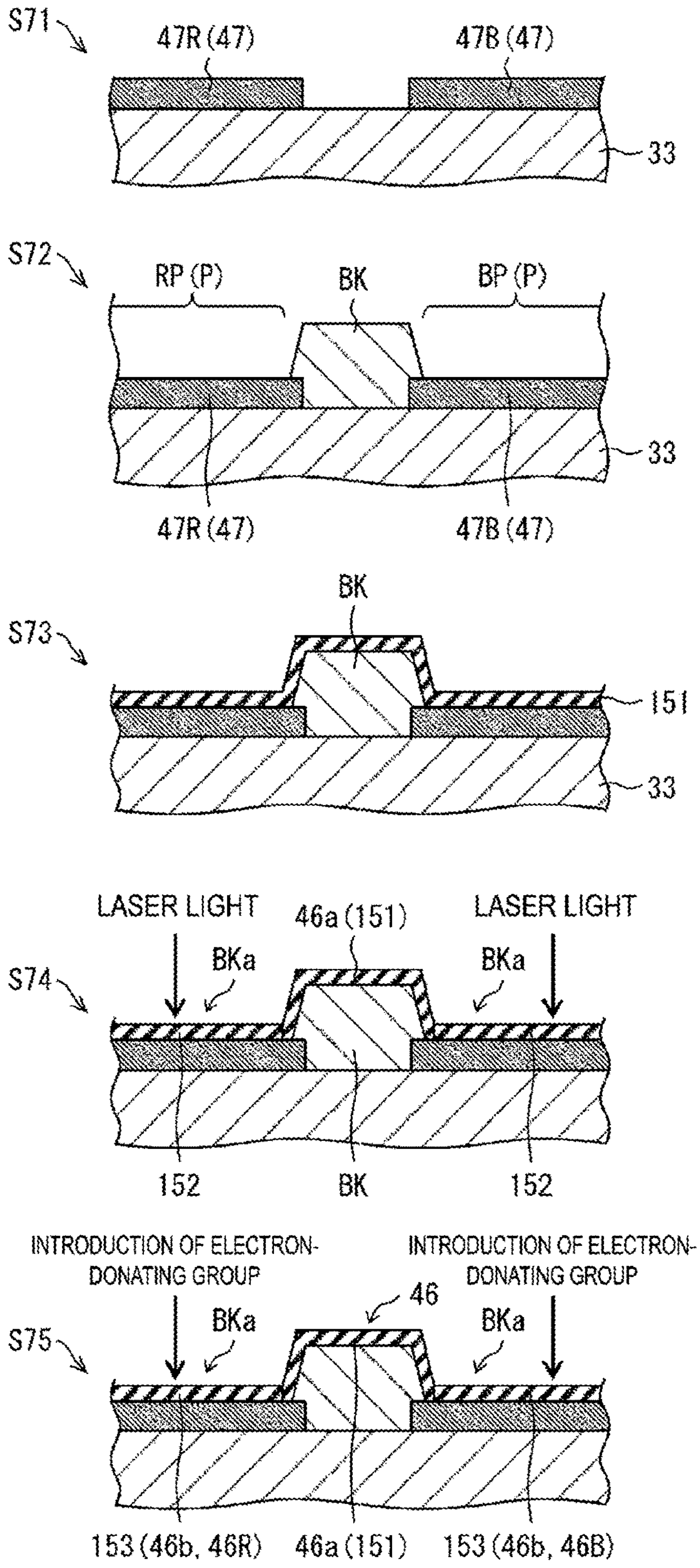
FIG. 19 includes cross-sectional views illustrating some of steps of forming a light-emitting element layer in the display device according to the second embodiment in order of the steps.
Figure 20:
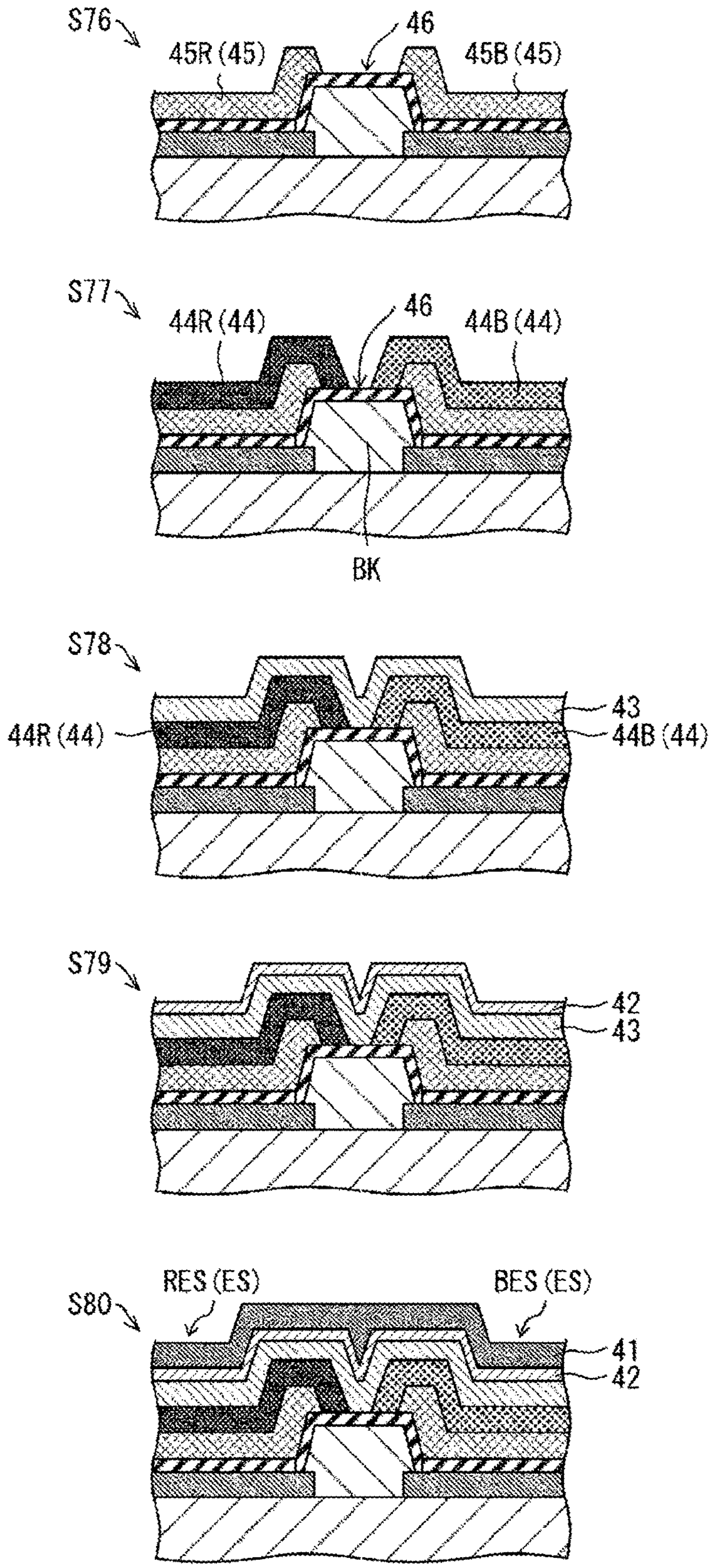
FIG. 20 includes other cross-sectional views illustrating some of the steps of forming the light-emitting element layer in the display device according to the second embodiment in order of the steps.

FIGS. 19 and 20 each illustrate cross-sectional views of some of the steps of forming the light-emitting element layer 4 in step S2 in order of the steps. FIG. 20 illustrates manufacturing steps after the manufacturing steps illustrated in FIG. 19. FIGS. 19 and 20 illustrate cross sections corresponding to part of the cross section taken along the line B-B' illustrated in FIG. 2. Step S2 includes steps S71 to S75 illustrated in FIG. 19 and steps S76 to S80 illustrated in FIG. 20.

In the following, a case of forming the electron injection section 46*b* and the neighboring pixel electron blocking section 46*a* by transforming at least part of an organic insulating film provided to be common to all the pixels P as a common layer by a chemical reaction will be described as an example.

In step S2, first, as illustrated in S71 in FIG. 19, the cathode electrode 47 is patterned as the lower electrode on a flattening film 33 in a thin film transistor layer 3 in an island shape for each pixel P (step S71, step of forming the lower electrode). A method similar to the method of forming the cathode electrode 47 according to the first embodiment may be used to form the cathode electrode 47.

Subsequently, as illustrated in S72 in FIG. 19, a bank BK to serve as a pixel separation film is formed on the flattening film 33 in such a manner as to cover a pattern edge of the cathode electrode 47 of each pixel P (step S72). A method similar to the method of forming the bank BK according to the first embodiment can be used to form the bank BK.

Subsequently, as illustrated in S73 in FIG. 19, on the cathode electrode 47 and the bank BK, an organic insulating film 151 is formed by forming a film of an organic insulating material to be converted into a material exhibiting electron transport properties by a chemical reaction in a solid-like form over all the pixels P (step S73, first film formation step).

In the following, a case in which a resin to serve as a graphene precursor material that is converted into graphene by exposure to laser light is used for the organic insulating film 151 will be described as an example. The same material used for the organic insulating film 111 may be used for the organic insulating film 151. In this case, the method of forming the organic insulating film 151 is the same as the method of forming the organic insulating film 111 in step S13. Therefore, description of the method of forming the organic insulating film 151 is omitted herein.

Subsequently, as illustrated in S74 in FIG. 19, by selectively irradiating only the inside of each pixel P (specifically, the inside of an opening BKa of the bank BK) with laser light, the organic insulating film 115 in each pixel P is converted into graphene. With this, a graphene film 152 is formed in each pixel P, and the neighboring pixel electron blocking section 46*a* made of the organic insulating film 151 is formed between the adjacent pixels P to block the transportation of electrons between the light-emitting elements ES of the pixels P (step S74, first transformation step, first carrier injection section transformation step).

The method of converting the organic insulating film 151 in each pixel P into the graphene film 152 is the same as the method of converting the organic insulating film 111 in each pixel P into the graphene film 112 in step S14 illustrated in FIG. 5. Therefore, description of the method of converting the organic insulating film 151 in each pixel P into the graphene film 152 is omitted.

Subsequently, as illustrated in S75 of FIG. 19, for example, an electron-donating group is introduced as needed into the graphene constituting the graphene film 152. With this, the graphene film 152 is transformed to a graphene derivative film 153 made of a graphene derivative having been subjected to chemical modification with the electron-donating group (step S75, first transformation step, first carrier injection section transformation step).

The method of introducing the electron-donating group into the graphene to transform the graphene film 152 to the graphene derivative film 153 is not particularly limited, and the above-described various methods represented by Formulae (13) to (17), for example, may be used.

According to the present embodiment, the electron injection section 46*b* made of the graphene derivative film 153 may be formed in each pixel P through the above-discussed steps. According to the present embodiment, by introducing an electron-donating group as needed into graphene which is an electron transport material, an electron transport material having a higher energy level may be obtained. As described above, step S75 is not always necessary.

Subsequently, as illustrated in S76 in FIG. 20, the ETL 45 is formed, for each pixel P, on the EIL 46 provided with the neighboring pixel electron blocking section 46*a* and the electron injection section 46*b* (step S76, step of forming a first carrier transport layer).

When the adjustment of the energy levels illustrated in step S75 is unnecessary, the process proceeds to step S76 after step S74. In this case, the electron injection section 46*b* made of the graphene film 152 may be formed in each pixel P by step S74.

In step S76, the ETL 45 is formed in an island shape for each pixel P (in other words, for each light-emitting element ES) to cover at least the opening BKa of the bank BK corresponding to each pixel P. The method of forming the ETL 45 is not limited to any specific method as long as the method is capable of forming a fine pattern required for the light-emitting element ES. Any of various known methods for forming an ETL, such as vapor deposition and an ink-jet method, may be used to form the ETL 45.

Subsequently, as illustrated in S77 in FIG. 20, the EML 44 is formed, for each pixel P, on the EIL 46 to cover the ETL 45 (step S77, step of forming a light-emitting layer). A method similar to the method of forming the EML 44 according to the first embodiment may be used to form the EML 44.

Then, as illustrated in S78 in FIG. 20, the HTL 43 is formed on the EML 44 (step S78). Subsequently, as illustrated in S79 in FIG. 20, the HIL 42 is formed on the HTL 43 (step S79). In the present embodiment, the HTL 43 and the HIL 42 are provided as common layers common to all the pixels P as illustrated in FIG. 18, but the present embodiment is not limited thereto. Similar to the EIL 46 and the EML 44, the HTL 43 and HIL 42 may each be formed in an island shape for each pixel P (in other words, for each light-emitting element ES) to cover at least the opening BKa of the bank BK corresponding to each pixel P. Any of various known methods for forming an HTL and HIL, such as vapor deposition and an ink-jet method, may be used to form the HTL 43 and HIL 42.

Subsequently, as illustrated in S80 in FIG. 20, the anode electrode 41 is formed as the upper electrode on the HIL 42 (step S80, step of forming the upper electrode). Any of various known methods for forming a cathode electrode, such as sputtering, a vacuum vapor deposition technique, CVD, plasma CVD, and a printing method, can be used to form the anode electrode 41.

Thus, the light-emitting element layer 4 including the plurality of light-emitting elements ES is formed on the flattening film 33.

Advantageous Effects

As illustrated in FIG. 18, the display device 1 according to the present embodiment is provided with the neighboring pixel electron blocking section 46*a* between the light-emitting elements ES of the adjacent pixels P for blocking the transportation of electrons between the light-emitting elements ES of the adjacent pixels P. Thus, in the present embodiment, the transportation of electrons to the light-emitting elements ES in the adjacent pixels P is blocked. Thus, according to the present embodiment, it is possible to provide the display device 1, in which crosstalk does not occur.

According to the present embodiment, the electron injection section 46*b* and the neighboring pixel electron blocking section 46*a* are part of the EIL 46 as a common layer. The EIL 46 and the display device 1 including the EIL 46 according to the present embodiment are simply processed as compared to a case in which the EIL 46 is formed in an island shape for each pixel P, and the material constituting the EIL 46 may be replaced with an inexpensive material. Therefore, the manufacturing costs may be significantly reduced.

In particular, organic insulating materials used as graphene precursors are inexpensive compared to known electron transport materials, and have high temperature stability and high chemical stability. Thus, according to the present embodiment, it is possible to provide the display device 1 more reliable than a display device formed using a known electron transport material.

In addition, the organic materials of related art used for the EIL may have poor adhesion between each other. However, according to the present embodiment, as described above, the electron injection section 46*b* and the neighboring pixel electron blocking section 46*a* are part of the EIL 46 as the common layer, are chemically bonded to each other, and are integrally formed with each other in the same layer. Thus, according to the present embodiment, the adhesion between the materials used in the electron injection section 46*b* and the neighboring pixel electron blocking section 46*a* is high, thereby making it possible to prevent foreign matters such as water or oxygen from penetrating from the outside. Thus, according to the present embodiment, it is possible to provide the display device 1 with higher reliability.

First Modified Example

In the present embodiment, as the method for manufacturing the display device 1, the case in which the electron injection section 46*b* is made of a graphene derivative made of graphene chemically modified with an electron-donating group or made of graphene has been described as an example. However, as described above, the electron injection section 46*b* may be formed of a graphene oxide derivative made of a graphene oxide having been subjected to chemical modification with an electron-donating group.

The method of converting graphene into graphene oxide is, for example, the same as the method of converting the graphene film 112 into the graphene oxide film 114 in step S21 illustrated in FIG. 10 or the method of converting the graphene film 131 into the graphene oxide film 132 in step S53 illustrated in FIG. 14. As described above, as a method for introducing an electron-donating group into graphene oxide, a method similar to the method for introducing an electron-donating group into graphene may be used.

Accordingly, in the case of forming the electron injection section 46*b* made of graphene oxide chemically modified with an electron-donating group, the organic insulating film 151 in each pixel P is converted into the graphene film 152 in step S74, and then the graphene film 152 is first transformed/converted into a graphene oxide film by, for example, the method illustrated in step S21 or step S53 discussed above. Thereafter, an electron-donating group may be introduced into the graphene oxide film by a method similar to the method described in step S75. Thus, the electron injection section 46*b* made of the graphene oxide chemically modified with the electron-donating group may be formed. Note that the above-described method is merely an example, and therefore the method for introducing an electron-donating group into graphene oxide is not limited to the above-described method.

Second Modified Example

In FIG. 19 and in the first modified example, for example, as illustrated in S75 in FIG. 19, the case in which the neighboring pixel electron blocking section 46*a* is part of the organic insulating film 151 and is made of an organic insulating material (resin) used for the organic insulating film 151 has been described as an example. However, as previously mentioned, the electron blocking material constituting the neighboring pixel electron blocking section 46*a* may be a hole transport material.

In the present modified example, a case in which, by converting (transforming) part of a film made of a hole transport material into an electron transport film by a chemical reaction, the neighboring pixel electron blocking section 46*a* made of a hole transport material and the electron injection section 46*b* made of an electron transport material will be described as an example.

Figure 21:
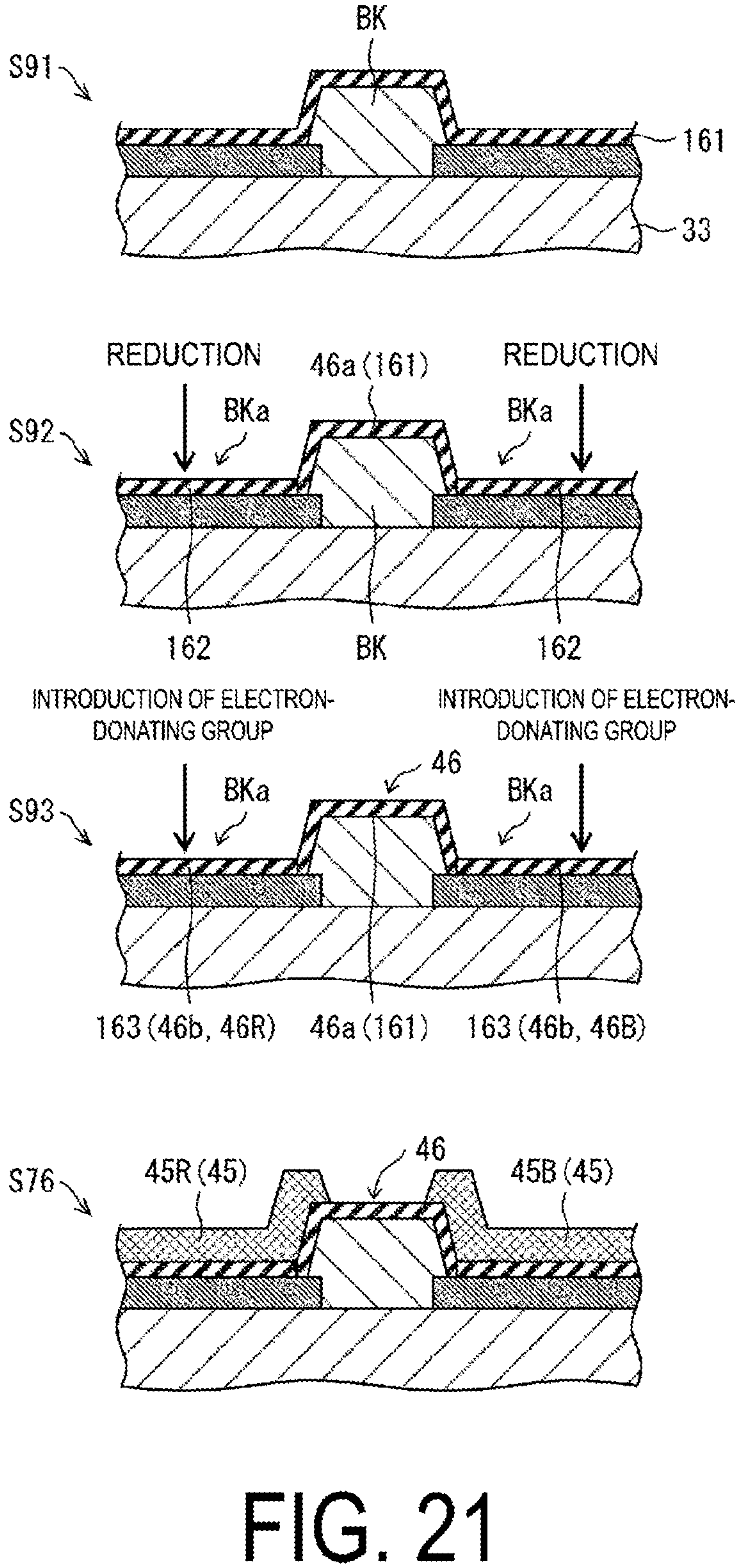
FIG. 21 includes cross-sectional views illustrating some of steps of forming a light-emitting element layer in a display device according to a second modified example of the second embodiment in order of the steps.

FIG. 21 illustrates cross-sectional views of some of the steps of forming the light-emitting element layer 4 in the display device 1 according to the present modified example in order of the steps. FIG. 21 illustrates some of the manufacturing steps after step S72 illustrated in FIG. 19. FIG. 21 also illustrates cross sections corresponding to part of the cross section taken along the line B-B' illustrated in FIG. 2.

In the example illustrated in FIG. 21, after step S72, which is the same as step S72 illustrated in FIG. 19, as illustrated in S91 in FIG. 21, on the cathode electrode 47 and the bank BK, a hole transport film made of a hole transport material to be converted into a material exhibiting electron transport properties by a chemical reaction is formed in a solid-like form over all the pixels P (step S91, first film formation step).

Examples of the hole transport material include graphene oxide as described above. In the following, a case in which the hole transport film is a graphene oxide film 161 will be described as an example. In this case, the method of forming the graphene oxide film 161 is the same as the method of forming the graphene oxide film 121 in step S41 in the first embodiment. Therefore, description of the method of forming the graphene oxide film 161 is omitted herein.

Subsequently, as illustrated in S92 in FIG. 21, the graphene oxide film 161 in each pixel P (specifically, in the opening BKa of the bank BK) is selectively reduced by, for example, irradiating with a femtosecond laser. With this, the graphene oxide film 161 in each pixel P is converted into a graphene film 162 (reduced graphene oxide film). Thus, the neighboring pixel electron blocking section 46*a* made of the graphene oxide film 161 having hole transport properties and the electron injection section 46*b* made of the graphene film 162 having electron transport properties are formed (step S92, first film formation step, first carrier injection section transformation step).

Subsequently, as illustrated in S93 of FIG. 21, for example, an electron-donating group is introduced as needed into the graphene constituting the graphene film 162. With this, the graphene film 162 is transformed to a graphene derivative film 163 made of a graphene derivative having been subjected to chemical modification with the electron-donating group (step S93, first transformation step, first carrier injection section transformation step).

The method of introducing the electron-donating group into the graphene to transform the graphene film 162 to the graphene derivative film 163 is not particularly limited, and the above-described various methods represented by Formulae (13) to (17), for example, may be used.

According to the present embodiment, the electron injection section 46*b* made of the graphene derivative film 163 may be formed in each pixel P through the above-discussed steps. According to the present embodiment, by introducing an electron-donating group as needed into graphene which is an electron transport material, an electron transport material having a higher energy level may be obtained. As described above, step S93 is not always necessary.

Subsequently, as illustrated in S76 in FIG. 21, step S76, which is the same as step S76 illustrated in FIG. 20, is performed to form the ETL 45 for each pixel P on the EIL 46 provided with the neighboring pixel electron blocking section 46*a* and the electron injection section 46*b*. Thereafter, by performing steps S77 to S80 illustrated in FIG. 20, the light-emitting element layer 4 is formed including the light-emitting element ES with the neighboring pixel electron blocking section 46*a* made of the hole transport material.

In the present modified example, as described above, the case in which, for example, a femtosecond laser is used for the reduction of the graphene oxide film 161 has been described as an example. However, the method of reducing the graphene oxide film 161 is not particularly limited as long as part of the graphene oxide film 161 can be selectively reduced.

In FIG. 21, the case in which the neighboring pixel hole blocking section 42*a* is made of graphene as the electron transport material when the hole injection section 42*b* in the EIL 46 is made of graphene oxide, is exemplified and explained. However, in the present modified example as well, the hole injection section 42*b* in the HIL 42 may be, for example, a graphene oxide derivative formed by introducing an electron-attracting group into graphene oxide. The method of introducing the electron-attracting group into the graphene oxide of the hole injection section 42*b* is, for example, the same as the method of introducing the electron-attracting group into the graphene oxide in step S22 illustrated in FIG. 11. Therefore, description of the method for transforming the graphene oxide film 121 in the hole injection section 42*b* to a graphene oxide derivative film made of the graphene oxide derivative having been subjected to chemical modification with the electron-attracting group is omitted.

In the present modified example, the case in which the electron injection section 46*b* made of an electron transport material is formed by reducing graphene oxide to graphene once and then introducing an electron-donating group into the graphene to convert the graphene film 162 into the graphene derivative film 163, has been described as an example. However, the present embodiment is not limited to this example. For example, after step S91, without performing step S92, as illustrated in step S93, by selectively introducing an electron-donating group into the graphene oxide film 161 in each pixel P (specifically, in the opening BKa of the bank BK), the electron injection section 46*b* made of a graphene oxide derivative chemically modified with the electron-donating group may be formed. As described above, as a method for introducing an electron-donating group into the graphene oxide, a method similar to the method for introducing an electron-donating group into the graphene may be used.

Third Modified Example

In the present modified example, a case in which, by converting (transforming) part of a film made of an electron transport material into a hole transport film by a chemical reaction, the neighboring pixel electron blocking section 46*a* made of a hole transport material and the electron injection section 46*b* made of an electron transport material will be described as an example.

Figure 22:
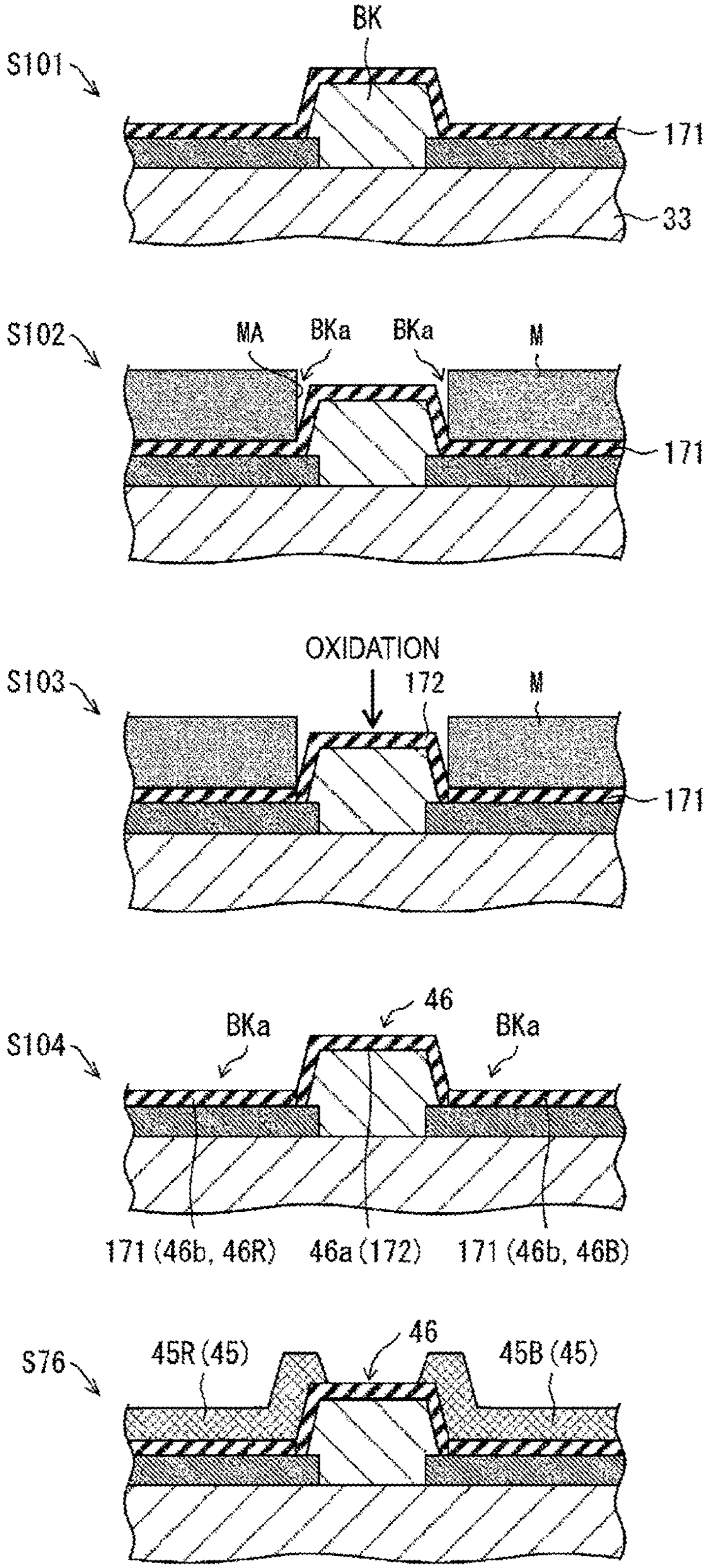
FIG. 22 includes cross-sectional views illustrating some of steps of forming a light-emitting element layer in a display device according to a third modified example of the second embodiment in order of the steps.

FIG. 22 illustrates cross-sectional views of an example of some of the steps of forming the light-emitting element layer 4 in the display device 1 according to the present modified example in order of the steps. FIG. 22 illustrates some of the manufacturing steps after step S72 illustrated in FIG. 19. FIG. 22 also illustrates cross sections corresponding to part of the cross section taken along the line B-B' illustrated in FIG. 2.

In the example illustrated in FIG. 22, after step S72, which is the same as step S72 illustrated in FIG. 19, as illustrated in S101 in FIG. 22, on the cathode electrode 47 and the bank BK, an electron transport film made of an electron transport material to be converted into a material exhibiting hole transport properties by a chemical reaction is formed in a solid-like form over all the pixels P (step S101, first film formation step).

Examples of the electron transport material include graphene as described above. In the following, a case in which the electron transport film is a graphene film 171 will be described as an example. In this case, the method of forming the graphene film 171 is the same as the method of forming the graphene film 131 in step S51 in the first embodiment. Therefore, description of the method of forming the graphene film 171 is omitted herein.

Subsequently, part of the graphene film 171 is selectively oxidized to convert the graphene film 171 between the light-emitting elements ES of the adjacent pixels P into a graphene oxide film 172.

Specifically, for example, as illustrated in S103 in FIG. 22, a mask M made of, for example, PMMA is formed on the graphene film 171 by photolithography, the mask M covering the graphene film 171 in the opening BKa of the bank BK and having an opening MA for exposing the graphene film 171 between the light-emitting elements ES (step S102, first transformation step).

Subsequently, as illustrated in S103 in FIG. 22, a portion of the graphene film 171 exposed through the mask opening MA is subjected to, for example, $UV/O_3$ treatment. Thus, the portion of the graphene film 171 exposed through the mask opening MA is selectively oxidized and selectively converted into the graphene oxide film 172 (step S103, first transformation step).

Thereafter, as illustrated in S104 in FIG. 22, the mask M is removed (step S104, first transformation step). For example, acetone or the like can be used for removing the mask M. Thus, the neighboring pixel electron blocking section 46*a* made of the graphene oxide film 172 having hole transport properties and the electron injection section 46*b* made of the graphene film 171 having electron transport properties are formed.

Subsequently, as illustrated in S76 in FIG. 22, step S76, which is the same as step S76 illustrated in FIG. 20, is performed to form the ETL 45 for each pixel P on the EIL 46 provided with the neighboring pixel electron blocking section 46*a* and the electron injection section 46*b*. Thereafter, by performing steps S77 to S80 illustrated in FIG. 20, the light-emitting element layer 4 is formed including the light-emitting element ES with the neighboring pixel electron blocking section 46*a* made of the hole transport material.

In the present modified example, as described above, the case in which the graphene film 171 is oxidized by, for example, $UV/O_3$ treatment has been described as an example. However, the method of oxidizing the graphene film 171 is not particularly limited as long as part of the graphene film 171 can be selectively oxidized.

In FIG. 22, the case in which the electron injection section 46*b* is made of graphene as an electron transport material when the neighboring pixel electron blocking section 46*a* in the EIL 46 is made of graphene oxide, is exemplified and explained. However, in the present modified example as well, the electron injection section 46*b* in the EIL 46 may be, for example, a graphene derivative formed by introducing an electron-donating group into graphene. The method of introducing the electron-donating group into the graphene of the electron injection section 46*b* is, for example, the same as the method of introducing the electron-attracting group into the graphene in step S75 illustrated in FIG. 19. Therefore, description of the method for transforming the graphene film 171 in the electron injection section 46*b* to a graphene derivative film made of the graphene derivative having been subjected to chemical modification with the electron-donating group is omitted.

In the present modified example as well, the neighboring pixel electron blocking section 46*a* in the EIL 46 may be, for example, a graphene derivative formed by introducing an electron-attracting group into graphene. Accordingly, in step S103 in FIG. 22, the portion of the graphene film 171 exposed through the mask opening MA may be selectively converted into a graphene derivative film made of a graphene derivative having been subjected to chemical modification with the electron-attracting group instead of being selectively oxidized. In step S103 in FIG. 22, the method of introducing the electron-attracting group into the graphene of the portion of the graphene film 171 exposed through the mask opening MA is, for example, the same as the method of introducing the electron-attracting group into the graphene in step S15 illustrated in FIG. 5 in the first embodiment. Therefore, description of the method for transforming the graphene film 171 in the neighboring pixel electron blocking section 46*a* to a graphene derivative film made of the graphene derivative having been subjected to chemical modification with the electron-attracting group is omitted.

Fourth Modified Example

The neighboring pixel electron blocking section 46*a* and the electron injection section 46*b* may be patterned such that they are chemically bonded to finally form a single layer. In the present modified example, a case in which the neighboring pixel electron blocking section 46*a* and the electron injection section 46*b* are patterned with different materials from each other will be described as an example.

Figure 23:
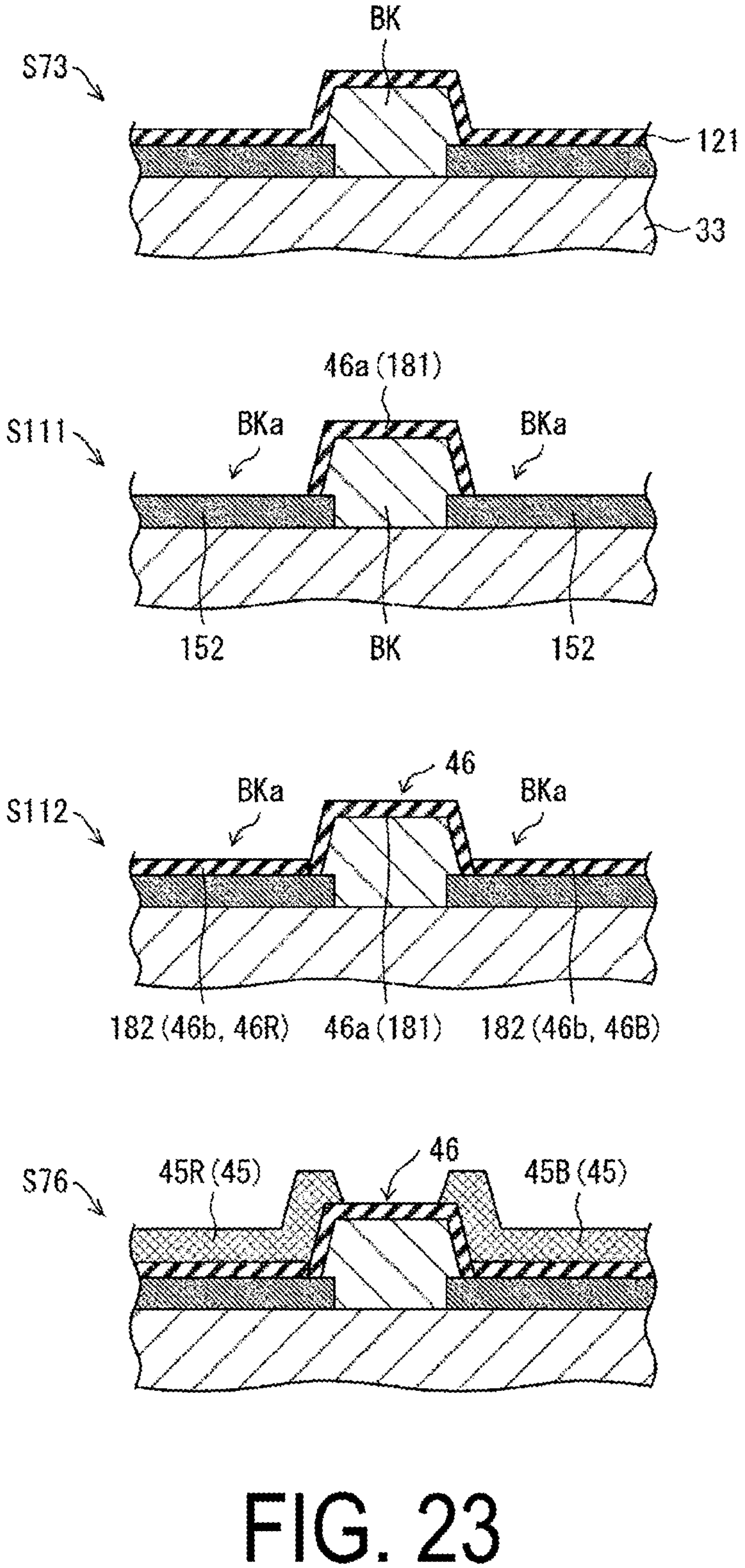
FIG. 23 includes cross-sectional views illustrating some of steps of forming a light-emitting element layer in a display device according to a fourth modified example of the second embodiment in order of the steps.

FIG. 23 illustrates cross-sectional views of some of the steps of forming the light-emitting element layer 4 in the display device 1 according to the present modified example in order of the steps. FIG. 23 illustrates some of the manufacturing steps after step S72 illustrated in FIG. 19. FIG. 23 also illustrates cross sections corresponding to part of the cross section taken along the line B-B' illustrated in FIG. 2.

In the example illustrated in FIG. 23, after step S72, which is the same as step S72 illustrated in FIG. 19, as illustrated in S111 in FIG. 23, a film 181 made of an electron blocking material is patterned as the neighboring pixel electron blocking section 46*a* on the cathode electrode 47 and the bank BK (step S108, step of patterning a carrier transport section). The film 181 made of the electron blocking material may be an organic insulating material or a hole transport material. In this case, any of the various materials described above can be used for the organic insulating material or the hole transport material.

The method of patterning the film 181 made of the electron blocking material is not limited to any specific method, and for example, any of the patterning methods (1) to (5) described above may be used.

When the film 181 made of the electron blocking material is, for example, a graphene oxide film obtained by oxidizing a graphene film, a patterned graphene film may be oxidized, or after oxidizing a solid-like graphene film, the obtained graphene oxide film may be patterned.

Similarly, when the film 181 made of the electron blocking material is, for example, a graphene oxide film obtained by converting an organic insulating film into graphene and then oxidizing the obtained graphene film, the order of the organic insulating film conversion into the graphene and the graphene film oxidation, and the patterning is not particularly limited. For example, after patterning the organic insulating film, the oxidation of the graphene film obtained by converting the organic insulating film may be performed, or after oxidizing the graphene film obtained by converting the organic insulating film, the obtained graphene oxide film may be patterned. Alternatively, patterning of the graphene film may be performed between the conversion of the organic insulating film into graphene and the oxidation of the graphene film.

A known patterning technique such as photolithography or laser processing can be used for the patterning.

In the present modified example, after patterning the film 181 made of the electron blocking material in this manner, a film 182 made of an electron transport material is patterned as the electron injection section 46*b* as illustrated in S112 in FIG. 23 (step S112, step of patterning the neighboring pixel carrier blocking section). At this time, the film 182 made of the electron transport material is patterned to cover the cathode electrode 47 in each pixel P (specifically, a region surrounded by the film 181 made of the electron blocking material). Any of the various materials described above can be used for the electron transport material.

The method of patterning the film 182 made of the electron transport material is not limited to any specific method. Also in this case, for example, any of the patterning methods (1) to (5) described above can be used.

Thus, the neighboring pixel electron blocking section 46*a* made of the film 181 made of the electron blocking material and the electron injection section 46*b* made of the film 182 made of the electron transport material are formed.

In the present modified example as well, the electron injection section 46*b* in the EIL 46 may be a graphene derivative formed by introducing an electron-donating group into graphene, or a graphene oxide derivative formed by introducing an electron-donating group into graphene oxide. When an electron-donating group is introduced into graphene or graphene oxide, the introduction of the electron-donating group may be carried out before or after the graphene or graphene oxide is patterned.

Subsequently, as illustrated in S76 in FIG. 23, step S76, which is the same as step S76 illustrated in FIG. 20, is performed to form the ETL 45 for each pixel P on the EIL 46 provided with the neighboring pixel electron blocking section 46*a* and the electron injection section 46*b*. Thereafter, by performing steps S77 to S80 illustrated in FIG. 20, the light-emitting element layer 4 is formed including the light-emitting element ES with the neighboring pixel electron blocking section 46*a* made of the hole transport material.

The neighboring pixel electron blocking section 46*a* made of the film 181 made of the electron blocking material and the electron injection section 46*b* made of the film 182 made of the electron transport material, which are formed in the present modified example, are chemically bonded to each other at each contact portion thereof. Thus, according to the method described above, it is possible to form the EIL 46, in which the neighboring pixel electron blocking section 46*a* and the electron injection section 46*b* are integrally formed in the same layer.

In the present modified example, the case of patterning the neighboring pixel electron blocking section 46*a* and then patterning the electron injection section 46*b* has been described as an example. However, the present modified example is not limited thereto, and after patterning the electron injection section 46*b*, the neighboring pixel electron blocking section 46*a* may be patterned.

Fifth Modified Example

Figure 24:
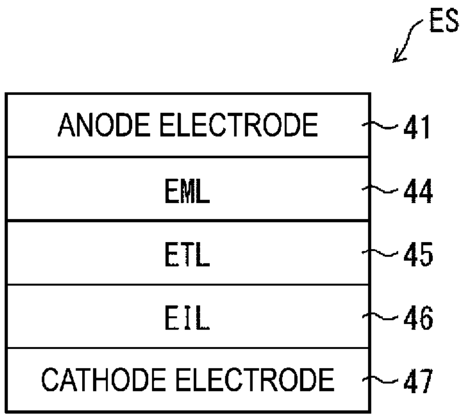
FIG. 24 is a diagram schematically illustrating another example of a layered structure of a light-emitting element according to the second embodiment.

FIG. 24 is a diagram schematically illustrating another example of a layered structure of the light-emitting element ES according to the present embodiment.

As illustrated in FIG. 24, the light-emitting element ES may have a configuration in which the cathode electrode 47, the EIL 46, the ETL 45, the EML 44, and the anode electrode 41 are layered in this order from the thin film transistor layer 3 side. Also in this case, similar advantageous effects to those described above can be obtained.

Sixth Modified Example

Figure 25:
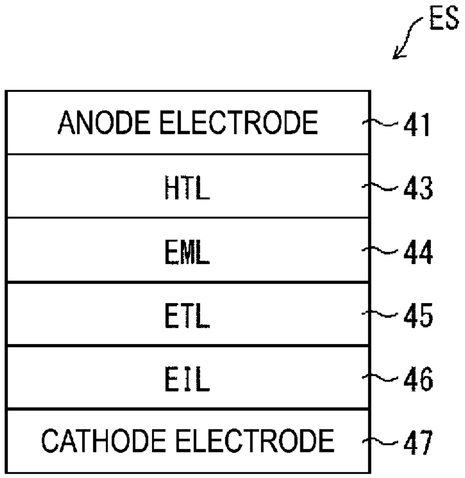
FIG. 25 is a diagram schematically illustrating still another example of a layered structure of the light-emitting element according to the second embodiment.

FIG. 25 is a diagram schematically illustrating still another example of a layered structure of the light-emitting element ES according to the present embodiment.

As illustrated in FIG. 25 the light-emitting element ES may have a configuration in which the cathode electrode 47, the EIL 46, the ETL 45, the EML 44, the HTL 43, and the anode electrode 41 are layered in this order from the thin film transistor layer 3 side. Also in this case, similar advantageous effects to those described above can be obtained.

Third Embodiment

Another embodiment of the disclosure will be described below with reference to FIG. 26. Note that differences from the first and the second embodiments will be described in the present embodiment. For convenience of description, members having the same functions as the members described in the first and second embodiments are designated by the same reference signs, and descriptions thereof are omitted.

Figure 26:
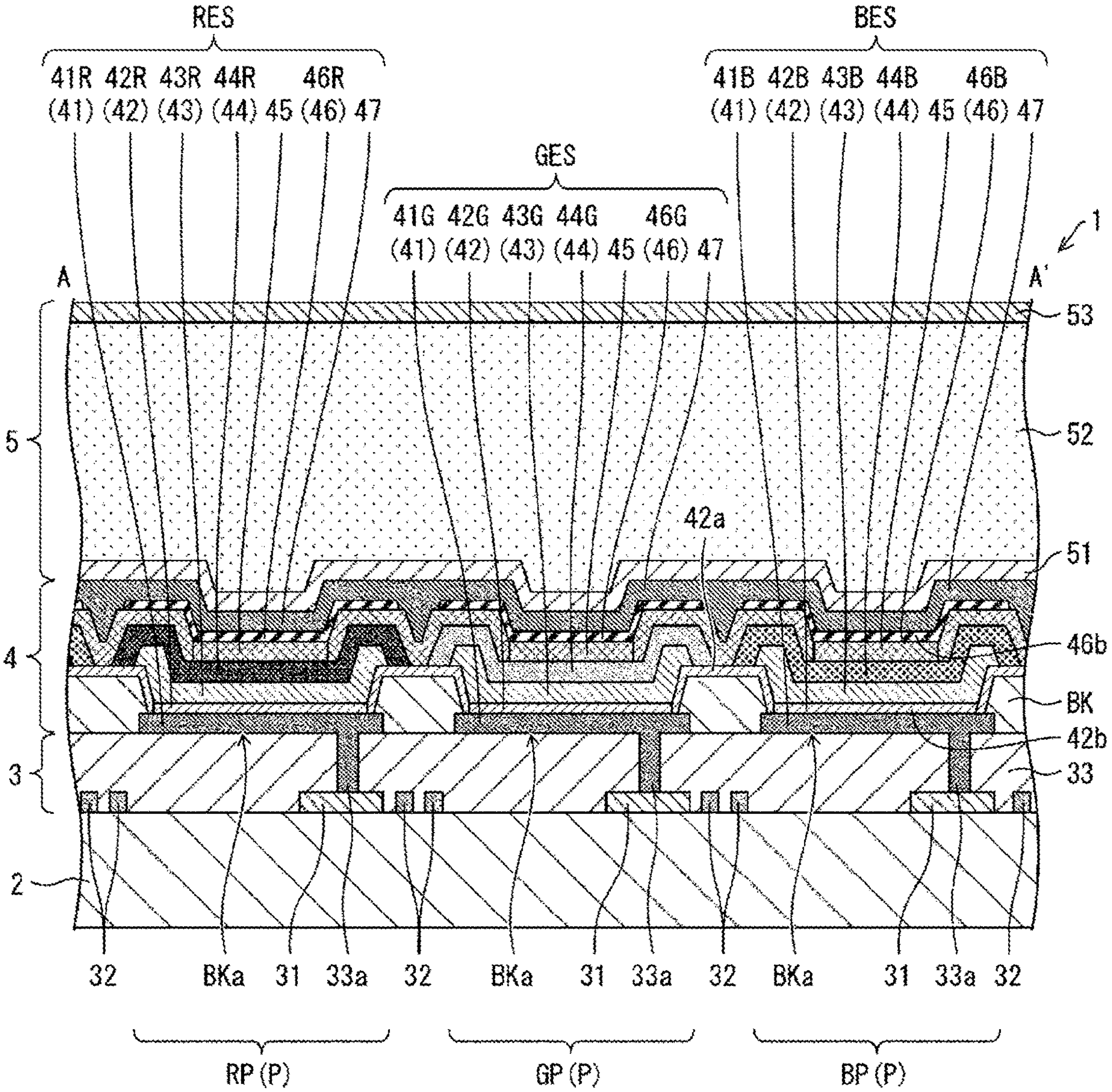
FIG. 26 is a cross-sectional view illustrating an example of a schematic configuration of a pixel in a display device according to a third embodiment.

FIG. 26 is a cross-sectional view illustrating an example of a schematic configuration of a pixel P in a display device 1 according to the present embodiment. A partially enlarged plan view illustrating an example of a schematic configuration of the display device 1 according to the present embodiment is the same as FIG. 2. FIG. 26 corresponds to the cross-sectional view taken along the line A-A' illustrated in FIG. 2.

The display device 1 illustrated in FIG. 26 has the same configuration as the display device 1 according to the first embodiment, except for the points described below. In the display device 1 illustrated in FIG. 26, an EIL 46 includes an electron injection section **46*b* as a carrier injection section and a neighboring pixel electron blocking section 46*a* as a neighboring pixel carrier blocking section. That is, in the display device 1 according to the present embodiment, an HIL 42 and the EIL 46** each include the carrier injection section and the neighboring pixel carrier blocking section.

The electron injection section **46*b* and the neighboring pixel electron blocking section 46*a* are the same as the electron injection section 46*b* and the neighboring pixel electron blocking section 46*a*** described in the second embodiment. Thus, the description thereof is omitted in the present embodiment.

A light-emitting element RES illustrated in FIG. 26 includes an anode electrode 41R, an HIL 42R, an HTL 43R, an EML 44R, an ETL 45, an EIL 46R, and a cathode electrode 47. A light-emitting element GES includes an anode electrode 41G, an HIL 42G, an HTL 43G, an EML 44G, the ETL 45, an EIL 46G, and the cathode electrode 47. A light-emitting element BES includes an anode electrode 41B, an HIL 42B, an HTL 43B, an EML 44B, the ETL 45, an EIL 46B, and the cathode electrode 47.

The display device 1 according to the present embodiment may be manufactured by combining the method described in the first embodiment and the method described in the second embodiment.

The disclosure is not limited to the embodiments described above, and various modifications may be made within the scope of the claims. Embodiments obtained by appropriately combining technical approaches disclosed in the different embodiments also fall within the technical scope of the disclosure. Furthermore, novel technical features can be formed by combining the technical approaches disclosed in each of the embodiments.

The invention claimed is:

1. A display device including a plurality of pixels, the display device comprising:

a support body;

a thin film transistor layer;

a light-emitting element layer; and a sealing layer configured to seal the light-emitting element layer, wherein:

the support body, the thin film transistor layer, the light-emitting element layer, and the sealing layer are positioned in this stated order, the light-emitting element layer includes a plurality of light-emitting elements having different luminescent colors from each other, the plurality of light-emitting elements is, respectively, formed corresponding to the plurality of pixels, each of the plurality of light-emitting elements includes:

a lower electrode, an upper electrode, and a light-emitting layer formed between the lower electrode and the upper electrode, and among (i) a first carrier injection layer and a first carrier transport layer formed between the light-emitting layer and the lower electrode, and (ii) a second carrier injection layer and a second carrier transport layer formed between the light-emitting layer and the upper electrode, at least the first carrier injection layer and the first carrier transport layer, the lower electrode, the first carrier transport layer, and the light-emitting layer are formed in island shapes for each of the plurality of pixels, at least the first carrier injection layer, among the first and second carrier injection layers included in the plurality of light-emitting elements, is a common layer formed to be common to the plurality of light-emitting elements of the plurality of pixels, and includes, for each of the plurality of pixels:

a carrier injection section formed overlapping the light-emitting layer in each of the plurality of light-emitting elements and configured to inject carriers into the light-emitting layer, and a neighboring pixel carrier blocking section formed in a portion between the plurality of light-emitting elements of adjacent pixels in the plurality of pixels, and configured to block transportation of carriers between the plurality of light-emitting elements of the adjacent pixels, the lower electrode is an anode electrode, the upper electrode is a cathode electrode, the first carrier injection layer is a hole injection layer, and the carrier injection section of the first carrier injection layer is a hole injection section, and is made of at least one hole transport material selected from the group consisting of graphene oxide, a graphene oxide derivative formed by introducing an electron-attracting group into graphene oxide, a graphene derivative formed by introducing an electron-attracting group into graphene, copper thiocyanate, tungsten oxide, 2,6-bis(9H-carbazoyl-9-yl)pyridine, 4,4'-bis(3-ethyl-N-carbazoyl)-1,1'-biphenyl, 4-(dibenzylamino)benzaldehyde-N,N'-diphenylhydrazone, 9,9'-[2,2'-dimethyl(1,1'-biphenyl)-4,4'-diyl]bis-9H-carbazole, 2,2'-dimethyl-N,N'-di(1-naphthyl-N,N'-diphenyl)-1,1'-biphenyl-4,4'-diamine, 9,9'-dimethyl-N,N'-di(1-naphthyl)-N,N'-diphenyl-9H-fluorene-2,7-diamine, N,N'-di(2-naphthyl-N,N'-diphenyl)-1,1'-biphenyl-4,4'-diamine, N,N'-diphenyl-N,N'-bis[4-(phenyl-m-tolylamino)phenyl]biphenyl-4,4'-diamine, N,N'-diphenyl-N,N'-di-p-tolylbenzene-1,4-diamine, N,N'-di(1-naphthyl)-N,N'-diphenyl-1,1'-biphenyl-4,4'-diamine, N4,N4'-bis{4-[bis(3-methylphenyl)amino]phenyl}-N4,N4'-diphenyl-(1,1'-biphenyl)-4,4'-diamine, 3-(4,6-diphenyl-1,3,5-triazine-2-yl)-9-phenyl-9H-carbazole, 9-(2-ethylhexyl)-N,N,N,N-tetrakis(4-methoxyphenyl)-9H-carbazole-2,7-diamine, indium(III) phthalocyanine chloride, poly[N,N'-bis(4-butylphenyl)-N,N'-bis(phenyl)-benzidine], 2,8-bis(diphenylphosphine oxide)dibenzofuran, 4,4',4'',4'''-silanetetrayltetrakis(N,N-bis(4-methoxyphenyl)aniline), spiro[9H-fluorene-9,9'-(9H)xanthine]-2,7-diamine, spiro[9H-fluorene-9,9'-(9H)xanthine]-2,2'-7,7'-tetramine, 2,4,6-tris[3-(carbazole-9-yl)phenyl]triazine, N,N,N',N'-tetrakis(4-methoxyphenyl)benzidine, N,N,N',N'-tetrakis(3-methylphenyl)-3,3'-dimethylbenzidine, N,N,N',N'-tetrakis(2-naphthyl)benzidine, tetra-N-phenylbenzidine, N,N,N',N'-tetraphenylnaphthalene-2,6-diamine, poly[(9,9-dioctylfluorenyl-2,7-diyl)-co-{4,4'-[N-(4-sec-butylphenyl)diphenylamine]}], titanyl phthalocyanine, 1,3,5-tris[(3-methylphenyl)phenylamino]benzene, 4,4',4''-tris[2-naphthyl(phenyl)amino]triphenylamine, vanadyl phthalocyanine, 4,4'-cyclohexylidenebis[N,N-bis(4-methylphenyl)benzenamine], dipyrazino[2,3-f:2',3'-h]quinoxaline-2,3,6,7,10,11-hexacarbonitrile, tin(IV)2,3-naphthalocyanine dichloride, N2,N2,N2',N2',N7,N7,N7',N7'-octakis(4-methoxyphenyl)-9,9'-spirobi[9H- fluorene]-2,2'-7,7'-tetramine, titanyl phthalocyanine, 1,3,5-tris(2-(9-ethylcarbazyl-3)ethylene)benzene, tris (4-carbazoyl-9-ylphenyl)amine, tris[4-(diethylamino) phenyl]amine, 1,3,5-tris(diphenylamino)benzene, 4,4',4"-tris[phenyl(m-tolyl)amino]triphenylamine, 4,4'-bis (N-carbazolyl)-1,1'-biphenyl, 1,3-bis(N-carbazolyl) benzene, 1,4-bis(N-carbazolyl)benzene, N,N'-bis(3-methylphenyl)-N,N'-diphenylbenzidine, poly(N-ethyl-2-vinylcarbazole), poly[bis(4-phenyl)(2,4,6-trimethylphenyl)amine], poly(9-vinylcarbazole), poly (1-vinylnaphthalene), poly(2-vinylnaphthalene), poly (copper phthalocyanine), and copper(II) phthalocyanine.

2. The display device according to claim 1, wherein the carrier injection section and the neighboring pixel carrier blocking section are formed integrally with each other in an identical layer.

3. The display device according to claim 1, wherein the carrier injection section and the neighboring pixel carrier blocking section are chemically bonded to each other.

4. The display device according to claim 1, wherein the hole injection section is made of the at least one hole transport material selected from the group consisting of graphene oxide, a graphene oxide derivative formed by introducing an electron-attracting group into graphene oxide, and a graphene derivative formed by introducing an electron-attracting group into graphene.

5. The display device according to claim 1, wherein each of the plurality of light-emitting elements further includes the second carrier injection layer, and the second carrier injection layer is an electron injection layer, and the electron injection layer is a common layer formed to be common to the plurality of light-emitting elements of the plurality of pixels.

6. A method for manufacturing the display device according to claim 1, the method comprising:

forming the lower electrode;

forming the first carrier injection layer;

forming the first carrier transport layer;

forming the light-emitting layer; and forming the upper electrode, wherein forming the first carrier injection layer includes:

forming a first film common to the plurality of pixels in such a manner that the first film is common to the plurality of light-emitting elements, and transforming at least a part of the first film by a chemical reaction.

7. The method according to claim 6, wherein forming the first film comprises forming a film made of an organic insulating material as the first film, and transforming at least the part of the first film includes transforming a portion of the organic insulating material to serve as the carrier injection section of the first carrier injection layer by the chemical reaction.

8. The method according to claim 7, wherein forming the lower electrode comprises forming an anode electrode as the lower electrode, forming the upper electrode comprises forming a cathode electrode as the upper electrode, and by transforming the portion of the organic insulating material, to serve as the carrier injection section of the first carrier injection layer into a hole transport material, a hole injection section is formed as the carrier injection section of the first carrier injection layer, and a neighboring pixel hole blocking section is formed as the neighboring pixel carrier blocking section of the first carrier injection layer.

9. The method according to claim 8, wherein the organic insulating material is at least one resin selected from the group consisting of polyimide, polyetherimide, and polyacrylonitrile, and transforming the portion of the organic insulating material to serve as the carrier injection section of the first carrier injection layer includes:

transforming the organic insulating material into graphene by irradiating, with a laser, the portion of the organic insulating material to serve as the hole injection section of the first carrier injection layer, and transforming the graphene into graphene oxide by oxidization.

10. A display device including a plurality of pixels, the display device comprising:

a support body;

a thin film transistor layer;

a light-emitting element layer; and a sealing layer configured to seal the light-emitting element layer, wherein:

the support body, the thin film transistor layer, the light-emitting element layer, and the sealing layer are positioned in this stated order, the light-emitting element layer includes a plurality of light-emitting elements having different luminescent colors from each other, the plurality of light-emitting elements is, respectively, formed corresponding to the plurality of pixels, each of the plurality of light-emitting elements includes:

a lower electrode, an upper electrode, and a light-emitting layer formed between the lower electrode and the upper electrode, and among (i) a first carrier injection layer and a first carrier transport layer formed between the light-emitting layer and the lower electrode, and (ii) a second carrier injection layer and a second carrier transport layer formed between the light-emitting layer and the upper electrode, at least the first carrier injection layer and the first carrier transport layer, the lower electrode, the first carrier transport layer, and the light-emitting layer are formed in island shapes for each of the plurality of pixels, at least the first carrier injection layer, among the first and second carrier injection layers included in the plurality of light-emitting elements, is a common layer formed to be common to the plurality of light-emitting elements of the plurality of pixels, and includes, for each of the plurality of pixels:

a carrier injection section formed overlapping the light-emitting layer in each of the plurality of light-emitting elements and configured to inject carriers into the light-emitting layer, and a neighboring pixel carrier blocking section formed in a portion between the plurality of light-emitting elements of adjacent pixels in the plurality of pixels, and configured to block transportation of carriers between the plurality of light-emitting elements of the adjacent pixels, the lower electrode is an anode electrode, the upper electrode is a cathode electrode, the first carrier injection layer is a hole injection layer, and the neighboring pixel carrier blocking section of the first carrier injection layer is a neighboring pixel hole blocking section configured to block transportation of positive holes between the plurality of light-emitting elements of the adjacent pixels, and is made of an electron transport material.

11. The display device according to claim 10, wherein the electron transport material is at least one electron transport material selected from the group consisting of graphene, a graphene derivative formed by introducing an electron-donating group into graphene, a graphene oxide derivative formed by introducing an electron-donating group into graphene oxide, tin(IV) oxide, zinc oxide, tris(2,4,6-trimethyl-3-(pyridin-3-yl)phenyl)borane, 4,6-bis(3,5-di(pyridin-3-yl)phenyl)-2-methylpyrimidine, 1,3-bis(3,5-dipyrid-3-ylphenyl)benzene, 2,7-bis(2,2'-bipyridin-5-yl)triphenylene, lithium 8-quinolinolate, poly[(9,9-bis(3'-((N,N-dimethyl)-N-ethylammonium)-propyl)-2,7-fluorene)-alt-2,7-(9,9-dioctylfluorene)]dibromide, poly[(9,9-bis(3'-(N,N-dimethylamino)propyl)-2,7-fluorene)-alt-2,7-(9,9-dioctylfluorene)], (1,3,5-triazine-2,4,6-triyl)tris(benzene-3,1-diyl)tris(diphenylphosphine oxide), 2,5,8,11-tetrakis(1,1-dimethylethyl)perylene, 1,3,5-tris(3-pyridyl-3-phenyl)benzene, 1,3,5-tris(1-phenyl-1H-benzimidazol-2-yl)benzene, diphenyl[4-(triphenylsilyl)phenyl]phosphine oxide, 3,5-diphenyl-4-(1-naphthyl)-1H-1,2,4-triazole, tris(8-hydroxyquinoline)aluminum, 2,9-dimethyl-4,7-diphenyl-1,10-phenanthroline, 4.7-diphenyl-1.10-phenanthroline, 2,5-bis(1-naphthyl)-1,3,5-oxadiazole, bis(8-hydroxy-2-methylquinoline)-(4-phenylphenoxy)aluminum, 3,5-bis(4-tert-butylphenyl)-4-phenyl-4H-1,2,4-triazole, 2-(4-biphenylyl)-5-phenyl-1,3,4-oxadiazole, 3-(biphenyl-4-yl)-5-(4-tert-butylphenyl)-4-phenyl-4H-1,2,4-triazole, and 2-(4-tert-butylphenyl)-5-(4-biphenylyl)-1,3,4-oxadiazole.

12. A display device including a plurality of pixels, the display device comprising:

a support body;

a thin film transistor layer;

a light-emitting element layer; and a sealing layer configured to seal the light-emitting element layer, wherein:

the support body, the thin film transistor layer, the light-emitting element layer, and the sealing layer are positioned in this stated order, the light-emitting element layer includes a plurality of light-emitting elements having different luminescent colors from each other, the plurality of light-emitting elements is, respectively, formed corresponding to the plurality of pixels, each of the plurality of light-emitting elements includes:

a lower electrode, an upper electrode, and a light-emitting layer formed between the lower electrode and the upper electrode, and among (i) a first carrier injection layer and a first carrier transport layer formed between the light-emitting layer and the lower electrode, and (ii) a second carrier injection layer and a second carrier transport layer formed between the light-emitting layer and the upper electrode, at least the first carrier injection layer and the first carrier transport layer, the lower electrode, the first carrier transport layer, and the light-emitting layer are formed in island shapes for each of the plurality of pixels, at least the first carrier injection layer, among the first and second carrier injection layers included in the plurality of light-emitting elements, is a common layer formed to be common to the plurality of light-emitting elements of the plurality of pixels, and includes, for each of the plurality of pixels:

a carrier injection section formed overlapping the light-emitting layer in each of the plurality of light-emitting elements and configured to inject carriers into the light-emitting layer, and a neighboring pixel carrier blocking section formed in a portion between the plurality of light-emitting elements of adjacent pixels in the plurality of pixels, and configured to block transportation of carriers between the plurality of light-emitting elements of the adjacent pixels, the lower electrode is a cathode electrode, the upper electrode is an anode electrode, the first carrier injection layer is an electron injection layer, and the carrier injection section of the first carrier injection layer is an electron injection section, and is made of at least one electron transport material selected from the group consisting of graphene, a graphene derivative formed by introducing an electron-donating group into graphene, a graphene oxide derivative formed by introducing an electron-donating group into graphene oxide, tin(IV) oxide, zinc oxide, tris(2,4,6-trimethyl-3-(pyridin-3-yl)phenyl)borane, 4,6-bis(3,5-di(pyridin-3-yl)phenyl)-2-methylpyrimidine, 1,3-bis(3,5-dipyrid-3-ylphenyl)benzene, 2,7-bis(2,2'-bipyridin-5-yl)triphenylene, lithium 8-quinolinolate, poly[(9,9-bis(3'-((N,N-dimethyl)-N-ethylammonium)-propyl)-2,7-fluorene)-alt-2,7-(9,9-dioctylfluorene)]dibromide, poly[(9,9-bis(3'-(N,N-dimethylamino)propyl)-2,7-fluorene)-alt-2,7-(9,9-dioctylfluorene)], (1,3,5-triazine-2,4,6-triyl)tris(benzene-3,1-diyl)tris(diphenylphosphine oxide), 2,5,8,11-tetrakis(1,1-dimethylethyl)perylene, 1,3,5-tris(3-pyridyl-3-phenyl)benzene, 1,3,5-tris(1-phenyl-1H-benzimidazol-2-yl)benzene, diphenyl[4-(triphenylsilyl)phenyl]phosphine oxide, 3,5-diphenyl-4-(1-naphthyl)-1H-1,2,4-triazole, tris(8-hydroxyquinoline)aluminum, 2,9-dimethyl-4,7-diphenyl-1,10-phenanthroline, 4.7-diphenyl-1.10-phenanthroline, 2,5-bis(1-naphthyl)-1,3,5-oxadiazole, bis(8-hydroxy-2-methylquinoline)-(4-phenylphenoxy)aluminum, 3,5-bis(4-tert-butylphenyl)-4-phenyl-4H-1,2,4-triazole, 2-(4-biphenylyl)-5-phenyl-1,3,4-oxadiazole, 3-(biphenyl-4-yl)-5-(4-tert-butylphenyl)-4-phenyl-4H-1,2,4-triazole, and 2-(4-tert-butylphenyl)-5-(4-biphenylyl)-1,3,4-oxadiazole.

13. The display device according to claim 12, wherein the electron injection section is made of the at least one electron transport material selected from the group consisting of graphene, a graphene derivative formed by introducing an electron-donating group into graphene, and a graphene oxide derivative formed by introducing an electron-donating group into graphene oxide.

14. The display device according to claim 12, wherein the neighboring pixel carrier blocking section of the first carrier injection layer is a neighboring pixel electron blocking section configured to block transportation of electrons between the plurality of light-emitting elements of the adjacent pixels, and made of a hole transport material.

15. The display device according to claim 14, wherein the hole transport material is at least one hole transport material selected from the group consisting of graphene oxide, a graphene oxide derivative formed by introducing an electron-attracting group into graphene oxide, a graphene derivative formed by introducing an electron-attracting group into graphene, copper thiocyanate, tungsten oxide, 2,6-bis(9H-carbazoyl-9-yl) pyridine, 4,4'-bis(3-ethyl-N-carbazoyl)-1,1'-biphenyl, 4-(dibenzylamino)benzaldehyde-N,N'-diphenylhydrazone, 9,9'-[2,2'-dimethyl(1,1'-biphenyl)-4,4'-diyl]bis-9H-carbazole, 2,2'-dimethyl-N,N'-di(1-naphthyl-N,N'-diphenyl)-1,1'-biphenyl-4,4'-diamine, 9,9'-dimethyl-N,N'-di(1-naphthyl)-N,N'-diphenyl-9H-fluorene-2,7-diamine, N,N'-di(2-naphthyl-N,N'-diphenyl)-1,1'-biphenyl-4,4'-diamine, N,N'-diphenyl-N,N'-bis[4-(phenyl-m-tolylamino)phenyl]biphenyl-4,4'-diamine, N,N'-diphenyl-N,N'-di-p-tolylbenzene-1,4-diamine, N,N'-di(1-naphthyl)-N,N'-diphenyl-1,1'-biphenyl-4,4'-diamine, N4,N4'-bis{4-[bis(3-methylphenyl)amino] phenyl}-N4,N4'-diphenyl-(1,1'-biphenyl)-4,4'-diamine, 3-(4,6-diphenyl-1,3,5-triazine-2-yl)-9-phenyl-9H-carbazole, 9-(2-ethylhexyl)-N,N,N,N-tetrakis(4-methoxyphenyl)-9H-carbazole-2,7-diamine, indium (III) phthalocyanine chloride, poly[N,N'-bis(4-butylphenyl)-N,N'-bis(phenyl)-benzidine], 2,8-bis (diphenylphosphine oxide)dibenzofuran, 4,4',4'',4'''-silanetetrayltetrakis(N,N-bis(4-methoxyphenyl) aniline), spiro[9H-fluorene-9,9'-(9H)xanthine]-2,7-diamine, spiro[9H-fluorene-9,9'-(9H)xanthine]-2,2'-7,7'-tetramine, 2,4,6-tris[3-(carbazole-9-yl)phenyl] triazine, N,N,N',N'-tetrakis(4-methoxyphenyl) benzidine, N,N,N',N'-tetrakis(3-methylphenyl)-3,3'-dimethylbenzidine, N,N,N',N'-tetrakis(2-naphthyl) benzidine, tetra-N-phenylbenzidine, N,N,N',N'-tetraphenylnaphthalene-2,6-diamine, poly[(9,9-dioctylfluorenyl-2,7-diyl)-co-{4,4'-[N-(4-sec-butylphenyl)diphenylamine]}], titanyl phthalocyanine, 1,3,5-tris[(3-methylphenyl)phenylamino]benzene, 4,4',4''-tris[2-naphthyl(phenyl)amino]triphenylamine, vanadyl phthalocyanine, 4,4'-cyclohexylidenebis[N,N-bis(4-methylphenyl)benzenamine], dipyrazino[2,3-f:2',3'-h]quinoxaline-2,3,6,7,10,11-hexacarbonitrile, tin (IV)2,3-naphthalocyanine dichloride, N2,N2,N2',N2',N7,N7,N7',N7'-octakis(4-methoxyphenyl)-9,9'-spirobi [9H-fluorene]-2,2',7,7'-tetramine, titanyl phthalocyanine, 1,3,5-tris(2-(9-ethylcarbazyl-3)ethylene)benzene, tris(4-carbazoyl-9-ylphenyl)amine, tris [4-(diethylamino)phenyl]amine, 1,3,5-tris(diphenylamino)benzene, 4,4',4''-tris[phenyl(m-tolyl)amino] triphenylamine, 4,4'-bis(N-carbazolyl)-1,1'-biphenyl, 1,3-bis(N-carbazolyl)benzene, 1,4-bis(N-carbazolyl) benzene, N,N'-bis(3-methylphenyl)-N,N'-diphenylbenzidine, poly(N-ethyl-2-vinylcarbazole), poly[bis(4-phenyl)(2,4,6-trimethylphenyl)amine], poly(9-vinylcarbazole), poly(1-vinylnaphthalene), poly(2-vinylnaphthalene), poly(copper phthalocyanine), and copper(II) phthalocyanine.

16. The display device according to claim 12, wherein each of the plurality of light-emitting elements further includes the second carrier injection layer, and the second carrier injection layer is a hole injection layer, and the hole injection layer is a common layer formed to be common to the plurality of light-emitting elements of the plurality of pixels.

* * * * *